United States Patent
Tsubuku et al.

(10) Patent No.: US 9,972,389 B2
(45) Date of Patent: May 15, 2018

(54) METHOD FOR OPERATING SEMICONDUCTOR DEVICE

(71) Applicant: Semiconductor Energy Laboratory Co., Ltd., Atsugi-shi, Kanagawa-ken (JP)

(72) Inventors: Masashi Tsubuku, Kanagawa (JP); Masashi Fujita, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days. days.

(21) Appl. No.: 15/450,147

(22) Filed: Mar. 6, 2017

(65) Prior Publication Data

US 2017/0178728 A1   Jun. 22, 2017

Related U.S. Application Data

(62) Division of application No. 14/996,635, filed on Jan. 15, 2016, now Pat. No. 9,633,710.

(30) Foreign Application Priority Data

Jan. 23, 2015 (JP) ................................. 2015-011714

(51) Int. Cl.
 *G11C 5/06* (2006.01)
 *G11C 14/00* (2006.01)
 *G11C 13/00* (2006.01)
(52) U.S. Cl.
 CPC ........ *G11C 14/0045* (2013.01); *G11C 13/004* (2013.01)
(58) Field of Classification Search
 CPC .......................... G11C 14/0045; G11C 13/004
 See application file for complete search history.

(56) References Cited

U.S. PATENT DOCUMENTS 4,466,081 A   8/1984 Masuoka
5,555,204 A   9/1996 Endoh et al.
(Continued)

FOREIGN PATENT DOCUMENTS

JP   01-159895 A   6/1989
JP   07-093979 A   4/1995
(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.

(Continued)

*Primary Examiner* — Uyen B Tran
(74) *Attorney, Agent, or Firm* — Fish & Richardson P.C.

(57) ABSTRACT

Provided is a highly reliable semiconductor device, a semiconductor device with a reduced circuit area, a memory element having favorable characteristics, a highly reliable memory element, or a memory element with increased storage capacity per unit volume. A semiconductor device includes a capacitor and a switching element. The capacitor includes a first electrode, a second electrode, and a dielectric. The dielectric is positioned between the first electrode and the second electrode. The switching element includes a first terminal and a second terminal. The first terminal is electrically connected to the first electrode. The following steps are sequentially performed: a first step of turning on the switching element in a first period, a second step of turning off the switching element in a second period, and a third step of turning on the switching element in a third period.

12 Claims, 40 Drawing Sheets

(56) References Cited

U.S. PATENT DOCUMENTS

| | | |
|---|---|---|
| 5,570,315 A | 10/1996 | Tanaka et al. |
| 5,774,397 A | 6/1998 | Endoh et al. |
| 5,946,231 A | 8/1999 | Endoh et al. |
| 6,014,330 A | 1/2000 | Endoh et al. |
| 6,127,702 A | 10/2000 | Yamazaki et al. |
| 6,188,611 B1 | 2/2001 | Endoh et al. |
| 6,335,882 B1 | 1/2002 | Saeki et al. |
| 6,646,922 B2 | 11/2003 | Kato |
| 6,768,680 B2 | 7/2004 | Kato |
| 6,873,009 B2 | 3/2005 | Hisamoto et al. |
| 6,876,572 B2 | 4/2005 | Turner |
| 6,947,327 B2 | 9/2005 | Kato |
| 6,958,938 B2 | 10/2005 | Noguchi et al. |
| 7,173,858 B2 | 2/2007 | Kato |
| 7,372,737 B2 | 5/2008 | Kato |
| 7,561,464 B2 | 7/2009 | Toda |
| 7,561,476 B2 | 7/2009 | Kato |
| 7,674,650 B2 | 3/2010 | Akimoto et al. |
| 7,800,944 B2 | 9/2010 | Chun et al. |
| 7,839,677 B2 | 11/2010 | Kato |
| 7,910,490 B2 | 3/2011 | Akimoto et al. |
| 7,932,521 B2 | 4/2011 | Akimoto et al. |
| 7,952,392 B2 | 5/2011 | Koyama et al. |
| 7,978,573 B1 | 7/2011 | Lee |
| 8,021,916 B2 | 9/2011 | Akimoto et al. |
| 8,021,917 B2 | 9/2011 | Akimoto et al. |
| 8,115,883 B2 | 2/2012 | Yamazaki et al. |
| 8,218,099 B2 | 7/2012 | Yamazaki et al. |
| 8,236,627 B2 | 8/2012 | Tsubuku et al. |
| 8,242,837 B2 | 8/2012 | Yamazaki et al. |
| 8,268,642 B2 | 9/2012 | Yoshitomi et al. |
| 8,274,077 B2 | 9/2012 | Akimoto et al. |
| 8,289,753 B2 | 10/2012 | Yamazaki et al. |
| 8,319,216 B2 | 11/2012 | Akimoto et al. |
| 8,339,828 B2 | 12/2012 | Yamazaki et al. |
| 8,358,530 B2 | 1/2013 | Kamata |
| 8,378,344 B2 | 2/2013 | Sakakura et al. |
| 8,383,470 B2 | 2/2013 | Akimoto et al. |
| 8,389,989 B2 | 3/2013 | Yamazaki et al. |
| 8,400,187 B2 * | 3/2013 | Yamazaki ........... H01L 27/1225 326/102 |
| 8,421,067 B2 | 4/2013 | Yamazaki et al. |
| 8,421,068 B2 | 4/2013 | Yamazaki et al. |
| 8,421,069 B2 | 4/2013 | Yamazaki et al. |
| 8,421,083 B2 | 4/2013 | Yamazaki et al. |
| 8,466,463 B2 | 6/2013 | Akimoto et al. |
| 8,481,377 B2 | 7/2013 | Akimoto et al. |
| 8,492,764 B2 | 7/2013 | Yamazaki et al. |
| 8,542,528 B2 | 9/2013 | Sekine et al. |
| 8,552,712 B2 | 10/2013 | Kato et al. |
| 8,597,992 B2 | 12/2013 | Sasagawa et al. |
| 8,614,916 B2 | 12/2013 | Nagatsuka et al. |
| 8,625,085 B2 | 1/2014 | Watanabe et al. |
| 8,629,069 B2 | 1/2014 | Akimoto et al. |
| 8,637,354 B2 | 1/2014 | Sasagawa et al. |
| 8,654,272 B2 | 2/2014 | Yamazaki et al. |
| 8,669,550 B2 | 3/2014 | Akimoto et al. |
| 8,669,556 B2 | 3/2014 | Yamazaki et al. |
| 8,698,214 B2 | 4/2014 | Honda et al. |
| 8,729,613 B2 | 5/2014 | Honda et al. |
| 8,742,422 B2 | 6/2014 | Sakakura et al. |
| 8,766,608 B2 | 7/2014 | Yamazaki et al. |
| 8,785,241 B2 | 7/2014 | Sasagawa et al. |
| 8,790,959 B2 | 7/2014 | Akimoto et al. |
| 8,796,069 B2 | 8/2014 | Akimoto et al. |
| 8,803,142 B2 | 8/2014 | Yamazaki et al. |
| 8,841,661 B2 | 9/2014 | Akimoto et al. |
| 8,854,286 B2 | 10/2014 | Yamazaki et al. |
| 8,860,023 B2 | 10/2014 | Tsubuku et al. |
| 8,871,565 B2 | 10/2014 | Yamazaki et al. |
| 8,872,179 B2 | 10/2014 | Tsubuku |
| 8,890,159 B2 | 11/2014 | Yamazaki et al. |
| 8,890,166 B2 | 11/2014 | Sakakura et al. |
| 8,895,976 B2 | 11/2014 | Tsubuku et al. |
| 8,901,552 B2 | 12/2014 | Yamazaki et al. |
| 8,952,380 B2 | 2/2015 | Honda et al. |
| 8,952,726 B2 | 2/2015 | Yamazaki et al. |
| 8,963,517 B2 | 2/2015 | Yamazaki et al. |
| 9,029,852 B2 | 5/2015 | Honda et al. |
| 9,035,301 B2 | 5/2015 | Takahashi et al. |
| 9,064,966 B2 | 6/2015 | Yamazaki et al. |
| 9,082,858 B2 | 7/2015 | Tsubuku et al. |
| 9,087,744 B2 | 7/2015 | Tsubuku et al. |
| 9,099,562 B2 | 8/2015 | Akimoto et al. |
| 9,196,345 B2 | 11/2015 | Inoue et al. |
| 9,218,966 B2 | 12/2015 | Honda et al. |
| 9,219,160 B2 | 12/2015 | Honda et al. |
| 9,257,071 B2 * | 2/2016 | Kimura ............... G09G 3/3233 |
| 2007/0242528 A1 * | 10/2007 | Inoue ..................... G11C 7/12 365/189.15 |
| 2008/0308805 A1 | 12/2008 | Akimoto et al. |
| 2010/0148171 A1 | 6/2010 | Hayashi et al. |
| 2011/0057918 A1 | 3/2011 | Kimura et al. |
| 2011/0062435 A1 | 3/2011 | Yamazaki et al. |
| 2011/0080788 A1 | 4/2011 | Saito |
| 2011/0090204 A1 | 4/2011 | Yamazaki et al. |
| 2011/0104851 A1 | 5/2011 | Akimoto et al. |
| 2011/0116310 A1 | 5/2011 | Yamazaki et al. |
| 2011/0121290 A1 | 5/2011 | Akimoto et al. |
| 2011/0128777 A1 | 6/2011 | Yamazaki et al. |
| 2011/0148455 A1 | 6/2011 | Kato et al. |
| 2011/0227082 A1 | 9/2011 | Inoue et al. |
| 2012/0033505 A1 | 2/2012 | Sekine et al. |
| 2012/0069633 A1 * | 3/2012 | Katoh ................. G11C 13/004 365/148 |
| 2012/0086000 A1 | 4/2012 | Mizoguchi et al. |
| 2012/0163071 A1 | 6/2012 | Kurokawa |
| 2012/0193620 A1 | 8/2012 | Godo et al. |
| 2012/0275245 A1 | 11/2012 | Sekine et al. |
| 2012/0287025 A1 | 11/2012 | Inoue et al. |
| 2014/0016407 A1 | 1/2014 | Sekine et al. |
| 2014/0077205 A1 | 3/2014 | Yamazaki et al. |
| 2014/0113405 A1 | 4/2014 | Tsubuku et al. |
| 2014/0124776 A1 | 5/2014 | Takahashi et al. |
| 2014/0226401 A1 | 8/2014 | Yamazaki et al. |
| 2014/0241978 A1 | 8/2014 | Yamazaki et al. |
| 2014/0252345 A1 | 9/2014 | Tsubuku et al. |
| 2015/0034947 A1 | 2/2015 | Yamazaki et al. |
| 2015/0041801 A1 | 2/2015 | Yamazaki et al. |
| 2015/0084043 A1 | 3/2015 | Ishihara et al. |
| 2015/0179810 A1 | 6/2015 | Yamazaki et al. |
| 2015/0241510 A1 | 8/2015 | Tsubuku et al. |
| 2015/0364610 A1 | 12/2015 | Tsubuku et al. |
| 2016/0054362 A1 | 2/2016 | Tsubuku et al. |
| 2016/0225772 A1 | 8/2016 | Tsubuku et al. |

FOREIGN PATENT DOCUMENTS

| | | |
|---|---|---|
| JP | 2001-351386 A | 12/2001 |
| JP | 2010-021170 A | 1/2010 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Semi-Static Complementary Gain Cell Technology for Sub-1 V Supply DRAM's", IEEE Transactions on electron devices, Jun. 1, 1994, vol. 41, No. 6, pp. 926-931.

Shukuri.S et al., "A Complementary Gain Cell Technology for sub-1 V Supply DRAMs ", IEDM 92: Technical Digest of International Electron Devices Meeting, Dec. 13, 1992, pp. 1006-1008.

Kitahara.K et al., "Dynamical theory of migration of an adsorbed atom on solid surfaces", J. Chem. Phys. (Journal of Chemical Physics), Oct. 1, 1976, vol. 65, No. 7, pp. 2871-2882.

Bordewijk.P, "Defect-Diffusion Models of Dielectric Relaxation", Chem. Phys. Lett. (Chemical Physics Letters), May 1, 1975, vol. 32, No. 3, pp. 592-596, Elsevier.

Milovanov.A et al., "Stretched exponential relaxation and ac universality in disordered dielectrics", Phys. Rev. B (Physical Review. B), Sep. 4, 2007, vol. 76, pp. 104201-1-104201-8.

(56) References Cited

OTHER PUBLICATIONS

Lutz.E, "Fractional Langevin equation", Phys. Rev. E (Physical Review. E), Oct. 18, 2001, vol. 64, pp. 051106-1-051106-4.
Williams.G et al., "Non-Symmetrical Dielectric Relaxation Behaviour Arising from a Simple Empirical Decay Function", Transactions of the Faraday Society, 1970, vol. 66, pp. 80-85.
Tsubuku.M et al., "Analysis and Experimental Proof of Deterioration-free Memory Device Using CAAC-IGZO FET", SSDM 2015 (Extended abstracts of the 2015 International Conference on Solid State Devices and Materials), 2015, pp. 1148-1149.

* cited by examiner

METHOD FOR OPERATING SEMICONDUCTOR DEVICE

CROSS-REFERENCE TO RELATED APPLICATIONS

This application is a divisional of U.S. application Ser. No. 14/996,635, filed Jan. 15, 2016, now allowed, which claims the benefit of a foreign priority application filed in Japan as Serial No. 2015-011714 on Jan. 23, 2015, both of which are incorporated by reference.

BACKGROUND OF THE INVENTION

1. Field of the Invention

The present invention relates to an electronic device, a semiconductor device, a memory device, a memory element, a method for driving any of them, or a method for manufacturing any of them.

Note that electronic devices in this specification mean all devices which operate by being supplied with electric power, and electronic devices including power sources, electronic devices and electro-optical devices including power sources such as storage batteries, information terminal devices including storage batteries, and the like are all electronic devices. Electronic devices also mean all devices which process information. Note that the technical field of one embodiment of the present invention is not limited to the above-mentioned technical fields. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a memory device, an imaging device, a display device, a liquid crystal display device, a light-emitting device, a lighting device, a power storage device, a method for driving any of them, and a method for manufacturing any of them.

2. Description of the Related Art

Examples of a memory device include an EEPROM, which is an electrically rewritable non-volatile memory device, and a DRAM, which is a volatile memory device. Insufficient writing may occur in such memory devices.

Patent Document 1 discloses an example of an EEPROM with an FETMOS structure in which a charge accumulation layer and a control gate are stacked.

To solve the problem of insufficient writing, Patent Document 1 discloses the following technique: after data is written to the EEPROM, the data is written again to a memory cell in which writing is determined to be insufficient.

REFERENCE

Patent Document

[Patent Document 1] Japanese Published Patent Application No. H07-093979

SUMMARY OF THE INVENTION

An object of one embodiment of the present invention is to provide a highly reliable semiconductor device. Another object of one embodiment of the present invention is to provide a semiconductor device with a reduced circuit area. Another object of one embodiment of the present invention is to provide a memory element having favorable characteristics. Another object of one embodiment of the present invention is to provide a highly reliable memory element. Another object is to increase the storage capacity of a memory element per unit volume. Another object is to provide a semiconductor device with a novel structure.

One embodiment of the present invention is a method for operating a semiconductor device including a capacitor and a switching element. The capacitor includes a first electrode, a second electrode, and a dielectric. The dielectric is positioned between the first electrode and the second electrode. The switching element includes a first terminal and a second terminal. The first terminal is electrically connected to the first electrode. The method includes a first step of turning on the switching element in a first period, a second step of turning off the switching element in a second period, and a third step of turning on the switching element in a third period. The first step, the second step, and the third step are performed in this order. Here, the first step and the second step are preferably performed in succession. In addition, the second step and the third step are preferably performed in succession.

In the above configuration, it is preferable that the second period be longer than or equal to 50 picoseconds (ps) and shorter than or equal to 100 milliseconds (ms) and that the first period and the third period be each longer than or equal to 50 ps and shorter than or equal to 1 ms. In the above configuration, it is preferable that the semiconductor device include a memory element including the switching element and that no reading operation of the memory element be performed in the second period. In the above configuration, it is preferable that the dielectric contain oxygen and at least one element selected from silicon, aluminum, and hafnium and that the switching element contain an oxide semiconductor. In the above configuration, it is preferable that the switching element be a transistor.

Another embodiment of the present invention is a method for operating a semiconductor device including a capacitor and a first transistor. The capacitor includes a first electrode, a second electrode, and a dielectric. The dielectric is positioned between the first electrode and the second electrode. The first transistor includes a gate electrode, a third electrode, and a fourth electrode. One of the third electrode and the fourth electrode is a source electrode, and the other is a drain electrode. The third electrode is electrically connected to the first electrode. The method includes a first step of applying a first potential to the gate electrode in a first period and applying a second potential to the second electrode in a second period, a second step of applying a third potential to the gate electrode in a third period and applying a fourth potential to the second electrode in a fourth period, and a third step of applying a fifth potential to the gate electrode in a fifth period and applying a sixth potential to the second electrode in a sixth period. The first step, the second step, and the third step are consecutively performed in this order. A difference between the first potential and the second potential is larger than a difference between the third potential and the fourth potential. A difference between the fifth potential and the sixth potential is larger than the difference between the third potential and the fourth potential.

Another embodiment of the present invention is a method for operating a semiconductor device including a capacitor and a first transistor. The capacitor includes a first electrode, a second electrode, and a dielectric. The dielectric is positioned between the first electrode and the second electrode. The first transistor includes a gate electrode, a third electrode, and a fourth electrode. One of the third electrode and the fourth electrode is a source electrode, and the other is a drain electrode. The third electrode is electrically connected to the first electrode. The method includes a first step of applying a first potential to the gate electrode and a second potential to the second electrode, a second step of applying a third potential to the gate electrode and a fourth potential to the second electrode, and a third step of applying a fifth potential to the gate electrode and a sixth potential to the second electrode. The first step, the second step, and the third step are consecutively performed in this order. A difference between the first potential and the second potential is larger than a difference between the third potential and the fourth potential. A difference between the fifth potential and the sixth potential is larger than the difference between the third potential and the fourth potential.

Another embodiment of the present invention is a method for operating a semiconductor device including a capacitor and a first transistor. The capacitor includes a first electrode, a second electrode, and a dielectric. The dielectric is positioned between the first electrode and the second electrode. The first transistor includes a gate electrode, a third electrode, and a fourth electrode. One of the third electrode and the fourth electrode is a source electrode, and the other is a drain electrode. The third electrode is electrically connected to the first electrode. The method includes a first step of applying a first potential to the gate electrode and a second potential to the second electrode to turn on the first transistor, a second step of applying a third potential to the gate electrode and a fourth potential to the second electrode to turn off the first transistor, and a third step of applying a fifth potential to the gate electrode and a sixth potential to the second electrode to turn on the first transistor and compensate for charge loss of the capacitor caused in the second step. The first step, the second step, and the third step are consecutively performed in this order. A difference between the first potential and the second potential is larger than a difference between the third potential and the fourth potential. A difference between the fifth potential and the sixth potential is larger than the difference between the third potential and the fourth potential.

In the above configuration, it is preferable that the second period be longer than or equal to 50 ps and shorter than or equal to 100 ms and that the first period and the third period be each longer than or equal to 50 ps and shorter than or equal to 1 ms.

In the above configuration, it is preferable that the semiconductor device include a memory element including the first transistor and that no reading operation of the memory element be performed in the second period. In the above configuration, it is preferable that the dielectric contain oxygen and silicon and that the first transistor contain an oxide semiconductor. In the above configuration, it is preferable that the semiconductor device include a second transistor and that the first electrode be electrically connected to a gate electrode of the second transistor.

According to one embodiment of the present invention, a highly reliable semiconductor device can be provided. According to one embodiment of the present invention, a semiconductor device with a reduced circuit area can be provided. According to one embodiment of the present invention, a memory element having favorable characteristics can be provided. According to one embodiment of the present invention, a highly reliable memory element can be provided. The storage capacity of a memory element per unit volume can be increased. A semiconductor device with a novel structure can be provided.

DETAILED DESCRIPTION OF THE INVENTION

Embodiment 1

Figure 1A:
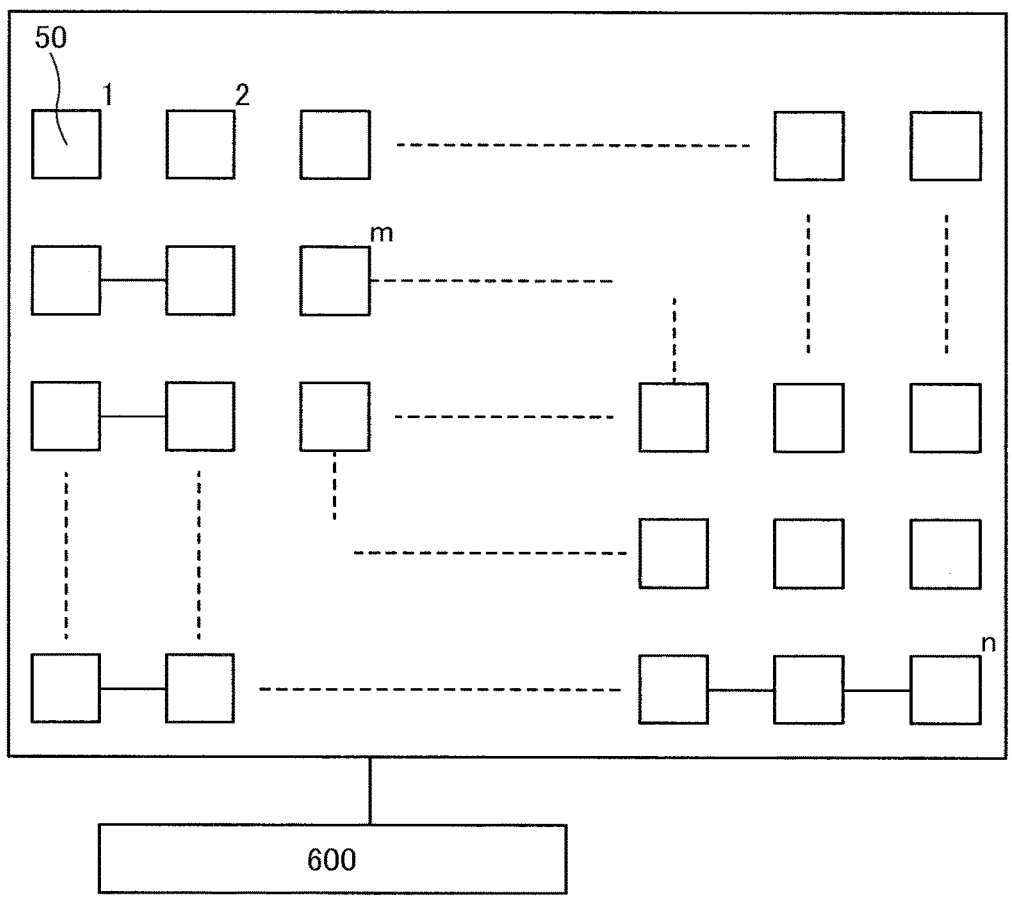
FIGS. 1A and 1B are a schematic diagram and a circuit diagram, respectively, which illustrate an embodiment of the present invention.

In this embodiment, an example of a memory element included in a semiconductor device of one embodiment of the present invention will be described.

Example (1) of Semiconductor Device

A semiconductor device 500 of one embodiment of the present invention includes a memory element 50. The memory element 50 includes a capacitor 150, and the capacitor 150 includes an electrode 51, an electrode 52, and a dielectric positioned between the electrode 51 and the electrode 52. In addition, the memory element 50 preferably includes a switching element 61 which is electrically connected to the electrode 51.

As the switching element 61, for example, an element whose resistance changes in accordance with the input conditions, a mechanical switch whose physical length changes in accordance with the input conditions, or a transistor can be used. As the transistor, for example, a field-effect transistor can be used.

The semiconductor device 500 in FIG. 1A includes n memory elements 50 and a circuit 600 which is connected to a matrix formed by the n memory elements 50. The circuit 600 includes a writing circuit, a reading circuit, and the like.

Figure 1B:
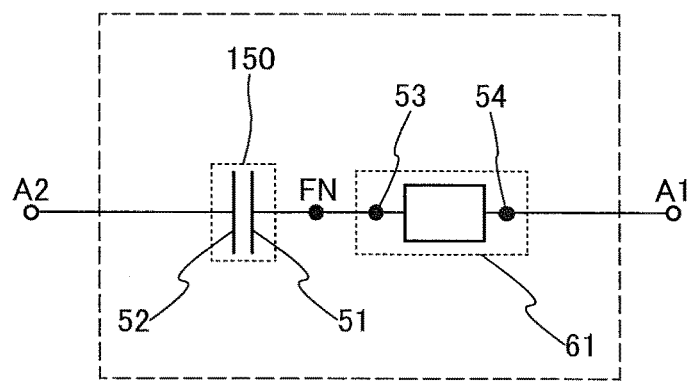
Figure 36A:
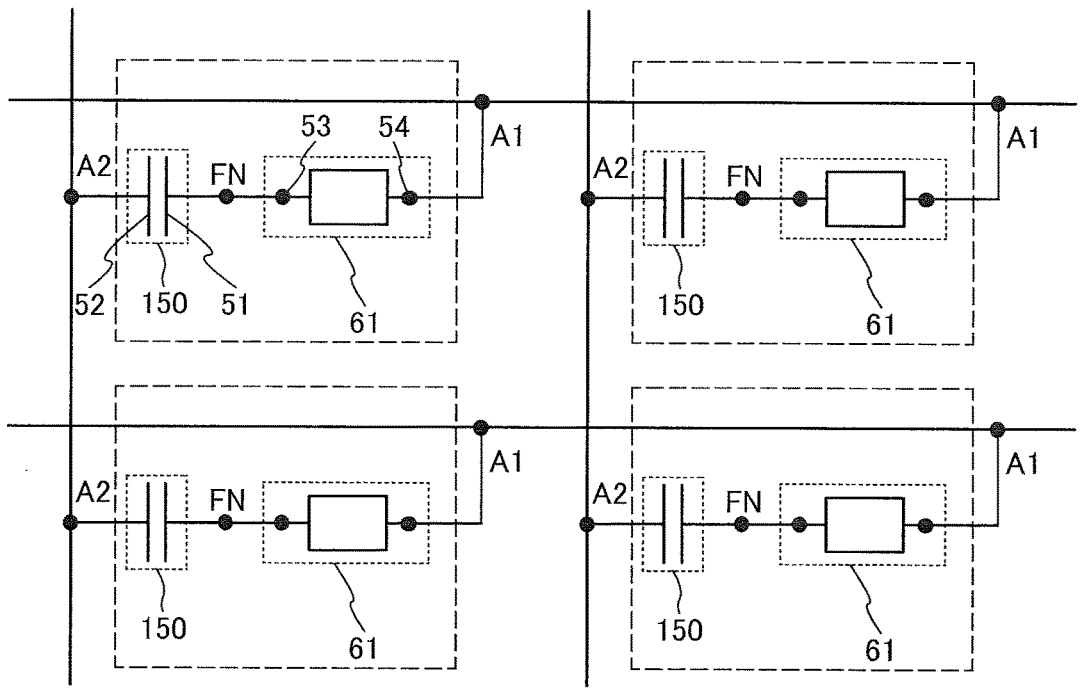
FIGS. 36A and 36B are each a circuit diagram illustrating an embodiment of the present invention.
Figure 36B:
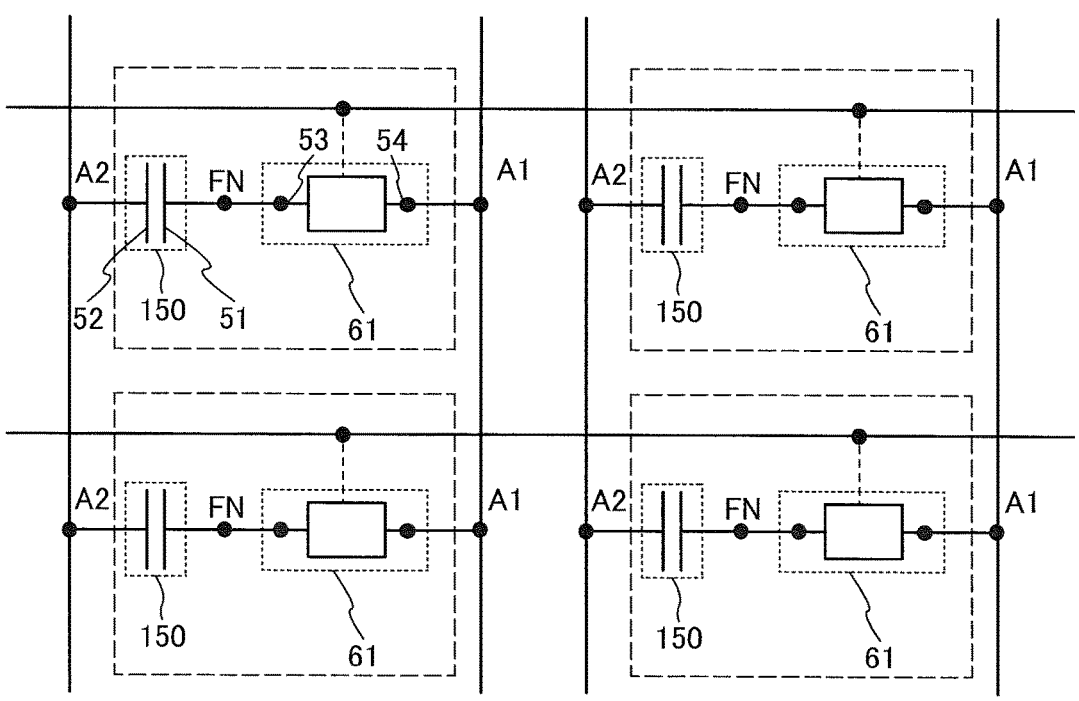
Figure 37A:
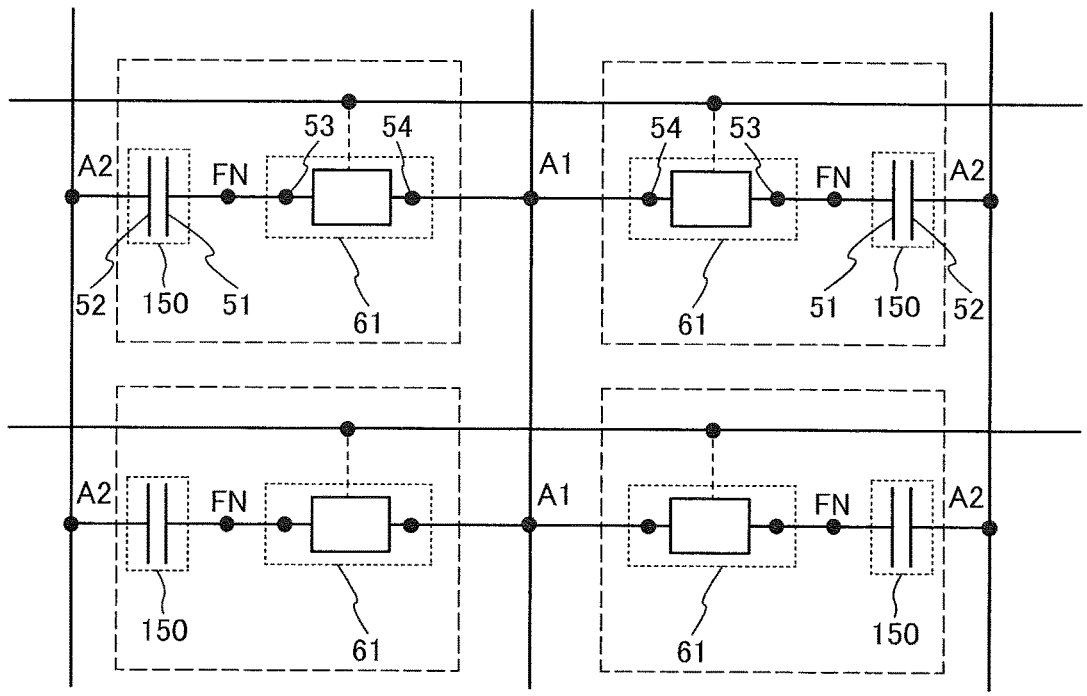
FIGS. 37A and 37B are each a circuit diagram illustrating an embodiment of the present invention.

FIG. 1B is a circuit diagram of the memory element 50. The memory element 50 includes the capacitor 150, and the capacitor 150 includes the electrode 51, the electrode 52, and the dielectric positioned between the electrode 51 and the electrode 52. In addition, the memory element 50 includes the switching element 61 connected to the electrode 51. The switching element 61 includes a terminal 53 and a terminal 54. The terminal 54 is connected to a terminal A1, and the electrode 52 is connected to a terminal A2. The terminal 53 and the electrode 51 are connected to a floating node FN. FIG. 36A illustrates a connection example in which a plurality of memory elements 50 in FIG. 1B is arranged to form a matrix. FIG. 36B illustrates another connection example in which the switching element 61 includes the terminal 53, the terminal 54, and a third terminal. Furthermore, adjacent memory elements 50 may be connected to a common wiring. For example, as illustrated in FIG. 37A, terminals A1 of adjacent switching elements 61 may be connected to a common wiring. Note that the connection configuration is not limited to the examples in FIGS. 36A and 36B and FIG. 37A.

Charge is accumulated in or released from the capacitor 150, whereby desired data can be written to the memory element 50.

Figure 2A:
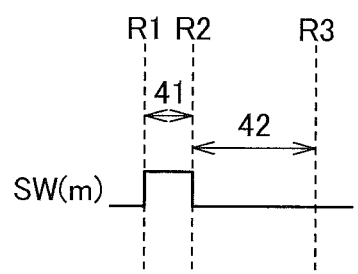
FIGS. 2A and 2B are each a timing chart illustrating an embodiment of the present invention.

The timing chart in FIG. 2A illustrates a method for performing writing to the memory element 50 included in the semiconductor device 500. A signal SW(m) is a signal which is input to an m-th memory element 50. The switching element 61 is turned on when the signal SW(m) is at the high level and turned off when the signal SW(m) is at the low level. A period from Time R1 to Time R2 is referred to as Period 41. In Period 41, writing to the memory element 50 is performed. The potential difference between the electrode 51 and the electrode 52 at Time R1 is denoted by $V_1$. The switching element 61 is turned on at Time R1, so that charge is accumulated in the capacitor 150 in accordance with signals input to the terminal A1 and the terminal A2; thus, writing is performed. The charge accumulation changes the potential of the floating node FN in FIG. 1B.

Subsequently, the switching element 61 is turned off at Time R2 to finish the writing. The potential difference between the electrode 51 and the electrode 52 at Time R2 is denoted by $V_2$.

Here, the current flowing in the off state may be, for example, $1/100$ or less, $1/10^4$ or less, or $1/10^8$ or less of the current flowing in the on state.

A period from Time R2 to Time R3 is referred to as Period 42. In Period 42, the switching element 61 is held in the off state. Period 42 is referred to as a holding period in some cases. Period 42 may also be referred to as a relaxation period.

Figure 2B:
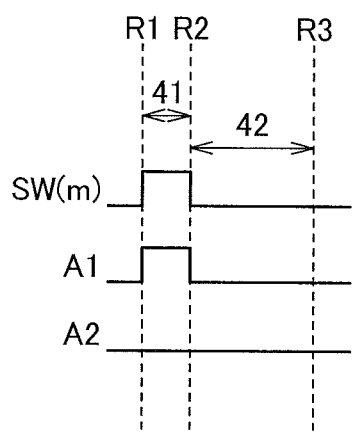

Next, examples of the potentials of the terminal A1 and the terminal A2 in the case where writing is performed according to FIG. 2A will be described more in detail with reference to FIG. 2B. In Period 41, a signal which corresponds to data to be written is input to the terminal A1. For example, a high power supply potential (H) may be supplied as a signal 1 which provides data "1", and a low power supply potential (L) may be supplied as a signal 0 which provides data "0". By the signal input to the terminal A1, charge corresponding to the signal is accumulated in the capacitor 150. In Period 41 and Period 42, the terminal A2 is at a constant potential. In FIG. 2B, the signal input to the terminal A1 is performed only in Period 41; a signal may also be input to the terminal A1 before or after Period 41.

In the case where multi-level data is written to the memory element 50, a plurality of potentials can be prepared as signals input to the terminal A1. For example, the multi-level writing can be performed by preparing a plurality of signals such as $H_1$, $H_2$, and $H_3$ as signals which provide high power supply potentials. Note that a plurality of signals which provide low power supply potentials may be prepared.

In the memory element of one embodiment of the present invention, the potential of the floating node FN is changed by writing operation. For example, writing is performed in such a manner that charge is accumulated in the capacitor connected to the floating node FN. In the writing operation, for example, constant voltage is applied to each of the both terminals of the capacitor 150. In the case where the writing time is sufficiently long, the amount of charge accumulated in the capacitor 150 is saturated and substantially controlled by the difference between the potentials applied to the both terminals of the capacitor 150. That is, in the case where the writing time is sufficiently long, the amount of charge accumulated in the capacitor 150 is less dependent on time.

For multi-level writing, for example, a plurality of conditions may be prepared for the difference between the potentials applied to the both terminals of the capacitor 150.

In contrast, in a memory element with an FETMOS structure in which a charge accumulation layer and a control gate are provided as disclosed in Patent Document 1, charge is accumulated in the charge accumulation layer, for example, by tunnel current flowing through a gate insulating film. When multi-level data is written to such a memory element, in some cases, the writing time is adjusted to control the amount of charge accumulated in the charge accumulation layer. That is, the amount of charge accumulated in the charge accumulation layer is not saturated and depends on time. In the case where the amount of charge varies between charge accumulation layers included in a plurality of memory elements, only a memory element having an insufficient amount of charge needs additional writing. For example, such a case requires the following operation. First, reading is performed to determine the variation in the amount of charge, and additional writing is performed on only a memory element having an insufficient amount of charge. After that, reading is performed again on the memory element on which the writing has been performed.

In the memory element of one embodiment of the present invention, the writing time is long enough to allow the amount of charge accumulated in the capacitor 150 to be saturated; therefore, the amount of charge is substantially controlled by the voltages applied to the both terminals of the capacitor 150. Therefore, reading is not necessary before and after the additional writing.

In some cases, the potential difference $V_2$ between the electrode 51 and the electrode 52 changes in Period 42. The amount of change in the potential difference between the electrode 51 and the electrode 52 in Period 42 is denoted by $\Delta V_2$.

Between the n memory elements 50 included in the semiconductor device 500, $\Delta V_2$ may possibly vary. In this case, the difference between potentials corresponding to signals needs to be larger than the variation in $\Delta V_2$. For example, in the case where $H_1$, $H_2$, and $H_3$ are used as signals which provide high power supply potentials, the potential differences between the signals each need to be at least larger than the maximum value of $\Delta V_2$. A large variation in $\Delta V_2$ increases the power consumption of the semiconductor device 500.

One of factors that cause the fluctuation of $V_2$ in Period 42 is traps T included in the dielectric of the capacitor 150. Note that the traps T also include traps at the interface between the dielectric and the electrode 51 and the interface between the dielectric and the electrode 52 in the capacitor 150.

The density and distribution of traps T in the dielectric may vary between the n memory elements 50. Accordingly, $\Delta V_2$, which is the amount of change in the potential difference $V_2$ in Period 42, may possibly vary between the capacitors 150 included in the n memory elements 50.

Figure 3A:
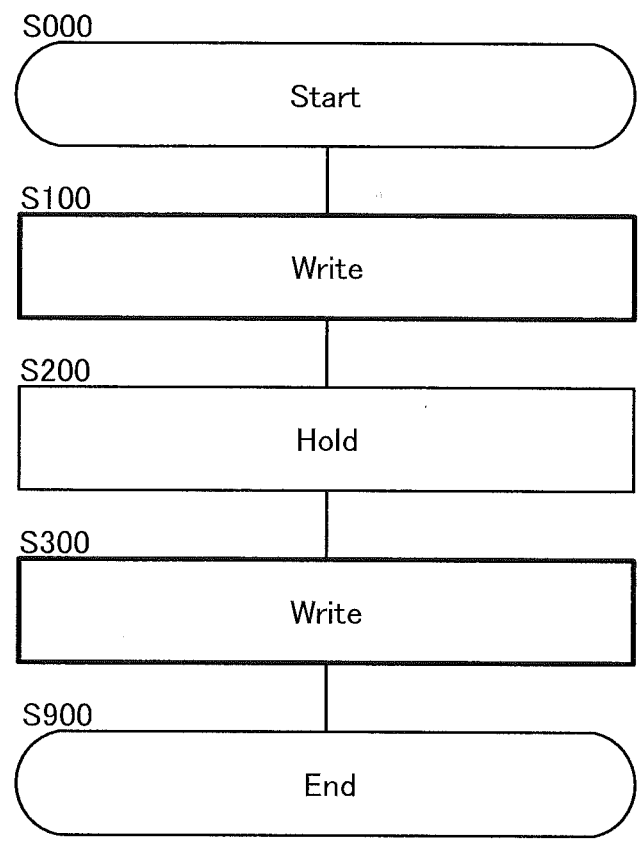
FIGS. 3A and 3B are a flow chart and a timing chart, respectively, which illustrate an embodiment of the present invention.

Next, an example of a writing method in which an influence of the traps T in the dielectric is suppressed to reduce a variation in writing will be described using the flow chart in FIG. 3A. First, the processing starts in Step S000. Then, writing is performed in Step S100. Subsequently, holding is performed in Step S200, and writing is performed again in Step S300. Through Steps S100 to S300, data can be written to the memory element 50. Furthermore, by performing Steps S100 to S300, a variation in writing can be reduced. Finally, the processing ends in Step S900.

Next, a specific writing method will be described using the timing chart in FIG. 3B. Note that Periods 71, 72, and 73 in FIG. 3B correspond to Steps S100, S200, and S300 in FIG. 3A, respectively.

First, in Period 71 (from Time T1 to Time T2), writing to the memory element 50 is performed. The potential difference between the electrode 51 and the electrode 52 in Period 71 is denoted by $V_{21}$. At Time T1, the switching element 61 is turned on to start the writing. When the switching element 61 is turned on, charge is accumulated in the capacitor 150 in accordance with a signal input to the terminal A1. The potential difference at Time T2 is denoted by $V_{22}$. At this time, a certain amount of charge accumulated in the capacitor 150 is captured in the traps T. At Time T2, the switching element 61 is turned off to cut the connection to the terminal A1.

Figure 4A:
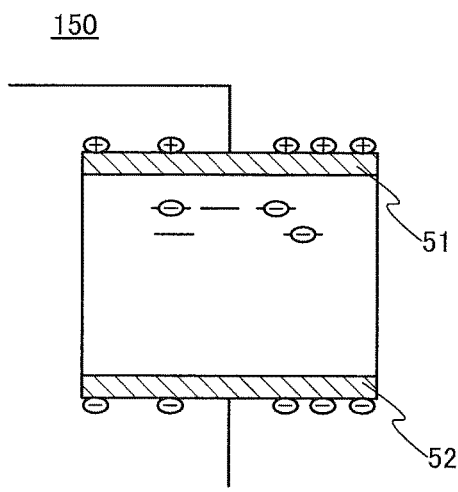
FIGS. 4A to 4D are schematic diagrams illustrating an embodiment of the present invention.
Figure 4B:
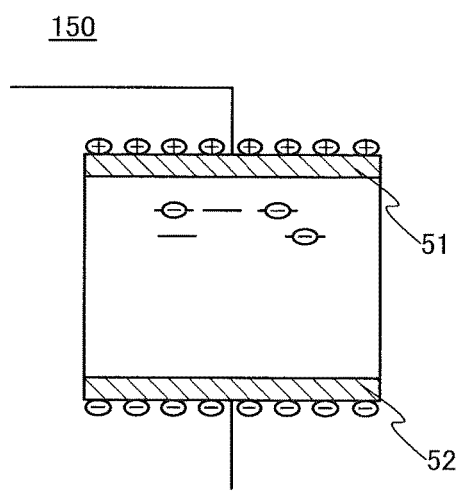

Here, accumulation of charge in the capacitor 150 will be described using the schematic diagrams in FIGS. 4A to 4D. As illustrated in FIG. 4A, in the process of charge accumulation in the capacitor in Period 71, some charge is captured in traps in the dielectric. The state at Time T2 (at the end of Period 71) is illustrated in FIG. 4B. FIG. 4B illustrates an example in which a few traps remain vacant in the dielectric, with no charge captured therein.

Subsequently, in Period 72 (from Time T2 to Time T3) in FIG. 3B, the switching element 61 is held in the off state. The case will be described where a certain amount of the charge which has not been captured in the traps T in Period 71 is captured in the traps T in Period 72. In this case, the charge captured in the traps T is redistributed in Period 72, so that the potential difference $V_{22}$ changes. The amount of change in the potential difference $V_{22}$ in Period 72 is denoted by $\Delta V_{22}$. FIG. 4C illustrates the following example: charge captured in traps in Period 72 causes a charge redistribution in the capacitor 150, resulting in a decrease in capacitance, that is, a decrease in the potential difference $V_{22}$ in the capacitor 150.

Since the number and distribution of traps T included in an insulating film vary between the insulating films included in the n capacitors 150, a variation in $\Delta V_{22}$ occurs between the capacitors 150.

Figure 3B:
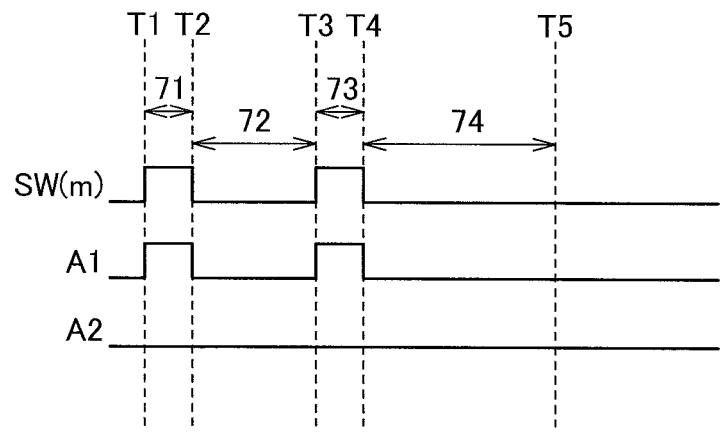
Figure 4C:
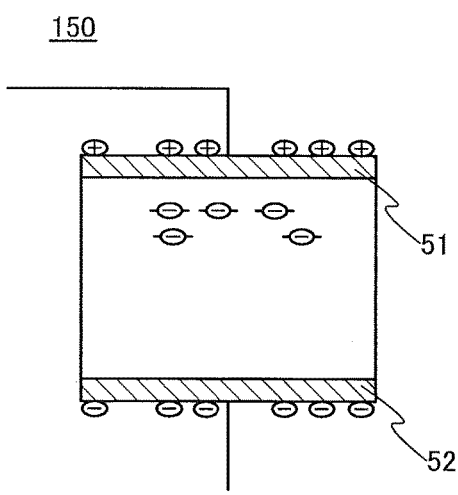
Figure 4D:
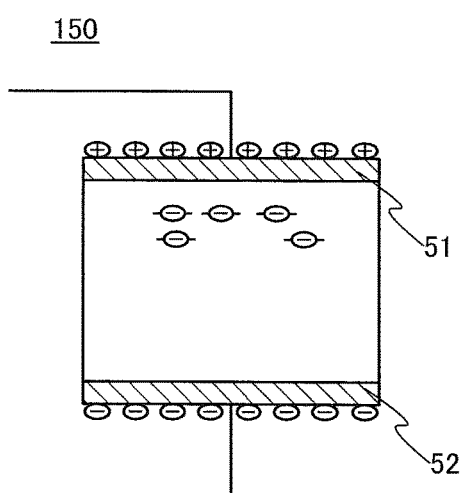

To balance the amount of change in the potential difference in Period 72, namely $\Delta V_{22}$, writing to the memory element 50 is performed again in Period 73 (from Time T3 to Time T4) in FIG. 3B. At this time, signals that are the same as those in Period 71 are input to the terminal A1 and the terminal A2 again. The switching element 61 is turned on at Time T3 and turned off at Time T4. As an example, FIG. 4D illustrates the capacitor 150 in the memory element 50 which has been subjected to writing again.

Here, the time from the end of Period 71 to the beginning of Period 73 is denoted by $\Delta T$, which is obtained by subtracting Time T2 from Time T3.

Subsequently, in Period 74 (from Time T4 to Time T5), the switching element 61 is held in the off state. After charge is slowly captured in the traps T in Period 72, writing is performed again in Period 73; thus, the amount of charge redistributed in the capacitor 150 in Period 74 is probably smaller than that in Period 72. Accordingly, $\Delta V_{23}$, which denotes the amount of change in the potential difference between the electrode 51 and the electrode 52 in Period 74, can be smaller than $\Delta V_{22}$. In other words, a variation in the potential difference can be made smaller between the n capacitors 150.

In the case where Period 71 is shorter than the time needed for charge to be captured in the traps T in the capacitor 150, the charge capture in the traps T continues in Period 72 following Period 71.

The dielectric constant of the dielectric used for the capacitor depends on frequency. The dependence of dielectric constant on frequency is attributed to an exponential change in polarization (delay in time response) of a substance to which an instantaneously changing step electric field is applied. For example, it is known that orientation polarization, which is a kind of polarization, exhibits dispersion and absorption in a very wide frequency range of $1\times10^{12}$ Hz or less. As another example, a non-uniform dielectric which includes two or more kinds of substances with different dielectric constants exhibits interfacial polarization, in which charge accumulation occurs at the interface instead of on the surface. In an actual device, particularly a defect in an insulating film may cause a delay in the former polarization, i.e., orientation polarization.

For example, while writing is performed in Period 71, charge is accumulated in the capacitor 150. The amount of charge accumulated in the capacitor is proportional to the polarizability of the dielectric layer in the capacitor. A variation in capacitance due to the above-described delay in polarization may change the time response. That is, the amount of accumulated charge varies between elements. Assuming such a case, Period 72 is provided to equalize the amount of trapped charge regardless of the previous state.

Furthermore, the case where data written to the memory element 50 is held will be described. Charge may also be slowly captured in the traps T in the holding period. Therefore, the traps T may cause a fluctuation of the held data. By equalizing the amount of trapped charge regardless of the previous state, a variation in the fluctuation of the data written to the memory element 50 can be made smaller between the elements.

Moreover, charge is captured in the traps T in advance by performing writing in Period 71 and Period 73, whereby the amount of charge captured in the traps T in the period in which data written in Period 73 is held can be reduced.

Here, Period 71 is preferably shorter than Period 72. In addition, Period 73 is preferably shorter than Period 72.

Period 71 is preferably longer than or equal to 50 ps and shorter than or equal to 1 ms, further preferably longer than or equal to 0.5 nanoseconds (ns) and shorter than or equal to 100 microseconds (μs), still further preferably longer than or equal to 5 ns and shorter than or equal to 10 μs. Period 72 is preferably longer than or equal to 50 ps and shorter than or equal to 100 ms, further preferably longer than or equal to 1 ns and shorter than or equal to 500 μs, still further preferably longer than or equal to 100 ns and shorter than or equal to 100 μs. Period 73 is preferably longer than or equal to 50 ps and shorter than or equal to 1 ms, further preferably longer than or equal to 0.5 ns and shorter than or equal to 100 μs, still further preferably longer than or equal to 5 ns and shorter than or equal to 10 μs.

Note that data can be repeatedly written to the memory element 50. When writing to the memory element 50 is performed, a signal is input to the terminal A1 to be written to the floating node FN. At this time, charge is accumulated in or released from the capacitor 150. For example, charge is accumulated in the capacitor 150 under the condition where a signal which allows an increase in the potential difference between the electrode 51 and the electrode 52 of the capacitor 150 is input to the terminal A1. For example, charge is released from the capacitor 150 under the condition where a signal which allows a decrease in the potential difference between the electrode 51 and the electrode 52 of the capacitor 150 is input to the terminal A1.

At the time of accumulation or release of charge, charge captured in the traps T is released in some cases. In particular, under the condition for releasing charge from the capacitor 150, the release of charge trapped in the traps T may occur more readily.

Here, an example in which writing to a plurality of memory elements 50 is performed will be described using the timing charts in FIGS. 5A and 5B.

Figure 5A:
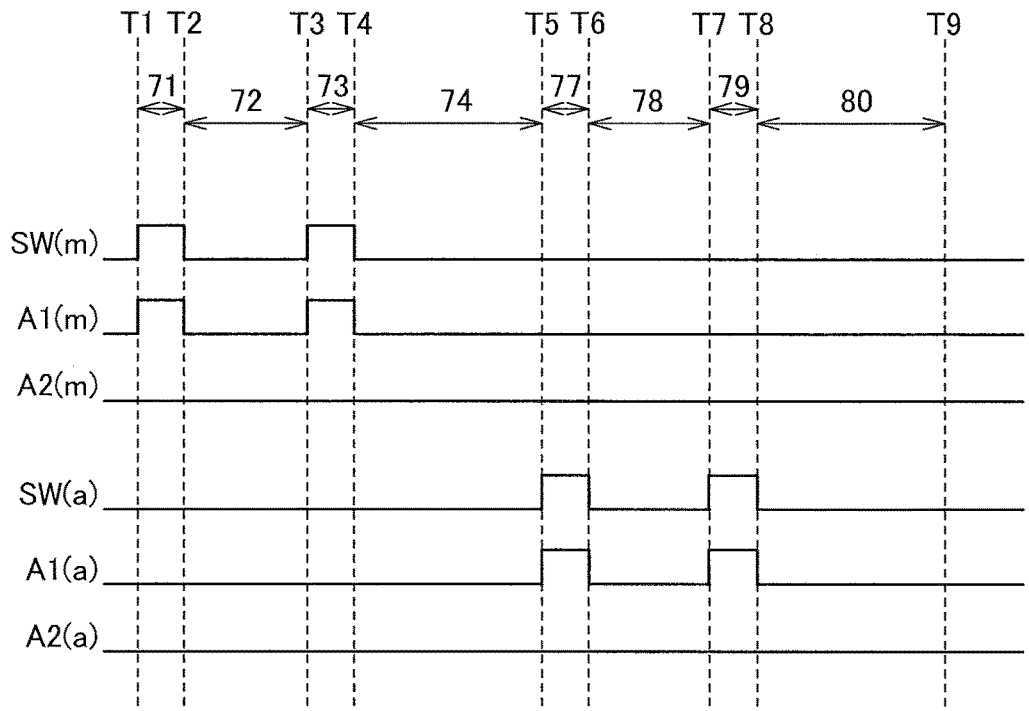
FIGS. 5A and 5B are each a timing chart illustrating an embodiment of the present invention.

First, an example will be shown in which writing to a plurality of memory elements 50 is performed according to the timing chart in FIG. 5A. In the manner described with reference to FIG. 3B, for example, the m-th memory element 50 of the n memory elements 50 included in the semiconductor device 500 is subjected to a step 1 of first writing in Period 71, a step 2 of holding in Period 72, and a step 3 of second writing in Period 73. Subsequently, from Period 77 to Period 80, writing to another memory element 50 other than the m-th memory element 50 (e.g., to an a-th memory element 50, where a is a natural number of 1 or more and n or less and is different from m) is performed. Under the control of signals supplied to a terminal A1(a) and a terminal A2(a) which are connected to the a-th memory element 50, a switching element 61(a) is in the on state in Period 77 (from Time T5 to Time T6) and Period 79 (from Time T7 to Time T8). In addition, a holding period is provided as Period 78 (from Time T6 to Time T7).

Figure 5B:
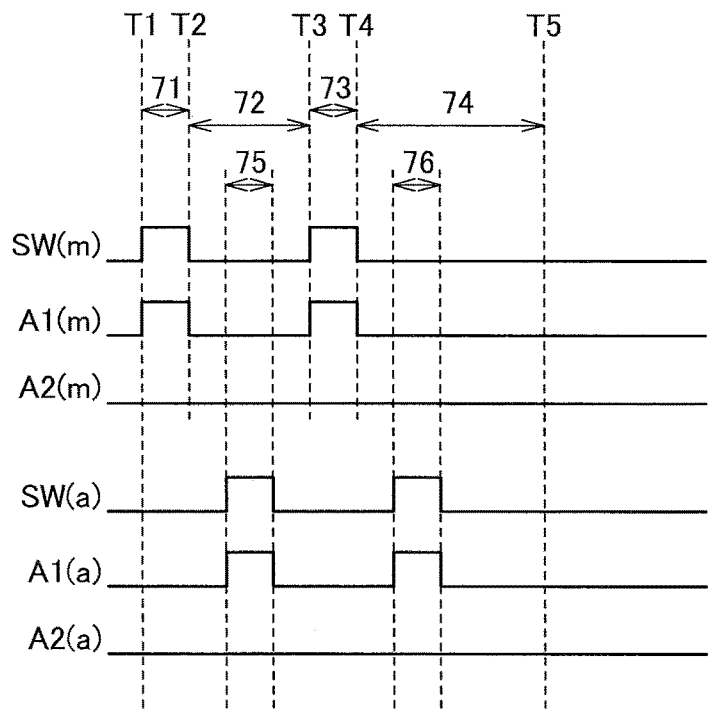

FIG. 5B is a timing chart in which writing to a plurality of memory elements 50 is performed in a manner different from that in FIG. 5A. Firstly, the m-th memory element of the n memory elements included in the semiconductor device 500 is subjected to the step 1 of first writing in Period 71, the step 2 of holding in Period 72, and the step 3 of second writing in Period 73.

As illustrated in FIG. 5B, in Period 72 and Period 74, which correspond to holding periods, writing to the a-th memory element 50 is performed, namely another memory element other than the m-th memory element 50 subjected to writing in Period 71 to Period 73 among the n memory elements included in the semiconductor device 500. Period 75 in which the a-th memory element 50 is subjected to the step 1 of first writing may be provided in Period 72, Period 76 in which the a-th memory element 50 is subjected to the step 3 of second writing may be provided in Period 74, and a period between Period 75 and Period 76 may be used for the step 2. In this manner, in the holding period of one memory element 50, writing to another memory element 50 is performed, whereby the time for writing can be shortened in FIG. 5B as compared in FIG. 5A.

Although the timing charts in FIG. 3B and FIGS. 5A and 5B show examples in which writing to one memory element 50 is performed twice, writing may be performed three times or more.

Example (2) of Semiconductor Device

Next, an example in which a transistor 100 is used as the switching element 61 in the memory element 50 included in the semiconductor device 500 in FIG. 1A will be described with reference to FIG. 6A.

Figure 6A:
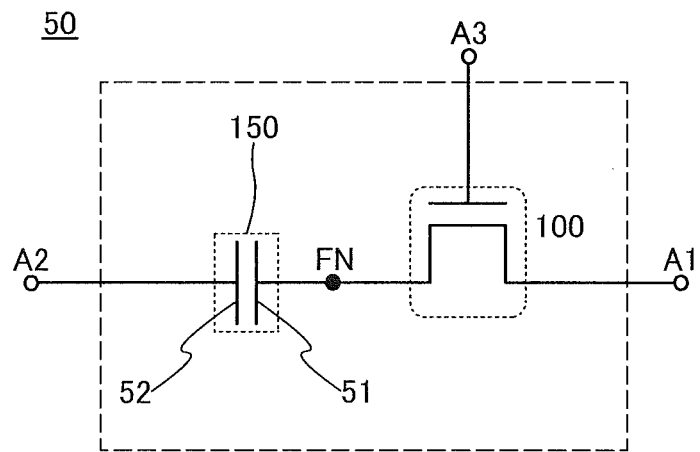
FIGS. 6A and 6B are a circuit diagram and a timing chart, respectively, which illustrate an embodiment of the present invention.
Figure 37B:
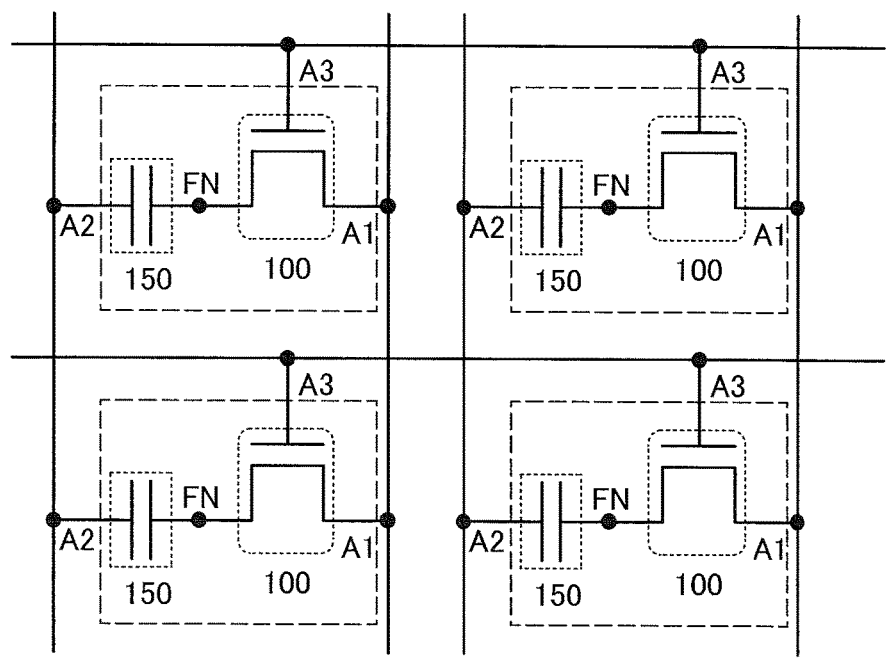

FIG. 6A illustrates an example of the memory element 50 included in the semiconductor device 500. The memory element 50 includes the capacitor 150, and the capacitor 150 includes the electrode 51, the electrode 52, and a dielectric positioned between the electrode 51 and the electrode 52. In addition, the memory element 50 includes the transistor 100 connected to the electrode 51. One of a source and a drain of the transistor 100 and the electrode 51 are connected to the floating node FN. The other of the source and the drain of the transistor 100 is connected to the terminal A1, the electrode 52 is connected to the terminal A2, and a gate electrode of the transistor 100 is connected to a terminal A3. FIG. 37B illustrates a connection example in which a plurality of memory elements 50 in FIG. 6A is arranged to form a matrix. Note that the connection configuration is not limited to the example in FIG. 37B.

Figure 6B:
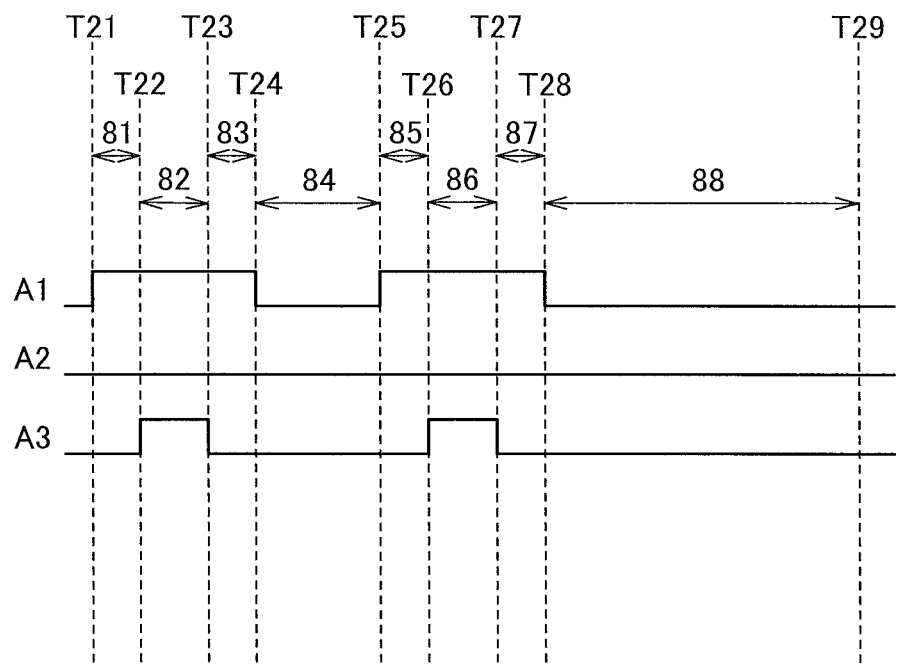

The operation of the memory element 50 of one embodiment of the present invention will be described using the timing chart in FIG. 6B. The timing chart in FIG. 6B can be illustrated as a flow chart in FIG. 10. Step S101 in FIG. 10 corresponds to Period 81 in FIG. 6B; Step S102, Period 82; Step S103, Period 83; Step S200, Period 84; Step S301, Period 85; Step S302, Period 86; and Step S303, Period 87. Through Step S100 to Step S300, data can be written to the memory element 50. Furthermore, by performing Step S100 to Step S300, a variation in writing can be reduced. Although Step S300 may be performed only once, it may be repeated twice or more as indicated by the solid arrow in FIG. 10. Alternatively, Step S200 and Step S300 may be repeated as indicated by the dashed arrow in FIG. 10.

Figure 10:
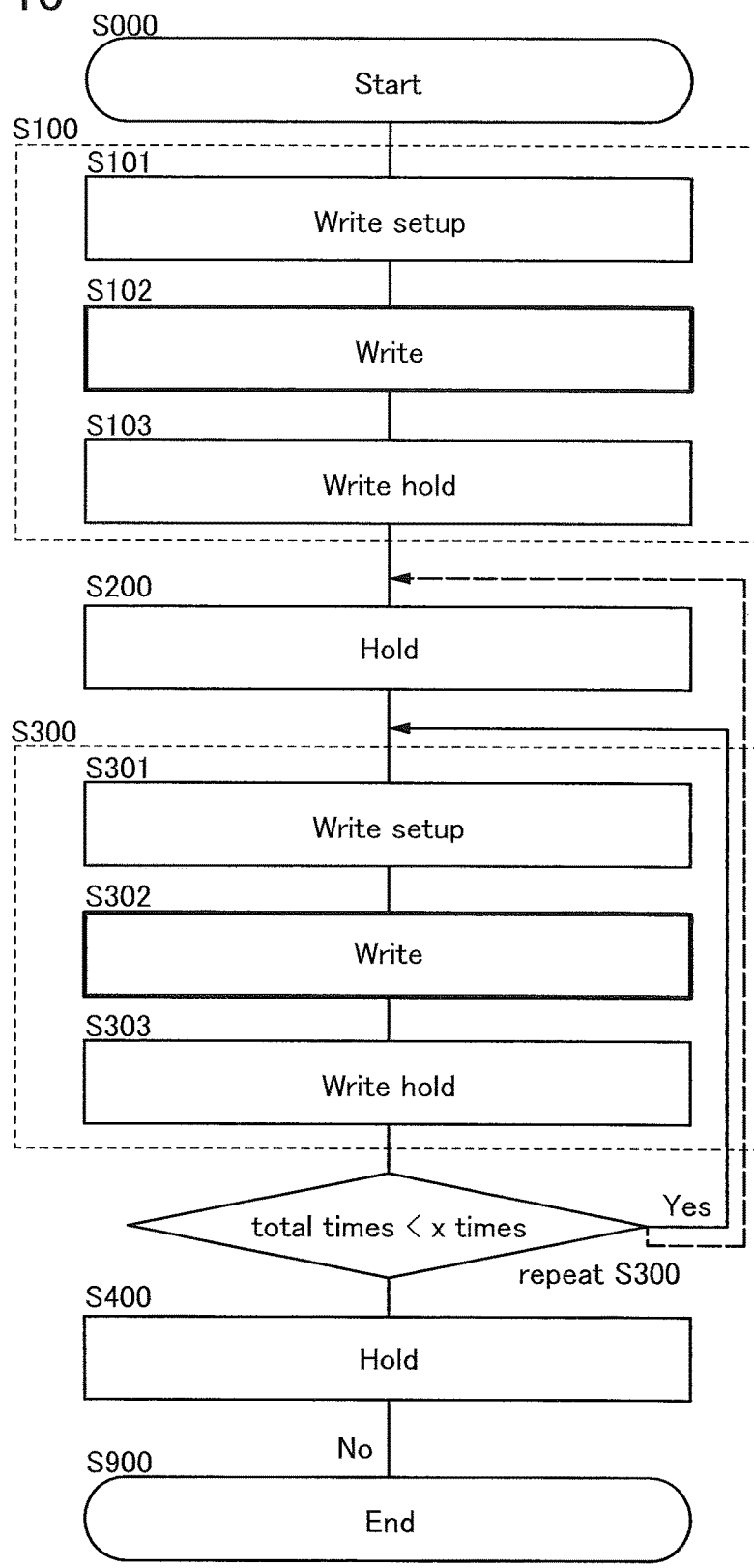
FIG. 10 is a flow chart illustrating an embodiment of the present invention.

As illustrated in FIG. 10, Step S400 may be provided as a holding period. In addition, writing to another memory element may be performed in Step S400.

Writing to the memory element of one embodiment of the present invention will be described using the timing chart in FIG. 6B. A signal H is input to the terminal A1 at Time T21. A period from Time T21 to Time T22 is referred to as Period 81.

Subsequently, the signal H is input to the terminal A3 at Time T22 to turn on the transistor 100; thus, first writing is performed. A period from Time T22 to Time T23 is referred to as Period 82.

Next, a signal L is input to the terminal A3 at Time T23 to turn off the transistor 100, so that the connection between the terminal A1 and the floating node FN is cut. A period from Time T23 to Time T24 is referred to as Period 83.

Then, the signal L is input to the terminal A1 at Time T24. A period from Time T24 to Time T25 is referred to as Period 84.

Figure 8A:
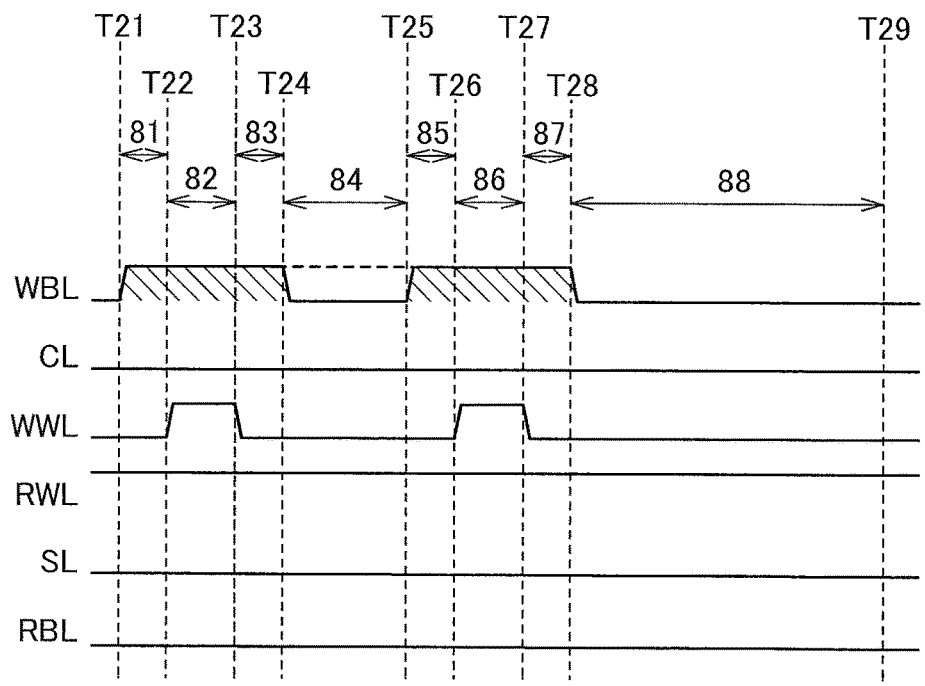
FIGS. 8A and 8B are each a timing chart illustrating an embodiment of the present invention.
Figure 8B:
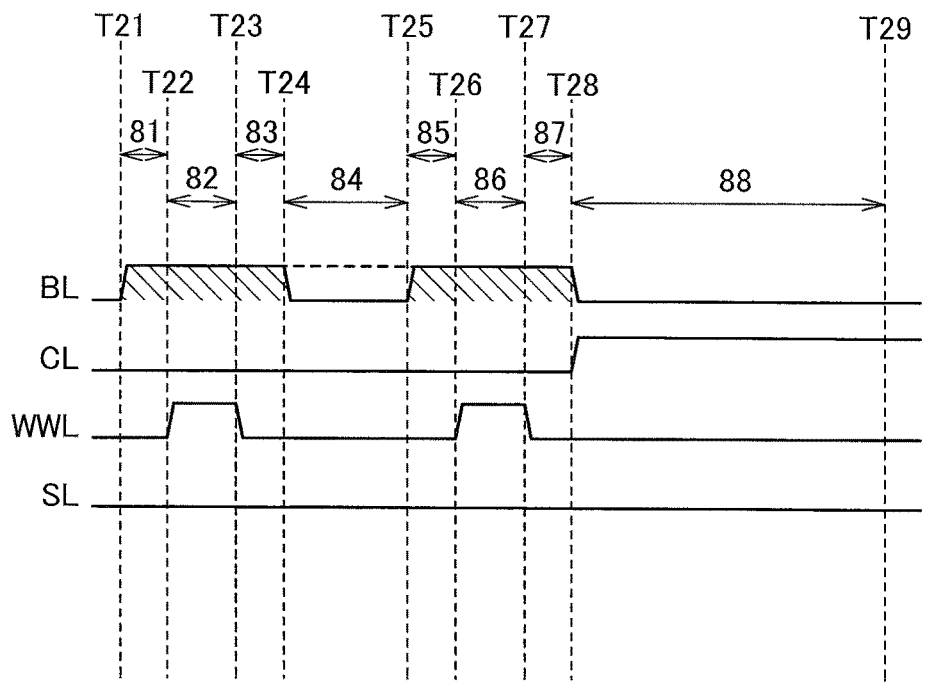

Subsequently, the signal H is input to the terminal A1 at Time T25, and the signal H is input to the terminal A3 at Time T26 to turn on the transistor 100; thus, writing is performed again. Then, the signal L is input to the terminal A3 at Time T27 to turn off the transistor 100, so that writing is finished. After that, the signal L is input to the terminal A1 at Time T28. In FIG. 6B and FIGS. 8A and 8B shown later, a period from Time T25 to Time T26 is referred to as Period 85; a period from Time T26 to Time T27, Period 86; and a period from Time T27 to Time T28, Period 87. In Period 81 to Period 87, the terminal A2 is at a constant potential.

In some cases, the potential of the floating node FN in FIG. 6A shifts, for example, from the potential input to the terminal A1 by the threshold value of the transistor 100.

In this specification, the threshold value refers to gate voltage at which a channel is formed. For example, the threshold value can be calculated from a curve where the horizontal axis represents the gate voltage $V_g$ and the vertical axis represents the square root of drain current $I_d$ ($V_g$-$\sqrt{I_d}$ characteristics); the threshold value corresponds to the gate voltage $V_g$ at the intersection of an extrapolated tangent line having the highest inclination with the square root of drain current $I_d$ of 0 (i.e., $I_d$ of 0 A).

Figure 7A:
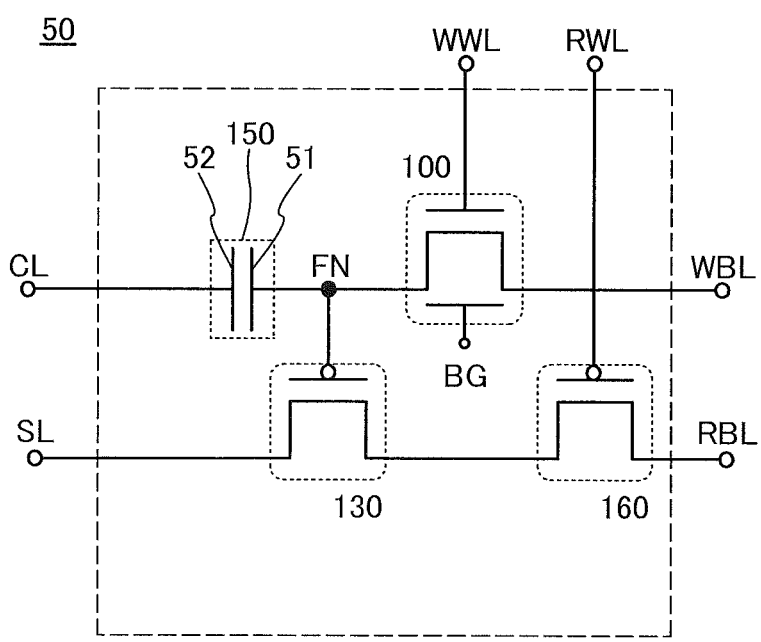
FIGS. 7A and 7B are each a circuit diagram illustrating an embodiment of the present invention.
Figure 38:
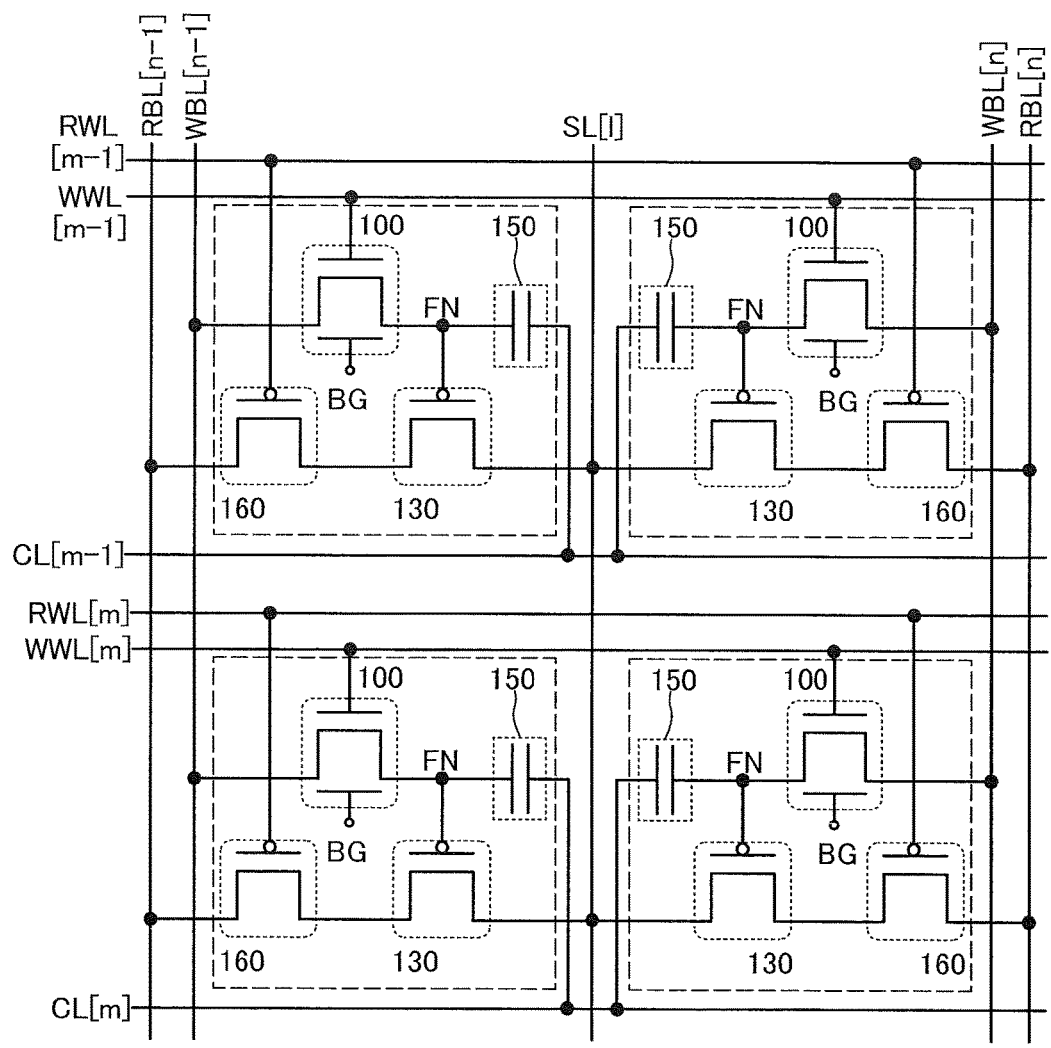
FIG. 38 is a circuit diagram illustrating an embodiment of the present invention.
Figure 40:
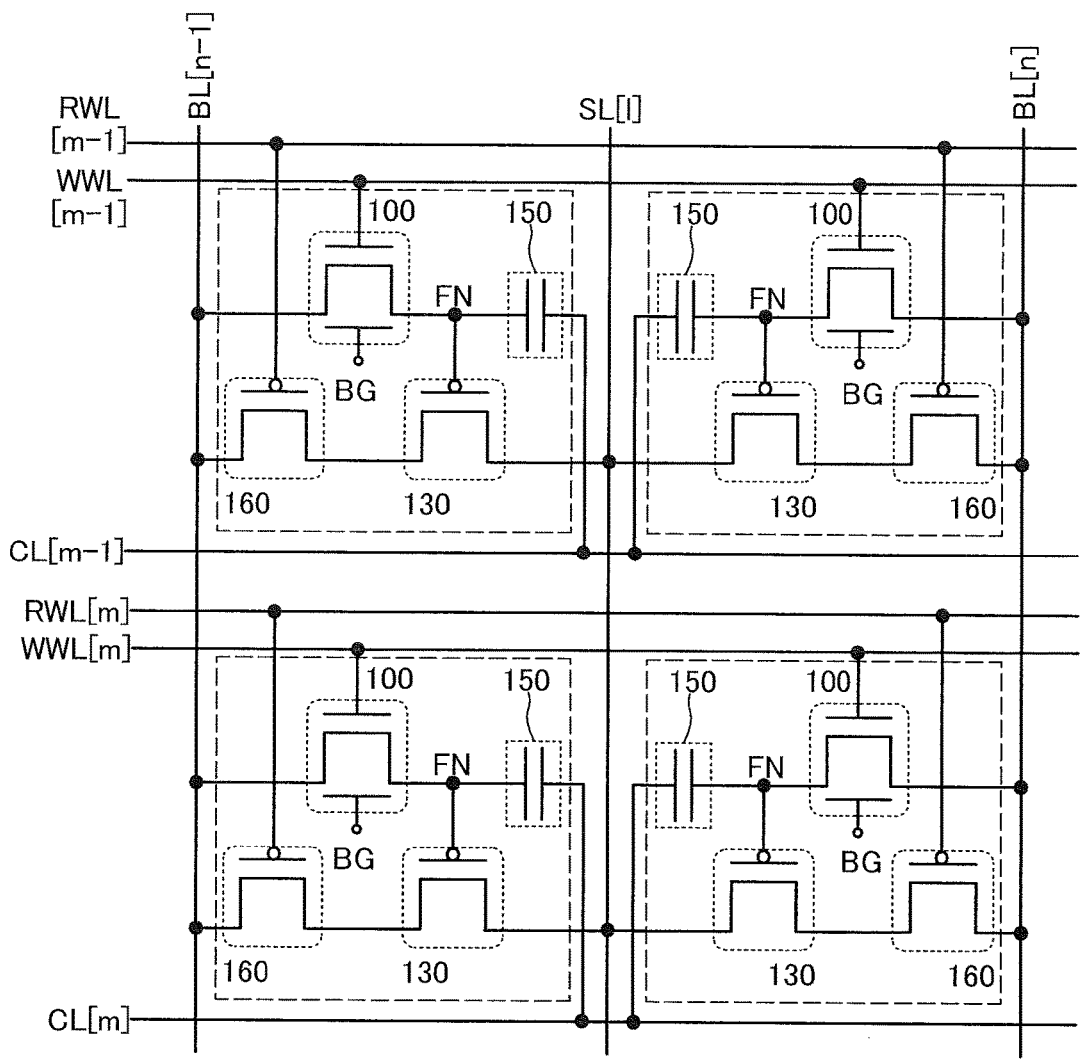
FIG. 40 is a circuit diagram illustrating an embodiment of the present invention.

FIG. 7A illustrates an example of the memory element 50. The memory element 50 includes the capacitor 150, the transistor 100, a transistor 130, and a transistor 160. In the example illustrated here, the transistor 100 is an n-channel transistor, and the transistor 130 and the transistor 160 are p-channel transistors; however, the polarities of the transistor 100, the transistor 130, and the transistor 160 are not limited thereto. FIG. 38 illustrates a connection example in which a plurality of memory elements 50 in FIG. 7A is arranged to form a matrix. Note that the connection configuration is not limited to the example in FIG. 38. As illustrated in FIG. 40, a terminal WBL and a terminal RBL may be connected to a common wiring. The use of the common wiring can reduce the area of the memory element 50, for example.

In FIG. 7A, the electrode 51, one of a source electrode and a drain electrode of the transistor 100, and a gate electrode of the transistor 130 are connected to the floating node FN. The electrode 52 is connected to a terminal CL, and one of a source electrode and a drain electrode of the transistor 130 is connected to one of a source electrode and a drain electrode of the transistor 160. The other of the source electrode and the drain electrode of the transistor 100 is connected to the terminal WBL, and the other of the source electrode and the drain electrode of the transistor 160 is connected to the terminal RBL. The other of the source electrode and the drain electrode of the transistor 130 is connected to a terminal SL. The transistor 100 preferably includes a pair of gate electrodes: a first gate electrode is connected to the terminal WWL, and a second gate electrode is connected to a terminal BG. The terminal BG may be supplied with a constant potential, for example.

The timing chart in FIG. 8A illustrates a method for performing writing to the memory element 50 in FIG. 7A. First, at Time T21, a signal corresponding to data (for 1-bit data, a high signal (H) or a low signal (L)) is input to the terminal WBL. The other terminals remain supplied with the signal L. A period from Time T21 to Time T22 (Period 81) is referred to as a write setup period. Subsequently, the signal H is input to the terminal WWL at Time T22 to turn on the transistor 100, so that charge corresponding to the potential of the terminal WBL is written to the floating node FN from Time T22 to Time T23 (Period 82). Then, the signal L is input to the terminal WWL at Time T23 to turn off the transistor 100. A period from Time T23 to Time T24 (Period 83) is referred to as a write hold period. Then, the signal L is input to the terminal WBL at Time T24. Alternatively, the terminal WBL may continue to be supplied with the signal H. A holding period is provided as the next period between Time T24 and Time T25.

Subsequently, at Time T25, a signal corresponding to the data is input to the terminal WBL. The other terminals remain at the L level. Then, the signal H is input to the terminal WWL at Time T26 to turn on the transistor 100; thus, writing is performed. A period from Time T25 to Time T26 (Period 85) is referred to as a write setup period. Then, the signal L is input to the terminal WWL at Time T27 to turn off the transistor 100. A period from Time T27 to Time T28 (Period 87) is referred to as a write hold period.

Through the period from Time T21 to Time T28, a variation in writing can be reduced. Here, the time ΔT from the end of Period 82, in which the signal for turning on the transistor 100 is input, to the beginning of Period 86, in which the signal for turning on the transistor 100 is input again, corresponds to a value obtained by subtracting Time T23 from Time T26. Then, the signal L is input to the terminal WBL at Time T28.

Period 88 may be provided after Time T28. Reading or writing or of another memory element may be performed in Period 88.

Figure 7B:
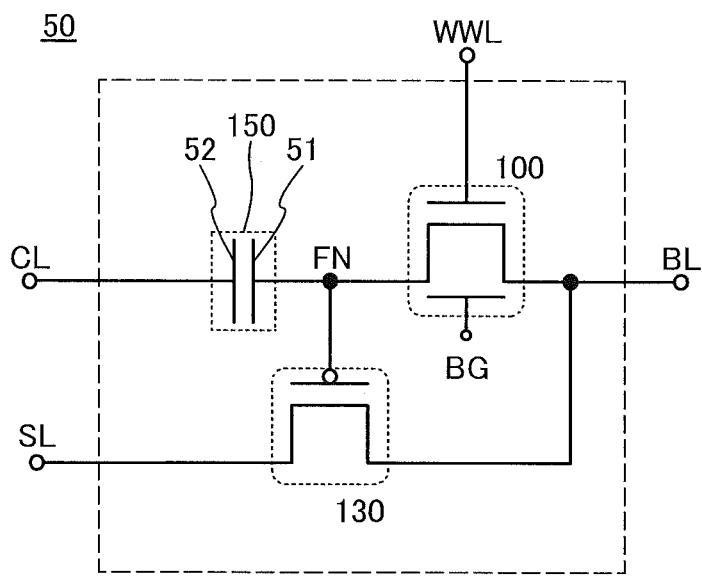

FIG. 7B illustrates an example of the memory element 50. Unlike FIG. 7A, FIG. 7B does not include the transistor 160, which leads to a reduction in circuit area.

In the memory element 50 in FIG. 7B, the electrode 51 of the capacitor 150, one of a source electrode and a drain electrode of the transistor 100, and a gate electrode of the transistor 130 are connected to the floating node FN. The electrode 52 of the capacitor 150 is connected to the terminal CL, and one of a source electrode and a drain electrode of the transistor 130 and the other of the source electrode and the drain electrode of the transistor 100 are connected to a terminal BL. The other of the source electrode and the drain electrode of the transistor 130 is connected to the terminal SL.

The timing chart in FIG. 8B illustrates a method for performing writing to the memory element 50 in FIG. 7B. For the timing of signal input to the terminal BL in FIG. 8B, that to the terminal WBL in FIG. 8A may be referred to. By inputting the signal H to the terminal CL at Time T28, the memory element 50 can be set into the non-selected state.

Figure 9A:
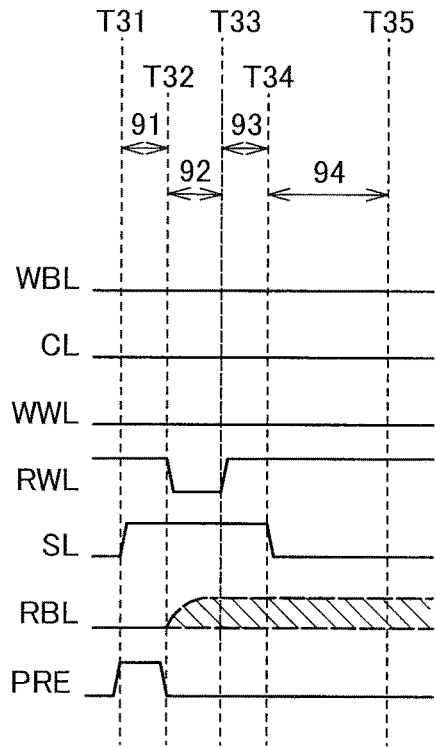
FIGS. 9A and 9B are each a timing chart illustrating an embodiment of the present invention.
Figure 9B:
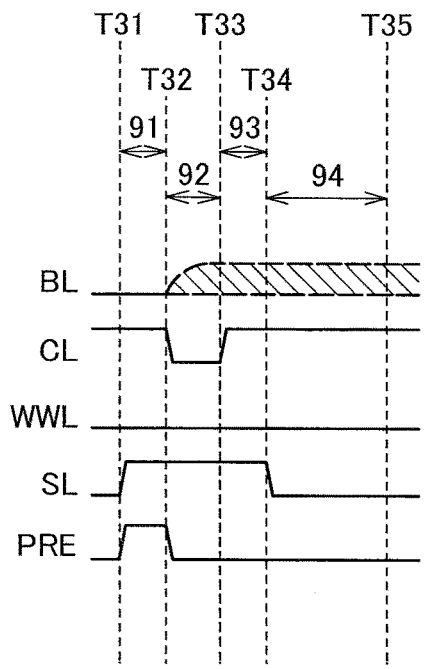

FIG. 9A illustrates a method for reading out data written to the memory element 50 in FIG. 7A, and FIG. 9B illustrates a method for reading out data written to the memory element 50 in FIG. 7B.

Figure 11:
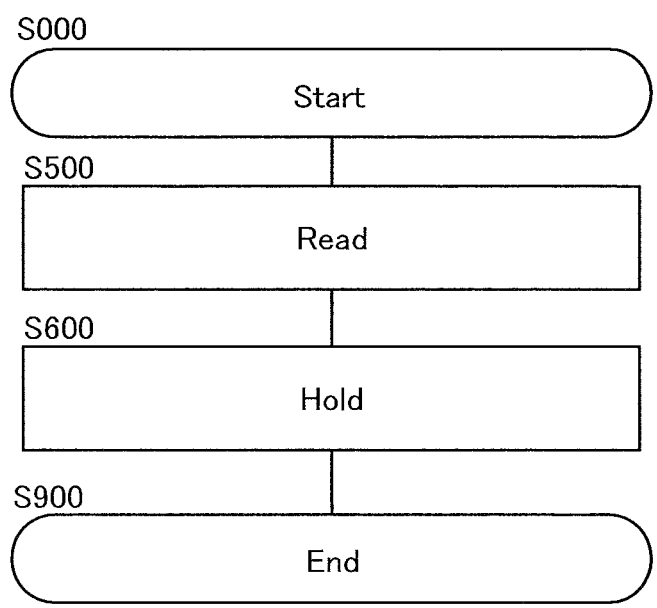
FIG. 11 is a flow chart illustrating an embodiment of the present invention.
Figure 23A:
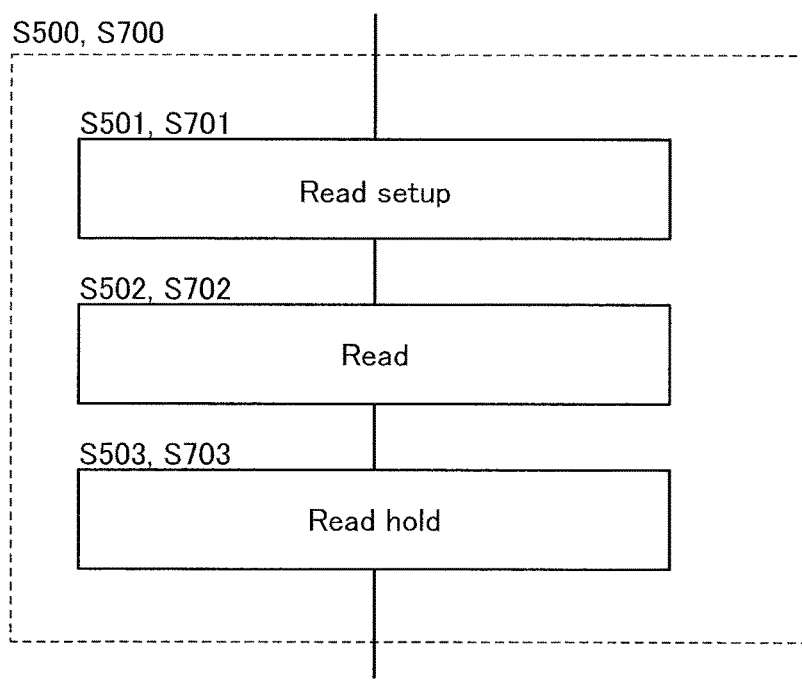
FIGS. 23A and 23B are each a flow chart illustrating an embodiment of the present invention.

The timing chart in FIG. 9A can be illustrated as a flow chart in FIG. 11. Step S500 in FIG. 11 corresponds to Period 91 to Period 93 in FIG. 9A; and Step S600, Period 94. Here, Step S500 is referred to as a reading period. Step S600 serves as a holding period, and reading or writing of another memory element is preferably performed in this period. As illustrated in FIG. 23A, Step S500 (reading period) may include three steps (Step S501, Step S502, and Step S503). Step S501 corresponds to Period 91 in FIG. 9A; Step S502, Period 92; and Step S503, Period 93. The same also applies to Period 91 to Period 93 in FIG. 9B.

Next, the timing chart in FIG. 9A will be described. At Time T31, the terminal RWL is supplied with the signal H. The signal H is input to the terminal SL. The terminal WWL remains at the L level. Furthermore, a precharge signal (PRE) is input to the reading circuit included in the circuit 600, so that the terminal RBL is set at the L level. At Time T32, the signal PRE is set to the L level and the signal L is input to the terminal RWL. Then, the signal H is input to the terminal RWL at Time T33 to turn off the transistor 160. After that, the signal L is input to the terminal SL at Time T34.

The timing chart in FIG. 9B will be described. At Time T31, the terminal CL is supplied with the signal H. The precharge signal (PRE) is input to the reading circuit included in the circuit 600, so that the terminal BL is set at the L level. Furthermore, the signal H is input to the terminal SL. The terminal WWL remains at the L level. Next, at Time T32, the signal PRE is set to the L level and the signal L is input to the terminal CL. Then, the signal H is input to the terminal CL at Time T33. After that, the signal L is input to the terminal SL at Time T34.

In FIGS. 9A and 9B, reading is performed in Period 92 (from Time T32 to Time T33). For example, in the case where the potential of the terminal SL is sufficiently high compared with the potential of the floating node FN, the transistor 130 is turned on, so that a signal H' is output from the terminal RBL in FIG. 9A and from the terminal BL in FIG. 9B. On the other hand, when the potential of the terminal SL becomes lower than the sum of the potential of the floating node FN and the threshold value of the transistor 130, the transistor 130 is turned off, so that a signal L' is output from the terminal RBL in FIG. 9A and from the terminal BL in FIG. 9B. Thus, by measuring the voltage of the terminal RBL or the terminal BL, data written to the floating node FN can be read out.

In the case where reading of another memory element (an element other than the m-th memory element) is performed, it is necessary to set the m-th memory element into the non-selected state. In this case, the signal H is input to the terminal RWL in FIG. 7A to turn off the transistor 160 included in the m-th memory element, whereby the m-th memory element can be set into the non-selected state. Meanwhile, the signal H is input to the terminal CL in FIG. 7B to turn off the transistor 130 included in the m-th memory element, whereby the m-th memory element can be set into the non-selected state. In the latter case, for example, current may flow from the terminal BL to the terminal SL. Therefore, the power consumption of the memory element 50 in FIG. 7A can be lower than that in FIG. 7B.

Figure 20:
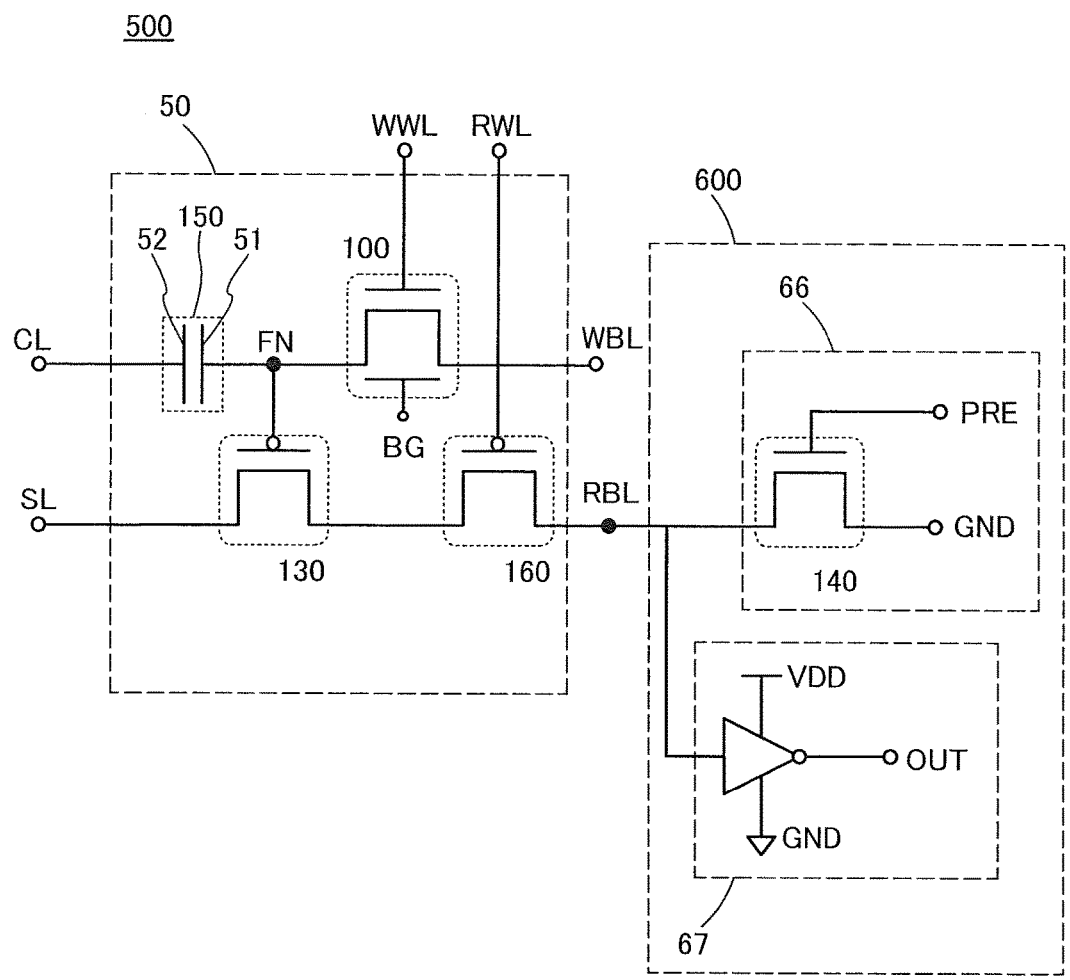
FIG. 20 is a circuit diagram illustrating an embodiment of the present invention.

FIG. 20 illustrates an example of the semiconductor device 500 of one embodiment of the present invention. The semiconductor device 500 in FIG. 20 includes one memory element 50 and the circuit 600. The circuit 600 includes a circuit 66 in which a precharge signal is input from a terminal PRE and a circuit 67 to which a signal from the terminal RBL is input.

The memory element 50 in FIG. 7A can be referred to for the memory element 50 in FIG. 20.

The circuit 66 includes an n-channel transistor 140. A gate electrode of the transistor 140 is connected to the terminal PRE, one of a source electrode and a drain electrode of the transistor 140 is connected to a terminal GND to which a potential GND (ground potential) is input, and the other of the source electrode and the drain electrode of the transistor 140 is connected to the terminal RBL. When the signal H is input to the terminal PRE, the signal L (potential GND) is input to the terminal RBL.

The circuit 67 includes an inverter. The potential of the terminal RBL is input to the inverter. The inverter is connected to a terminal VDD to which a potential VDD (constant potential) is input and to a terminal GND to which the potential GND is input. The output of the inverter is output to a terminal OUT.

The n-channel transistor 100 includes an oxide semiconductor. The transistor 100 includes a pair of gate electrodes. The p-channel transistors 130 and 160 and the n-channel transistor 140 include silicon.

[Various Examples of Driving Method]

Figure 12:
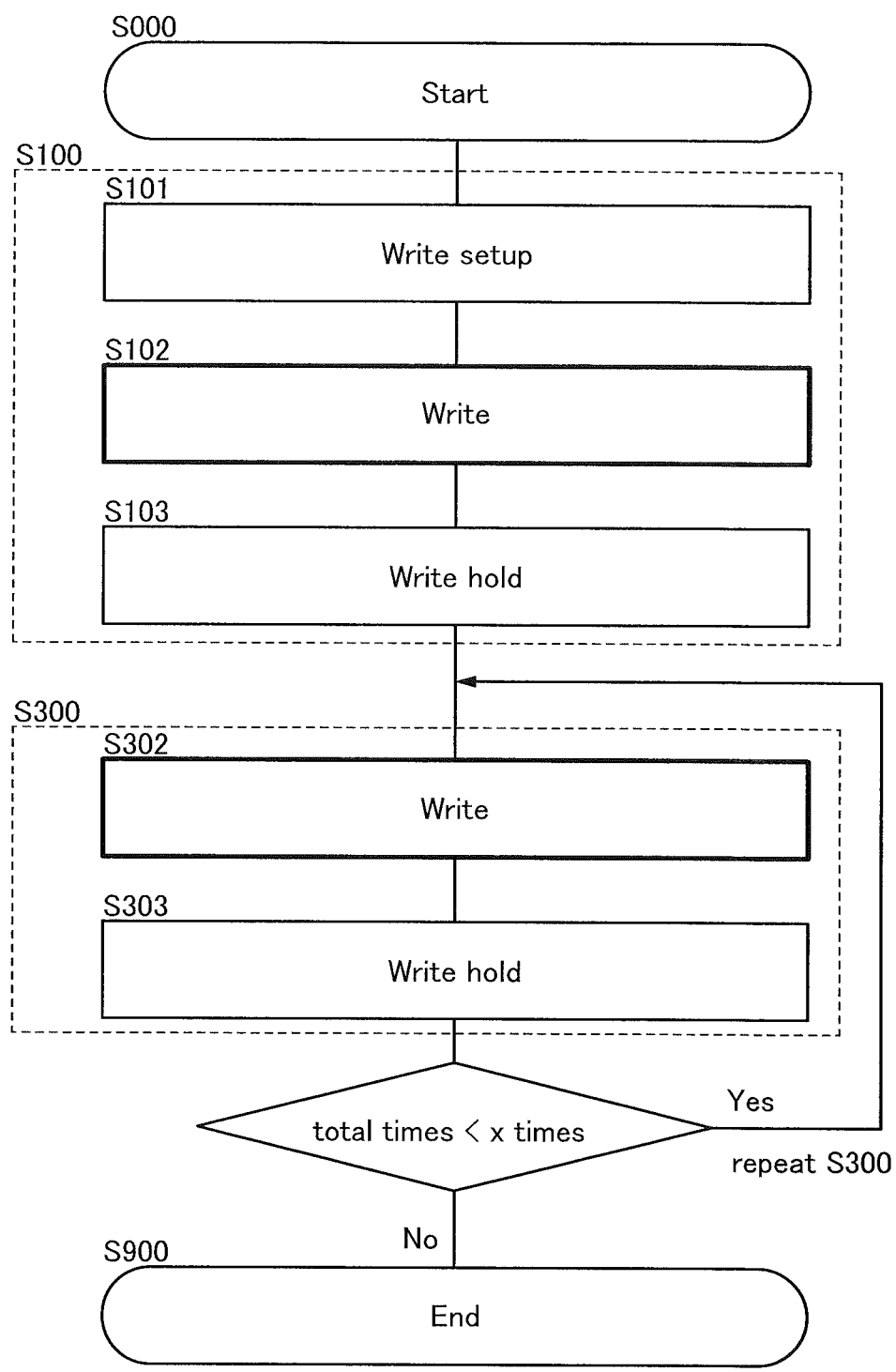
FIG. 12 is a flow chart illustrating an embodiment of the present invention.

The flow chart in FIG. 12 illustrates an example of a method for driving the memory element 50 included in the semiconductor device 500. A write setup period is provided as Step S101. In the subsequent Step S102, the switching element is turned on to perform writing. Then, in Step S103, the switching element is turned off to let a write hold period start. Steps S101 to S103 are collectively referred to as Step S100. Next, in Step S302, the switching element is turned on again to perform writing. Then, in Step S303, the switching element is turned off to let a write hold period start. Steps S302 and S303 are collectively referred to as Step S300. Step S300 may be performed only once or may be repeated twice or more. Here, the time ΔT from the end of the period in which a signal for turning on the switching element is input to the beginning of the period in which the signal for turning on the switching element is input again corresponds to the time for Step S103.

Figure 13:
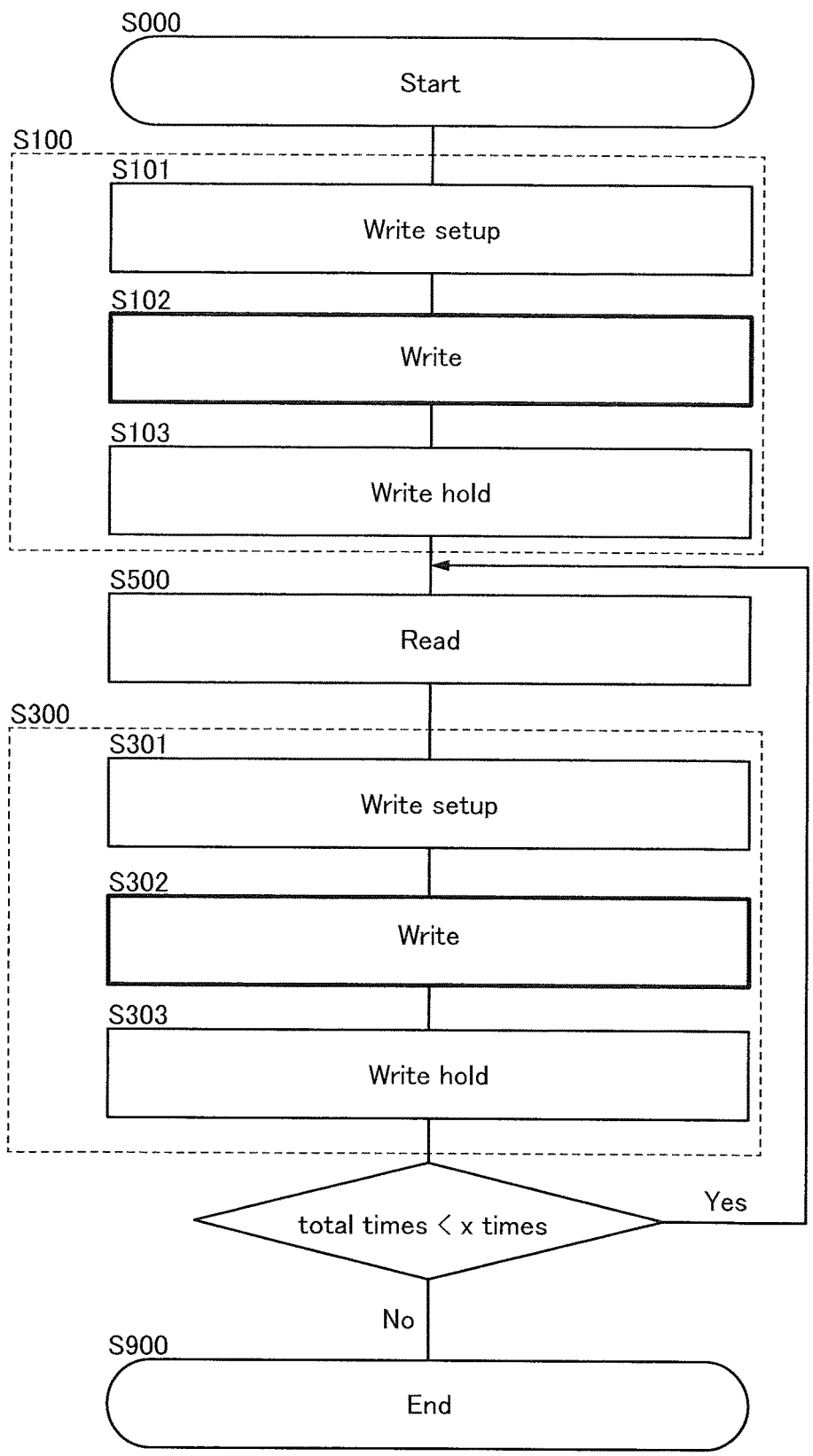
FIG. 13 is a flow chart illustrating an embodiment of the present invention.

The flow chart in FIG. 13 illustrates another example of a method for driving the memory element 50. A write setup period is provided as Step S101. In the subsequent Step S102, the switching element is turned on to perform writing.

Then, in Step S103, the switching element is turned off to let a write hold period start. Next, in Step S500, reading of the memory element 50 is performed. Next, a write setup period is provided as Step S301. In the subsequent Step S302, the switching element is turned on again to perform writing. Then, in Step S303, the switching element is turned off to let a write hold period start. Steps S301 to S303 are collectively referred to as Step S300. Steps S500 and S300 may be performed only once or may be repeated twice or more. Here, the time ΔT from the end of the period in which a signal for turning on the switching element is input to the beginning of the period in which the signal for turning on the switching element is input again corresponds to the total time for Step S103 to Step S301.

In the write setup periods, the write hold periods, and the like in FIG. 12 and FIG. 13, for example, the driving method described with reference to FIG. 8A or FIG. 8B may be employed.

[Transistor]

A transistor which can be used as the transistor 100 in FIG. 6A and FIGS. 7A and 7B will be described.

The transistor 100 preferably includes a semiconductor. As the semiconductor, for example, a single-material semiconductor such as silicon or germanium, a compound semiconductor such as silicon carbide, silicon germanium, gallium arsenide, gallium nitride, indium phosphide, zinc oxide, or gallium oxide, or an oxide semiconductor can be used.

The transistor 100 preferably functions as the switching element 61. The transistor 100 includes a semiconductor. In particular, the semiconductor is preferably an oxide semiconductor. A transistor including an oxide semiconductor can have extremely low off-state current, thereby obtaining excellent switching characteristics. In this specification, a transistor including an oxide semiconductor as a semiconductor is referred to as an OS transistor. The OS transistor will be described later.

Embodiment 2

In this embodiment, the OS transistor mentioned in the above embodiment will be described.

<Off-State Current Characteristics>

The off-state current of an OS transistor can be reduced by reducing the concentration of impurities in an oxide semiconductor to make the oxide semiconductor intrinsic or substantially intrinsic. The term "substantially intrinsic" refers to the state in which an oxide semiconductor has a carrier density lower than $1\times10^{13}/cm^3$, preferably lower than $8\times10^{11}/cm^3$, further preferably lower than $1\times10^{11}/cm^3$, still further preferably lower than $1\times10^{10}/cm^3$, and higher than or equal to $1\times10^{-9}/cm^3$. In an oxide semiconductor, hydrogen, nitrogen, carbon, silicon, and a metal element other than main components are impurities. For example, hydrogen and nitrogen form donor levels to increase the carrier density.

A transistor including an intrinsic or substantially intrinsic oxide semiconductor has a low carrier density and thus is less likely to have negative threshold voltage. Moreover, because of few carrier traps in the oxide semiconductor, the transistor including the oxide semiconductor has little fluctuation of electrical characteristics and high reliability. Furthermore, the transistor including the oxide semiconductor can have extremely low off-state current.

Note that the OS transistor with reduced off-state current can exhibit a normalized off-state current per micrometer of channel width of $1\times10^{-18}$ A or lower, preferably $1\times10^{-21}$ A or lower, further preferably $1\times10^{-24}$ A or lower at room temperature (approximately 25° C.), or $1\times10^{-15}$ A or lower, preferably $1\times10^{-18}$ A or lower, further preferably $1\times10^{-21}$ A or lower at 85° C.

As an example, the case where data voltage for 4-bit data is held at the floating node FN will be described. In the case where the power supply voltage is higher than or equal to 2 V and lower than or equal to 3.5 V, the storage capacitance is 0.1 fF, the distribution width of the holding voltage is less than 30 mV, and the acceptable amount of change in holding voltage is less than 80 mV, the leakage current from the floating node FN needs to be lower than $0.025\times10^{-24}$ A in order that the amount of change in the voltage held at 85° C. for 10 years may be within the acceptable range. In the case where leakage occurs mainly through the OS transistor and the contribution of other factors to the leakage is rather small, the leakage current per unit area of the OS transistor with a channel width of 60 nm is preferably lower than $0.423\times10^{-24}$ A/μm. The memory element 50 which satisfies the above specifications can hold data at 85° C. for 10 years.

<Off-State Current>

Unless otherwise specified, the off-state current in this specification refers to drain current of a transistor in the off state (also referred to as non-conduction state and cutoff state). Unless otherwise specified, the off state of an n-channel transistor means that the voltage between its gate and source ($V_{gs}$: gate-source voltage) is lower than the threshold voltage $V_{th}$, and the off state of a p-channel transistor means that the gate-source voltage $V_{gs}$ is higher than the threshold voltage $V_{th}$. For example, the off-state current of an n-channel transistor sometimes refers to drain current that flows when the gate-source voltage $V_{gs}$ is lower than the threshold voltage $V_{th}$.

The off-state current of a transistor depends on $V_{gs}$ in some cases. For this reason, when the off-state current of a transistor is I or lower at a certain $V_{gs}$, it may be said that the off-state current of the transistor is I or lower. The off-state current of a transistor may refer to off-state current at given $V_{gs}$, off-state current at $V_{gs}$ in a given range, or off-state current at $V_{gs}$ at which sufficiently low off-state current is obtained.

As an example, an assumption is made that an n-channel transistor has a threshold voltage $V_{th}$ of 0.5 V and a drain current of $1\times10^{-9}$ A at $V_{gs}$ of 0.5 V, $1\times10^{-13}$ A at $V_{gs}$ of 0.1 V, $1\times10^{-19}$ A at $V_{gs}$ of −0.5 V, and $1\times10^{-22}$ A at $V_{gs}$ of −0.8 V. The drain current of the transistor is $1\times10^{-19}$ A or lower at $V_{gs}$ of −0.5 V or at $V_{gs}$ in the range of −0.8 V to −0.5 V; therefore, it may be said that the off-state current of the transistor is $1\times10^{-19}$ A or lower. Since the drain current of the transistor is $1\times10^{-22}$ A or lower at a certain $V_{gs}$, it may be said that the off-state current of the transistor is $1\times10^{-22}$ A or lower.

In this specification, the off-state current of a transistor with a channel width W is sometimes represented by a current value per channel width W or by a current value per given channel width (e.g., 1 μm). In the latter case, the unit of off-state current may be represented by current per length (e.g., A/μm).

The off-state current of a transistor depends on temperature in some cases. Unless otherwise specified, the off-state current in this specification may be off-state current at room temperature, 60° C., 85° C., 95° C., or 125° C. Alternatively, the off-state current may be off-state current at a temperature at which the reliability of a semiconductor device or the like including the transistor is ensured or a temperature at which the semiconductor device or the like including the transistor is used (e.g., temperature in the range of 5° C. to 35° C.). When the off-state current of a transistor at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.) is I or lower at a certain $V_{gs}$, it may be said the off-state current of the transistor is I or lower.

The off-state current of a transistor depends on the voltage Vas between its drain and source in some cases. Unless otherwise specified, the off-state current in this specification may be off-state current at Vas with an absolute value of 0.1 V, 0.8 V, 1 V, 1.2 V, 1.8 V, 2.5 V, 3 V, 3.3 V, 10 V, 12 V, 16 V, or 20 V. Alternatively, the off-state current may be off-state current at Vas at which the reliability of a semiconductor device or the like including the transistor is ensured or at Vas used in the semiconductor device or the like including the transistor. When the off-state current of a transistor with a given $V_{ds}$ is I or lower at a certain $V_{gs}$, it may be said that the off-state current of the transistor is I or lower. Here, the given Vas is, for example, 0.1 V, 0.8 V, 1 V, 1.2 V, 1.8 V, 2.5 V, 3 V, 3.3 V, 10 V, 12 V, 16 V, 20 V, Vas at which the reliability of a semiconductor device or the like including the transistor is ensured, or Vas used in the semiconductor device or the like including the transistor.

In the above description of the off-state current, a drain may be replaced with a source. That is, the off-state current sometimes refers to current that flows through a source of a transistor in the off state.

In this specification, the term "leakage current" sometimes expresses the same meaning as "off-state current."

In this specification, the off-state current sometimes refers to current that flows between a source and a drain of a transistor is in the off state, for example.

After data is written to the memory element 50 (e.g., in FIG. 1B), the potential of the floating node FN decreases owing to slight leakage current that flows through the switching element 61. In some cases, the potential of the floating node FN ($V_{FN}$) can be expressed as the stretched exponential function in Formula 1 below. In particular, in the case where a transistor with extremely low off-state current (leakage current) like an OS transistor is used as the switching element 61, the fitting accuracy can be improved.

[Formula 1]

$$V_{FN}(t) = \alpha \times e^{-\left(\frac{t}{\tau}\right)^\beta} \quad (1)$$

<Composition of Oxide Semiconductor>

An oxide semiconductor used for a semiconductor layer of an OS transistor preferably contains at least indium (In) or zinc (Zn). In particular, In and Zn are preferably contained. A stabilizer for strongly bonding oxygen is preferably contained in addition to In and Zn. As the stabilizer, at least one of gallium (Ga), tin (Sn), zirconium (Zr), hafnium (Hf), and aluminum (Al) may be contained.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

Examples of the oxide semiconductor used for the semiconductor layer of the transistor include indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

For example, an In—Ga—Zn-based oxide with an atomic ratio of In:Ga:Zn=1:1:1, 3:1:2, 4:2:3, or 2:1:3, or an oxide with an atomic ratio close to the above atomic ratios may be used.

<Impurities in Oxide Semiconductor>

When an oxide semiconductor film forming the semiconductor layer contains a large amount of hydrogen, the hydrogen and the oxide semiconductor are bonded to each other, so that part of the hydrogen serves as a donor and causes carrier (electron) generation. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified and contains as few impurities as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment) of the oxide semiconductor film.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type oxide semiconductor film that is extremely close to the i-type oxide semiconductor film. Note that "substantially intrinsic" means that the oxide semiconductor film includes extremely few (close to zero) carriers derived from a donor and has a carrier density lower than $1\times10^{13}/cm^3$, preferably lower than $8\times10^{11}/cm^3$, further preferably lower than $1\times10^{11}/cm^3$, still further preferably lower than $1\times10^{10}/cm^3$, and higher than or equal to $1\times10^{-9}/cm^3$.

<Structure of Oxide Semiconductor>

The structure of an oxide semiconductor will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

An oxide semiconductor film is classified into a non-single-crystal oxide semiconductor film and a single crystal oxide semiconductor film. Furthermore, an oxide semiconductor is classified into, for example, a crystalline oxide semiconductor and an amorphous oxide semiconductor.

Examples of the non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of the crystalline oxide semiconductor include a single crystal oxide semiconductor, a CAAC-OS, a polycrystalline oxide semiconductor, and a microcrystalline oxide semiconductor.

First, a CAAC-OS film will be described.

A CAAC-OS film is one of oxide semiconductor films and includes a plurality of c-axis aligned crystal parts.

In an image which is obtained by the combined analysis of a bright-field image and a diffraction pattern of a CAAC-OS film taken with a transmission electron microscope (TEM) (such an image is also referred to as a high-resolution TEM image), a plurality of crystal parts can be observed. However, even in the high-resolution TEM image, a boundary between crystal parts, that is, a grain boundary is not clearly observed. Thus, in the CAAC-OS film, a reduction in electron mobility due to the grain boundary is less likely to occur.

According to a high-resolution cross-sectional TEM image of the CAAC-OS film observed in the direction substantially parallel to a sample surface, metal atoms are arranged in a layered manner in the crystal parts. Each metal atom layer has a morphology reflecting unevenness of a surface over which the CAAC-OS film is formed (also referred to as a formation surface) or a top surface of the CAAC-OS film, and is arranged parallel to the formation surface or the top surface of the CAAC-OS film.

On the other hand, according to a high-resolution plan-view TEM image of the CAAC-OS film observed in the direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when a CAAC-OS film including an $InGaZnO_4$ crystal is analyzed by an out-of-plane method, a peak may appear when the diffraction angle (2θ) is around 31°. This peak is derived from the (009) plane of the $InGaZnO_4$ crystal, which indicates that crystals in the CAAC-OS film have c-axis alignment and that the c-axes are aligned in the direction substantially perpendicular to the formation surface or the top surface of the CAAC-OS film.

When the CAAC-OS film including an $InGaZnO_4$ crystal is analyzed by an out-of-plane method, a peak at 2θ of around 36° may also be observed in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and no peak appear when 2θ is around 36°.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a constituent metal element of the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus, such an impurity contained in the oxide semiconductor film disturbs the atomic arrangement of the oxide semiconductor film and causes a decrease in crystallinity. Note that the impurity contained in the oxide semiconductor film might serve as a carrier trap or a carrier generation source.

The CAAC-OS film is an oxide semiconductor film having a low density of defect states. In some cases, an oxygen vacancy in the oxide semiconductor film serves as a carrier trap or a carrier generation source when hydrogen is captured therein.

The state in which the impurity concentration is low and the density of defect states is low (the number of oxygen vacancies is small) is referred to as "highly purified intrinsic" or "substantially highly purified intrinsic." A highly purified intrinsic or substantially highly purified intrinsic oxide semiconductor film has few carrier generation sources and thus can have a low carrier density. Therefore, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little fluctuation of electrical characteristics and is highly reliable. Charge captured in the carrier traps in the oxide semiconductor film takes a long time to be released and might behave like fixed charge. Thus, the transistor which includes the oxide semiconductor film with a high impurity concentration and a high density of defect states has unstable electrical characteristics in some cases.

In the transistor including the CAAC-OS film, the fluctuation of electrical characteristics due to irradiation with visible light or ultraviolet light is small.

Next, a microcrystalline oxide semiconductor film will be described.

A high-resolution TEM image of a microcrystalline oxide semiconductor film has a region in which a crystal part is observed and a region in which a crystal part is not clearly observed. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or greater than or equal to 1 nm and less than or equal to 3 nm is specifically referred to as a nanocrystal (nc). An oxide semiconductor film including a nanocrystal is referred to as a nanocrystalline oxide semiconductor (nc-OS) film. In a high-resolution TEM image of the nc-OS film, for example, a grain boundary is clearly observed in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on the analysis method. For example, when the nc-OS film is subjected to structural analysis by an out-of-plane method with an XRD apparatus using an X-ray having a diameter larger than that of a crystal part, a peak indicating a crystal plane does not appear. Furthermore, a diffraction pattern like a halo pattern is observed in a selected-area electron diffraction pattern of the nc-OS film which is obtained using an electron beam with a probe diameter (e.g., 50 nm or larger) larger than the diameter of a crystal part. Meanwhile, spots are observed in a nanobeam electron diffraction pattern of the nc-OS film which is obtained using an electron beam with a probe diameter close to or smaller than the diameter of a crystal part. Furthermore, in a nanobeam electron diffraction pattern of the nc-OS film, regions with high luminance in a circular (ring) pattern are observed in some cases. In the nanobeam electron diffraction pattern of the nc-OS film, a plurality of spots is also observed in a ring-like region in some cases.

The nc-OS film is an oxide semiconductor film that has higher regularity than an amorphous oxide semiconductor film. Therefore, the nc-OS film has a lower density of defect states than an amorphous oxide semiconductor film. However, there is no regularity of crystal orientation between different crystal parts in the nc-OS film. Hence, the nc-OS film has a higher density of defect states than the CAAC-OS film.

Next, an amorphous oxide semiconductor film will be described.

An amorphous oxide semiconductor film has disordered atomic arrangement and no crystal part. For example, the amorphous oxide semiconductor film does not have a specific state like quartz glass.

In a high-resolution TEM image of the amorphous oxide semiconductor film, crystal parts cannot be found.

When the amorphous oxide semiconductor film is subjected to structural analysis by an out-of-plane method with an XRD apparatus, a peak indicating a crystal plane does not appear. A halo pattern is observed in an electron diffraction pattern of the amorphous oxide semiconductor film. Furthermore, a halo pattern is observed but no spot is observed in a nanobeam electron diffraction pattern of the amorphous oxide semiconductor film.

Note that an oxide semiconductor film may have a structure with physical properties between the nc-OS film and the amorphous oxide semiconductor film. The oxide semiconductor film with such a structure is specifically referred to as an amorphous-like oxide semiconductor (a-like OS) film.

In a high-resolution TEM image of the a-like OS film, a void may be observed. Furthermore, the high-resolution TEM image has a region in which a crystal part is clearly observed and a region in which no crystal part is observed. In some cases, the a-like OS film is crystallized by a slight amount of electron beam used for TEM observation, and the growth of the crystal part is observed. In contrast, crystallization by a slight amount of electron beam used for TEM observation is hardly observed in an nc-OS film having good quality.

Note that the size of a crystal part in the a-like OS film and the nc-OS film can be measured using high-resolution TEM images. For example, an $InGaZnO_4$ crystal has a layered structure in which two Ga—Zn—O layers are positioned between In—O layers. A unit cell of the $InGaZnO_4$ crystal has a structure in which nine layers, namely three In—O layers and six Ga—Zn—O layers, are stacked in the c-axis direction. Accordingly, the spacing between these adjacent layers is equivalent to the lattice spacing on the (009) plane (also referred to as d value). The value is calculated to 0.29 nm from crystal structure analysis. Thus, focusing on the lattice fringes in the high-resolution TEM image, each of the lattice fringes between which the spacing is greater than or equal to 0.28 nm and less than or equal to 0.30 nm corresponds to the a-b plane of the $InGaZnO_4$ crystal.

The density of an oxide semiconductor film varies depending on structure. For example, the structure of an oxide semiconductor film can be estimated by comparing the density of the oxide semiconductor film with the density of a single crystal oxide semiconductor film having the same composition. For example, the density of the a-like OS film is higher than or equal to 78.6% and lower than 92.3% of the density of the single crystal oxide semiconductor film having the same composition. For example, the density of the nc-OS film and the density of the CAAC-OS film are each higher than or equal to 92.3% and lower than 100% of the density of the single crystal oxide semiconductor film having the same composition. Note that it is difficult to deposit an oxide semiconductor film whose density is lower than 78% of the density of the single crystal oxide semiconductor film having the same composition.

Specific examples of the above description will be given. For example, in the case of an oxide semiconductor film with an atomic ratio of In:Ga:Zn=1:1:1, the density of single crystal $InGaZnO_4$ with a rhombohedral crystal structure is 6.357 $g/cm^3$. Accordingly, in the case of the oxide semiconductor film with an atomic ratio of In:Ga:Zn=1:1:1, the density of the a-like OS film is higher than or equal to 5.0 $g/cm^3$ and lower than 5.9 $g/cm^3$. For example, in the case of the oxide semiconductor film with an atomic ratio of In:Ga:Zn=1:1:1, the density of the nc-OS film and the density of the CAAC-OS film are each higher than or equal to 5.9 $g/cm^3$ and lower than 6.3 $g/cm^3$.

Note that there is a possibility that an oxide semiconductor film having a certain composition cannot exist in a single crystal state. In this case, single crystal oxide semiconductor films with different compositions are combined in an adequate ratio to calculate density equivalent to that of a single crystal oxide semiconductor film with a desired composition. The density of the single crystal oxide semiconductor film with a desired composition may be calculated using weighted average with respect to the combination ratio of the single crystal oxide semiconductor films with different compositions. Note that it is preferable to combine as few kinds of single crystal oxide semiconductor films as possible for density calculation.

Note that an oxide semiconductor film may be a stacked film including two or more of an amorphous oxide semiconductor film, an a-like OS film, a microcrystalline oxide semiconductor film, and a CAAC-OS film, for example.

As described above, the OS transistor can achieve very favorable off-state current characteristics.

Embodiment 3

In this embodiment, the structure of a semiconductor device of one embodiment of the present invention will be described.

[Structure of Semiconductor Device]

Figure 14:
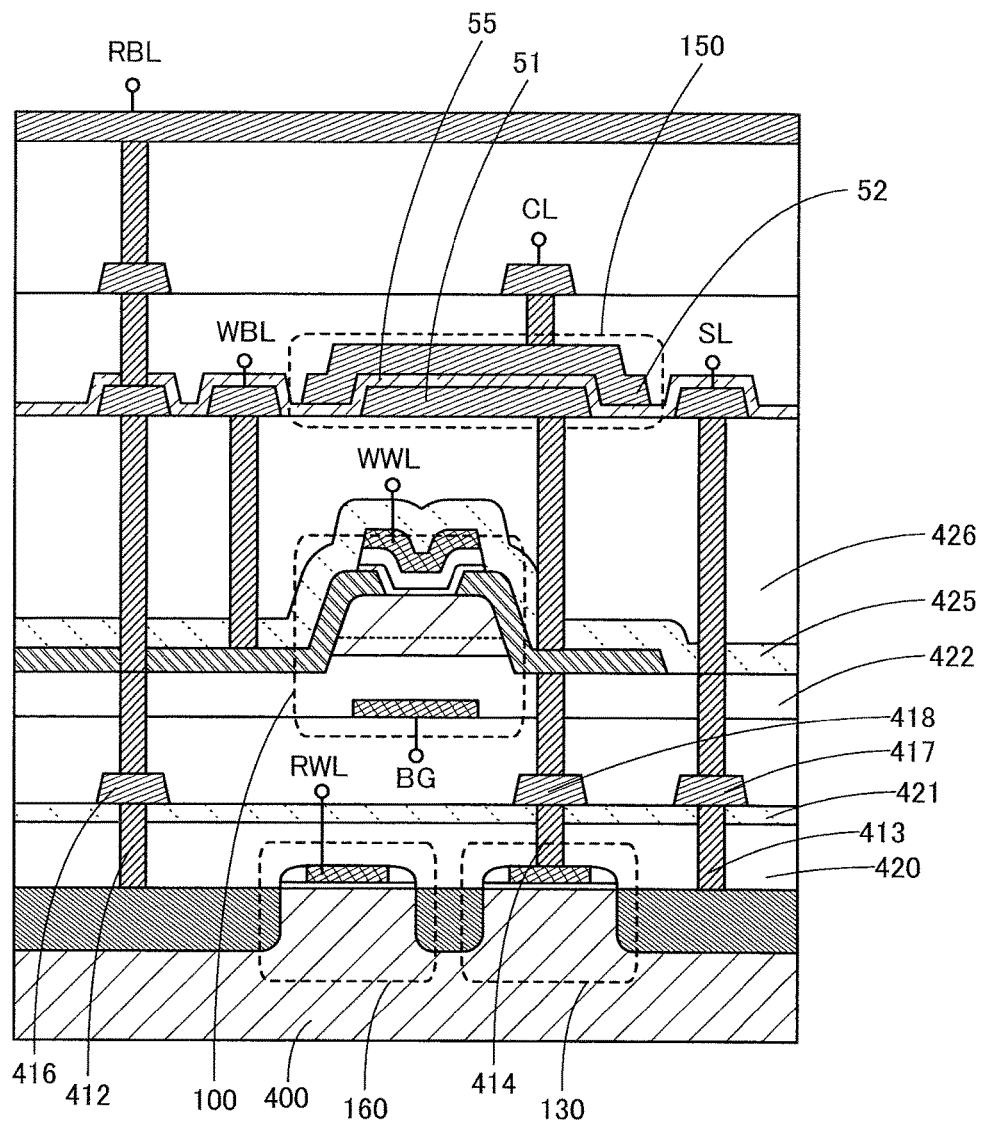
FIG. 14 is a cross-sectional view illustrating an embodiment of the present invention.

FIG. 14 illustrates a structure example of the memory element 50 in the circuit diagram in FIG. 7A. The memory element 50 in FIG. 14 includes an insulating film 420 over the transistor 130 and the transistor 160, an insulating film 421 over the insulating film 420, and conductive layers such as a conductive layer 417 over the insulating film 421. The transistor 100 is stacked over the transistor 130 and the transistor 160. The stacked structure enables a reduction in the circuit area of the memory element 50, that is, a reduction in the chip area of the semiconductor device, which leads to a size reduction. In addition, an insulating film 422 preferably functions to supply part of oxygen contained therein to an oxide semiconductor film of the transistor 100 by being heated. The insulating film 422 will be described later. The capacitor 150 is stacked over the transistor 100. The transistor 100 includes a pair of gate electrodes: a first gate electrode is connected to the terminal WWL, and a second gate electrode is connected to the terminal BG.

In FIG. 14, a gate electrode of the transistor 130 is connected to one of a source electrode and a drain electrode of the transistor 100 through a plug 414, a conductive layer 418, and the like, and the one of the source electrode and the drain electrode of the transistor 100 is connected to the electrode 51 of the capacitor 150 through a plug. Furthermore, the transistor 130 and the transistor 160 are formed in and on a substrate 400 and connected in series to each other.

Figure 16:
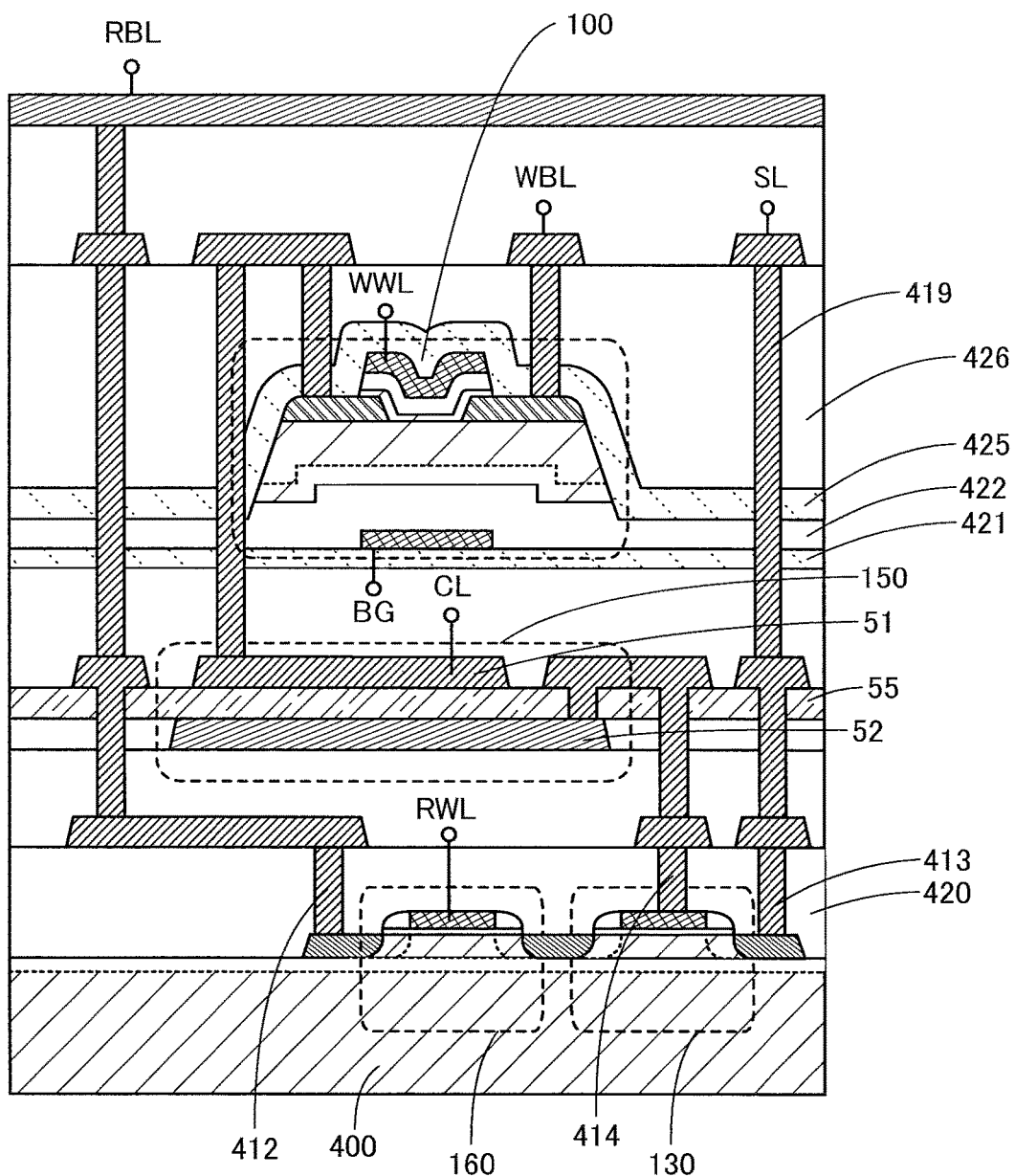
FIG. 16 is a cross-sectional view illustrating an embodiment of the present invention.
Figure 39:
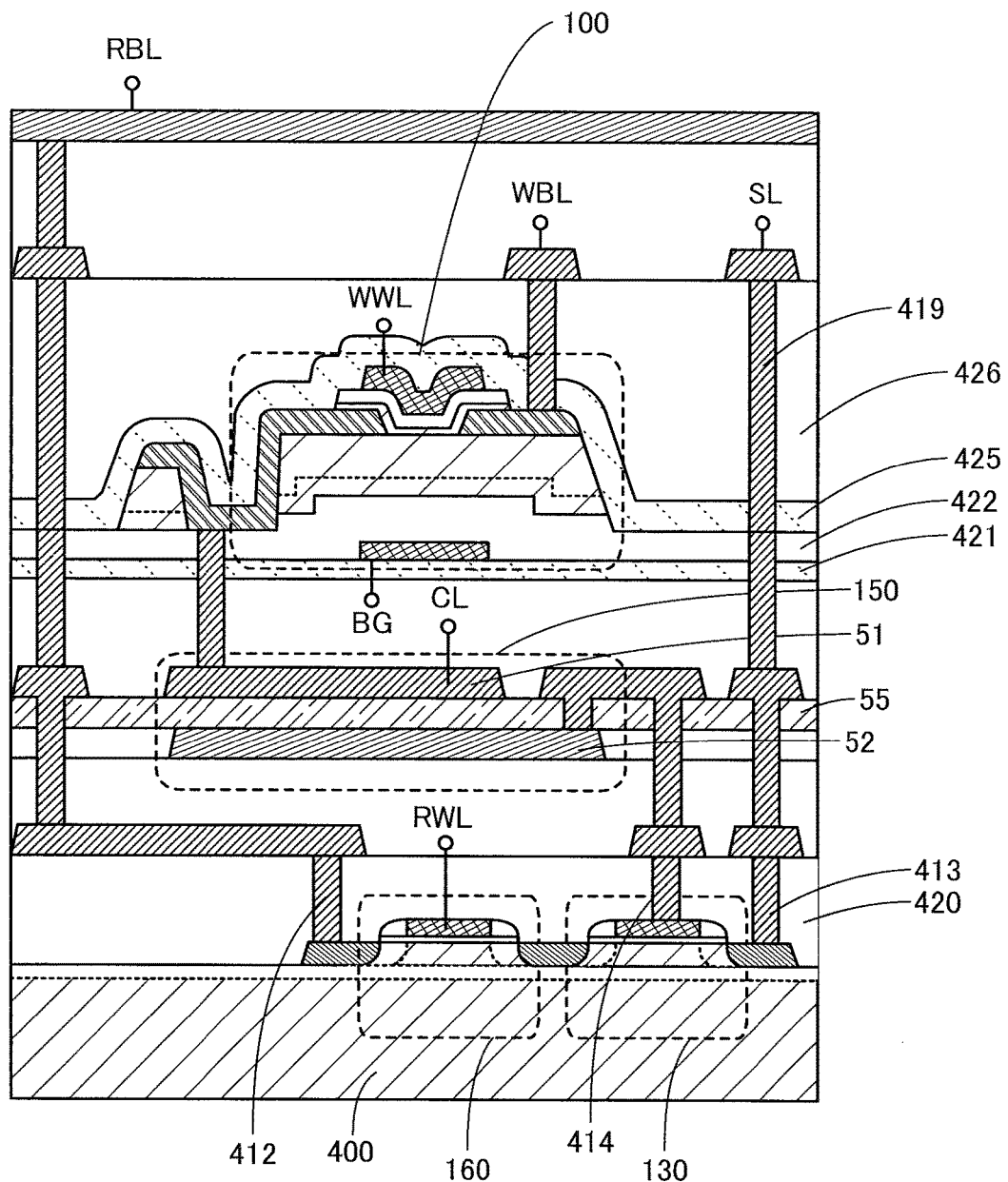
FIG. 39 is a cross-sectional view illustrating an embodiment of the present invention.

FIG. 14 illustrates an example in which the capacitor 150 is stacked over the transistor 100; as illustrated in FIG. 16, the capacitor 150 may be stacked over the transistor 130 and the transistor 160, and the transistor 100 may be stacked over the capacitor 150. FIG. 16 illustrates an example in which a silicon on insulator (SOI) substrate is used as the substrate 400. As illustrated in FIG. 39, one of a source electrode and a drain electrode of the transistor 100 may be connected to the electrode 51 through a plug embedded in an opening provided in the insulating film 421 and the like.

Figure 15:
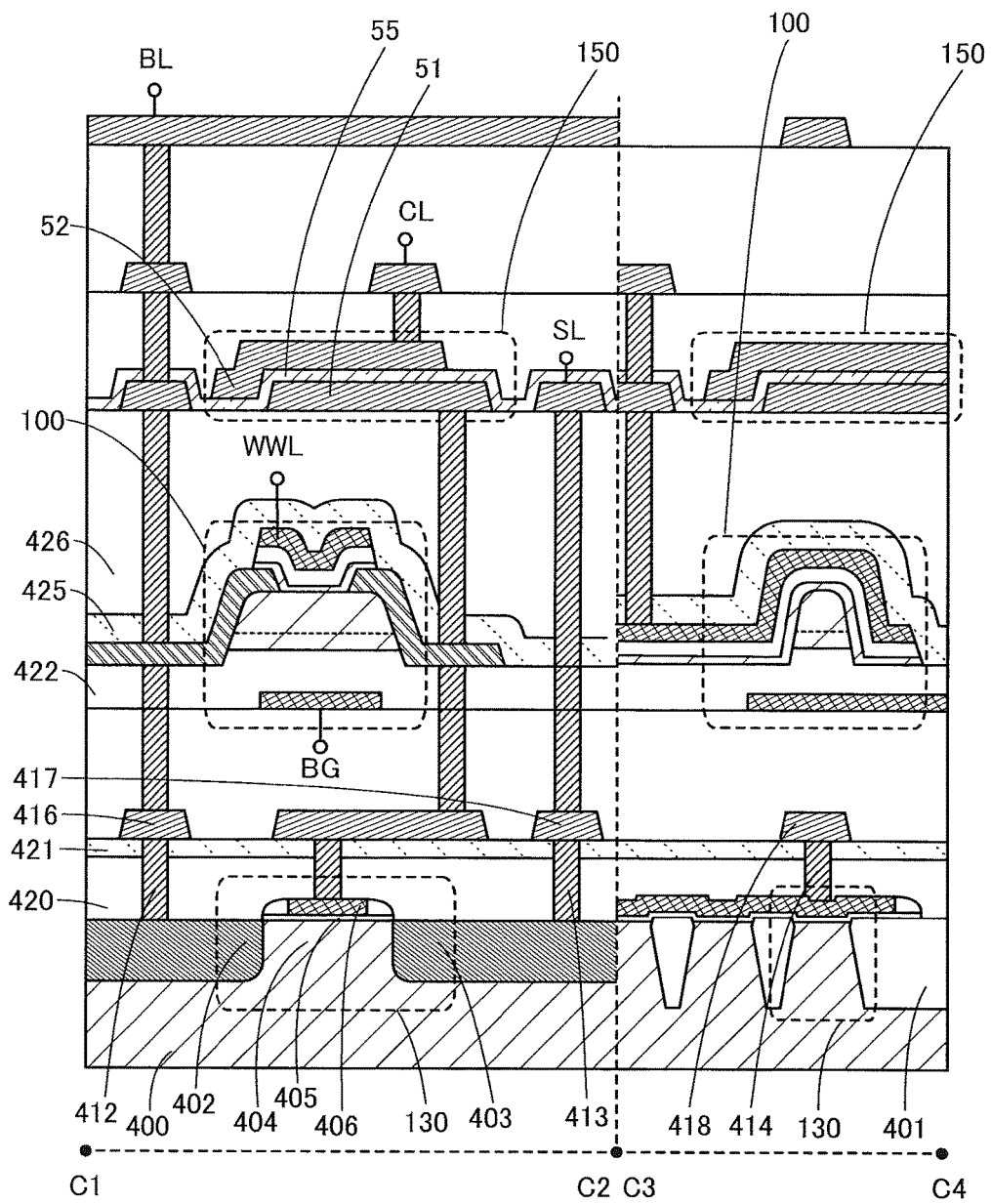
FIG. 15 is a cross-sectional view illustrating an embodiment of the present invention.

FIG. 15 illustrates a structure example of the memory element 50 in the circuit diagram in FIG. 7B. Within the range indicated by dashed line C1-C2, a cross section of the transistor 100 and the transistor 130 in the channel length direction is illustrated; within the range indicated by dashed line C3-C4, a cross section thereof in the channel width direction is illustrated. FIG. 15 is different from FIG. 14 in that the transistor 160 is not provided. The structure in FIG. 15 is preferable to that in FIG. 14 because a smaller number of transistors leads to a smaller area occupied by the circuit.

In FIG. 15, a gate electrode of the transistor 130 is connected to one of a source electrode and a drain electrode of the transistor 100 through the plug 414, the conductive layer 418, and the like, and the one of the source electrode and the drain electrode of the transistor 100 is connected to the electrode 51 of the capacitor 150 through a plug. One of a source electrode and a drain electrode of the transistor 130 is connected to the other of the source electrode and the drain electrode of the transistor 100 through a plug 412, a conductive layer 416, and the like.

Figure 17:
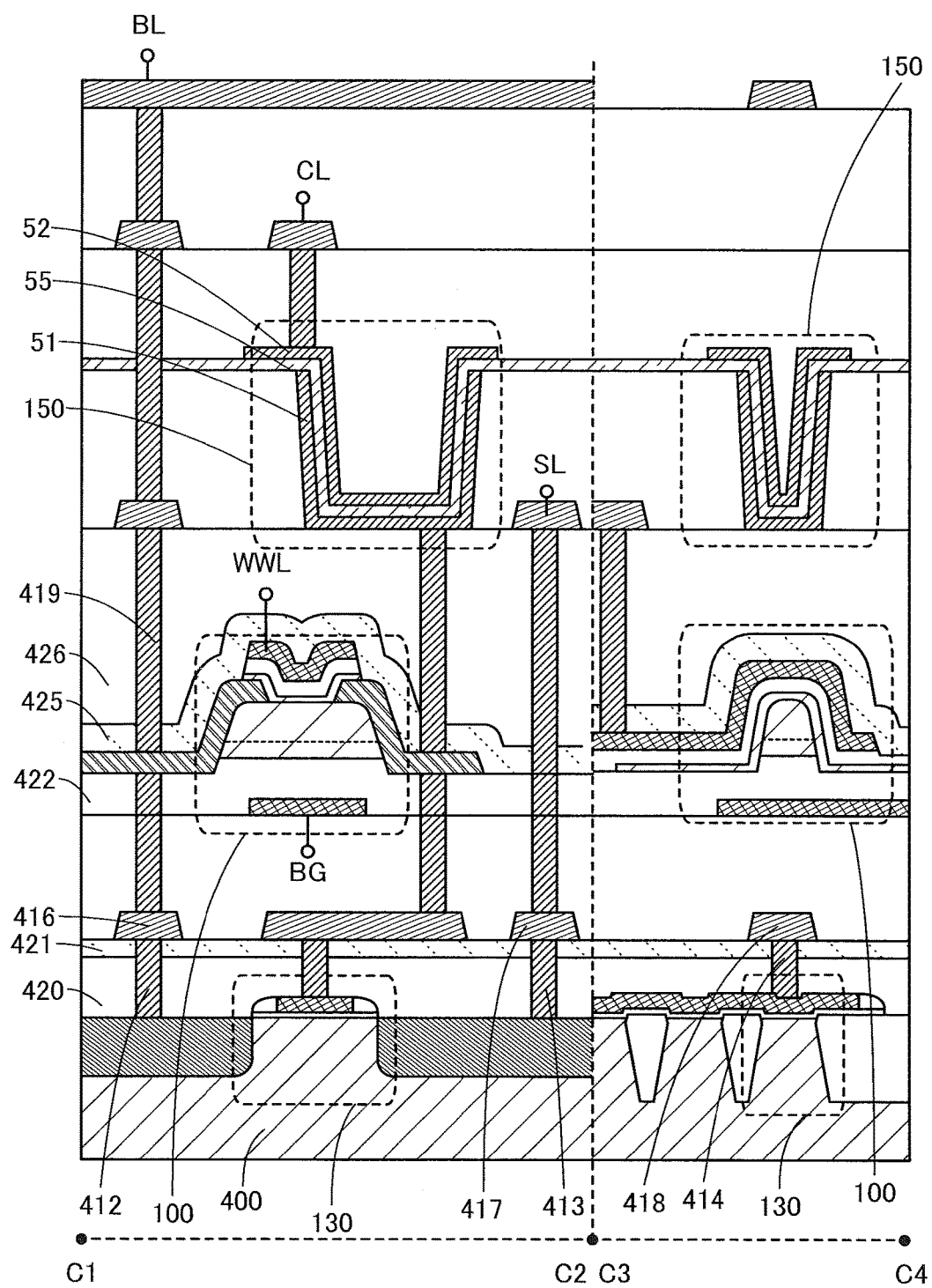
FIG. 17 is a cross-sectional view illustrating an embodiment of the present invention.

In the schematic cross-sectional view in FIG. 15, the capacitor 150 is formed by arranging conductive layers parallel to each other; alternatively, another structure may be employed. For example, as illustrated in FIG. 17, the capacitor may be formed by arranging conductive layers in a trench shape. With this structure, larger capacitance can be obtained without increasing the occupation area.

[Structure of Transistor]

Next, transistors which can be used as the transistor 130 and the transistor 160 in FIG. 14, FIG. 15, FIG. 16, and FIG. 17 will be described. The transistor 130 in FIG. 15 is described here as an example; the following description also applies to the transistor 130 and the transistor 160 in FIG. 14, FIG. 16, and FIG. 17.

The substrate 400 where the transistor 130 in FIG. 15 is formed can be, for example, a silicon substrate, a germanium substrate, or a silicon germanium substrate. For example, a single crystal silicon substrate may be used as the substrate 400. Alternatively, an SOI substrate may be used as the substrate 400.

The transistor 130 is electrically isolated by an element isolation method. As the element isolation method, a trench isolation method (shallow trench isolation (STI) method) or the like can be used. In FIG. 15, the transistor 130 is electrically isolated by a trench isolation method. Specifically, in FIG. 15, the transistor 130 is electrically isolated by element isolation using an element isolation region 401 formed in the following manner: an insulator containing silicon oxide or the like is buried in a trench formed in the substrate 400 by etching or the like, and then, the insulator is partly removed by etching or the like. In the transistor 130, an impurity region 402, an impurity region 403, and a channel formation region 404 positioned between the impurity region 402 and the impurity region 403 are provided. The transistor 130 includes an insulating film 405 which covers the channel formation region 404 and a gate electrode 406 which overlaps with the channel formation region 404 with the insulating film 405 positioned therebetween.

The insulating film 420 is provided over the transistor 130. Openings are formed in the insulating film 420. The plug 412 and a plug 413 which are electrically connected to the impurity region 402 and the impurity region 403, respectively, and the plug 414 which is electrically connected to the gate electrode 406 are formed in the openings.

The plug 412 is electrically connected to the conductive layer 416 formed over the insulating film 420. The plug 413 is electrically connected to the conductive layer 417 formed over the insulating film 420. The plug 414 is electrically connected to the conductive layer 418 formed over the insulating film 420.

Figure 18A:
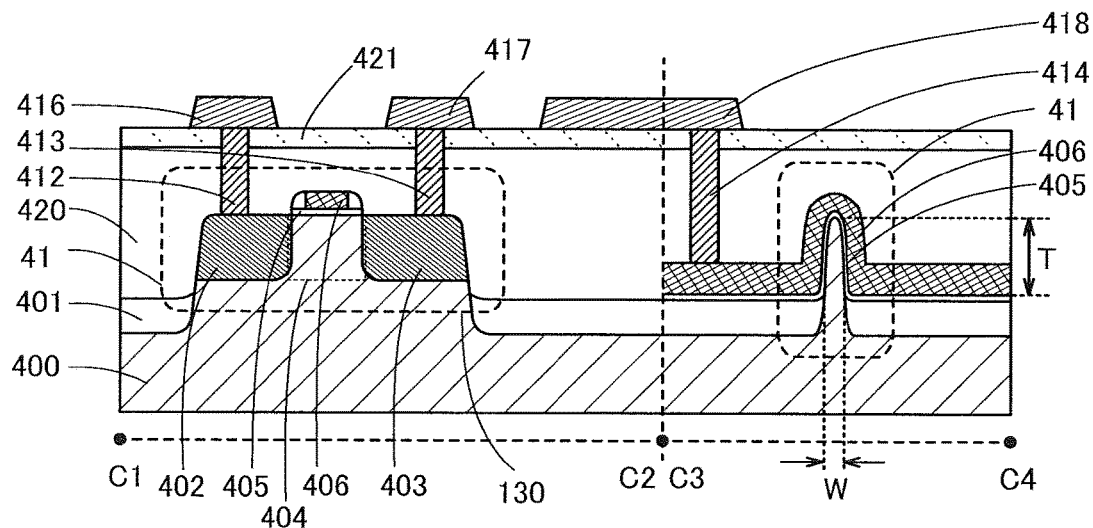
FIGS. 18A and 18B are each a cross-sectional view illustrating an embodiment of the present invention.

FIG. 18A illustrates an example of the transistor 130 with a structure different from that in FIG. 15. The transistor in FIG. 18A is also referred to as a FIN transistor because it utilizes a projection of the semiconductor substrate. In FIG. 18A, in a projection of the substrate 400 in a region other than the trench, the impurity region 402 and the impurity region 403 of the transistor 130 and the channel formation region 404 positioned between the impurity region 402 and the impurity region 403 are provided. The transistor 130 further includes the insulating film 405 which covers the channel formation region 404 and the gate electrode 406 which overlaps with the channel formation region 404 with the insulating film 405 positioned therebetween. A side portion and an upper portion of the projection in the channel formation region 404 overlap with the gate electrode 406 with the insulating film 405 positioned therebetween, so that carriers flow in a wide area including the side portion and the upper portion of the channel formation region 404. Thus, the number of transferred carriers in the transistor 130 can be increased while the area over the substrate occupied by the transistor 130 is reduced. As a result, the on-state current and field-effect mobility of the transistor 130 are increased. Suppose that the length of the projection in the channel formation region 404 in the channel width direction (channel width) is W and that the thickness of the projection in the channel formation region 404 is T. When the aspect ratio of the thickness T to the channel width W is high, in particular, a region in which carriers flow becomes larger. Thus, the on-state current and field-effect mobility of the transistor 130 can be further increased.

When the transistor 130 is formed using a bulk semiconductor substrate, the aspect ratio is preferably 0.5 or higher, further preferably 1 or higher.

Figure 18B:
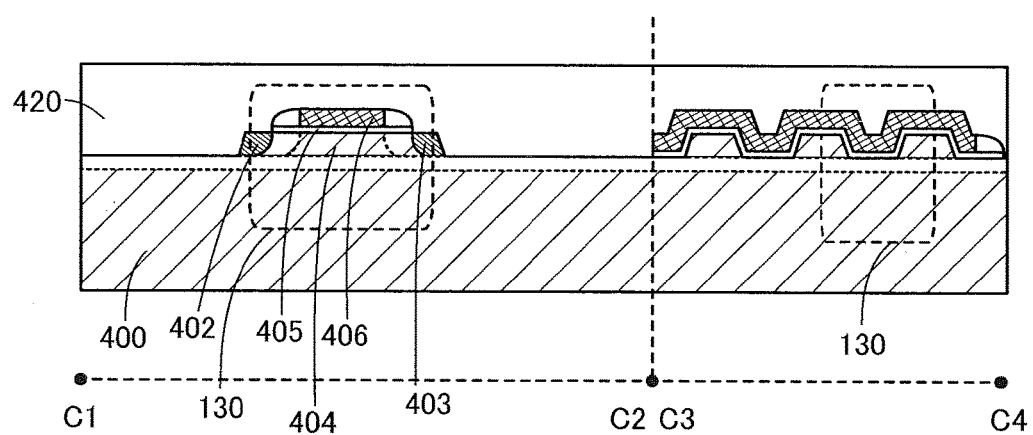

An SOI substrate may also be used as the substrate 400 as illustrated in FIG. 18B.

[Structure of OS Transistor]

Figure 19A:
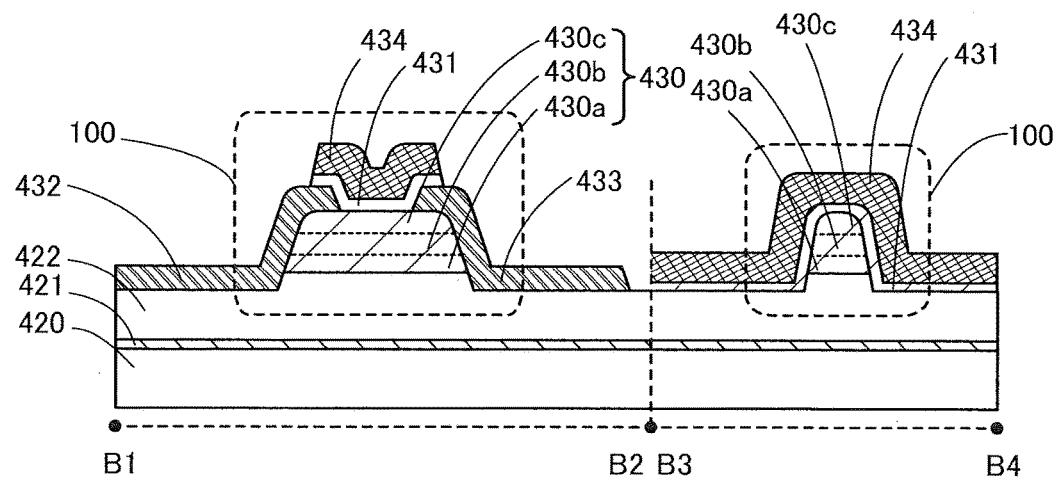
FIGS. 19A and 19B are each a cross-sectional view illustrating an embodiment of the present invention.
Figure 19B:
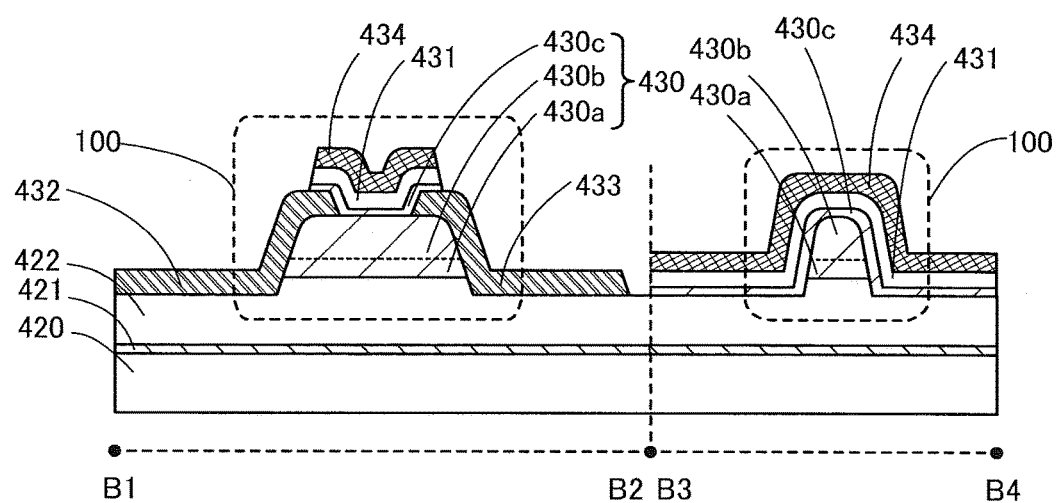

Next, a transistor which can be used as the transistor 100 in FIG. 14, FIG. 15, FIG. 16, and FIG. 17 will be described. The above-described OS transistor is preferably used as the transistor 100. FIGS. 19A and 19B illustrate structures which can be applied to the OS transistor.

In FIGS. 19A and 19B, the structure of the transistor 100 in the channel length direction is illustrated within the range indicated by dashed line B1-B2, and the structure of the transistor 100 in the channel width direction is illustrated within the range indicated by dashed line B3-B4.

As described with reference to FIG. 14, for example, the insulating film 421 having an effect of blocking diffusion of oxygen, hydrogen, and water is provided over the insulating film 420. As the insulating film 421 has higher density to be denser or has fewer dangling bonds to be more chemically stable, the insulating film 421 has a higher blocking effect. The insulating film 421 having an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

The insulating film 422 is provided over the insulating film 421, and the transistor 100 is provided over the insulating film 422.

The transistor 100 includes a semiconductor film 430 which is over the insulating film 422 and contains an oxide semiconductor, a conductive layer 432 and a conductive layer 433 which are electrically connected to the semiconductor film 430 and function as a source electrode and a drain electrode, a gate insulating film 431 which covers the semiconductor film 430, and a gate electrode 434 which overlaps with the semiconductor film 430 with the gate insulating film 431 positioned therebetween.

In FIG. 19A, the transistor 100 includes the gate electrode 434 on at least one side of the semiconductor film 430; alternatively, the transistor 100 may further include a gate electrode which overlaps with the semiconductor film 430 with the insulating film 422 positioned therebetween.

In the case where the transistor 100 includes a pair of gate electrodes, one of the gate electrodes may be supplied with a signal for controlling the on/off state, and the other gate electrode may be supplied with a potential from another wiring. In this case, the same potential may be supplied to the pair of gate electrodes, or a fixed potential such as a ground potential may be supplied to only the other gate electrode. By controlling the potential supplied to the other gate electrode, the threshold voltage of the transistor can be controlled.

In FIG. 19A, the transistor 100 has a single-gate structure in which one channel formation region corresponding to one gate electrode 434 is provided. However, the transistor 100 may have a multi-gate structure in which a plurality of electrically connected gate electrodes is provided so that a plurality of channel formation regions is included in one active layer.

FIG. 19A illustrates an example in which the semiconductor film 430 of the transistor 100 includes oxide semiconductor films 430a to 430c which are stacked in this order over the insulating film 422. In one embodiment of the present invention, the semiconductor film 430 of the transistor 100 may be a single-layer metal oxide film.

In the case where the oxide semiconductor film 430b is an In-M-Zn oxide film (M represents Ga, Y, Zr, La, Ce, or Nd) and a target with an atomic ratio of metal elements of In:M:Zn=$x_1$:$y_1$:$z_1$ is used for forming the oxide semiconductor film 430b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. When $z_1/y_1$ is greater than or equal to 1 and less than or equal to 6, a CAAC-OS film is easily formed as the oxide semiconductor film 430b. Typical examples of the atomic ratio of the metal elements of the target are In:M:Zn=1:1:1 and 3:1:2.

In the case where the oxide semiconductor films 430a and 430c are each an In-M-Zn oxide film (M represents Ga, Y, Zr, La, Ce, or Nd) and a target with an atomic ratio of metal elements of In:M:Zn=$x_2$:$y_2$:$z_2$ is used for forming the oxide semiconductor films 430a and 430c, $x_2/y_2$ is preferably smaller than $x_1/y_1$, and $z_2/y_2$ is preferably greater than or equal to ⅓ and less than or equal to 6, further preferably greater than or equal to 1 and less than or equal to 6. When $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, 1:3:4, and 1:3:6.

The insulating film 422 preferably functions to supply part of oxygen contained therein to the oxide semiconductor films 430a to 430c by being heated. The number of defects in the insulating film 422 is preferably small; typically, the spin density at g=2.001 due to a dangling bond of silicon is lower than or equal to $1 \times 10^{18}$ spins/cm$^3$. The spin density is measured by ESR spectroscopy.

The insulating film 422, which functions to supply part of oxygen contained therein to the oxide semiconductor films 430a to 430c by being heated, is preferably formed using an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma-enhanced chemical vapor deposition (PECVD) method, a sputtering method, or the like.

In this specification, an oxynitride contains more oxygen than nitrogen, and a nitride oxide contains more nitrogen than oxygen.

In the transistor 100 in FIG. 19A, the gate electrode 434 overlaps with end portions of the oxide semiconductor film 430b including a channel region which overlap with neither the conductive layer 432 nor the conductive layer 433, i.e., end portions of the oxide semiconductor film 430b which are in a region different from a region in which the conductive layers 432 and 433 are located. When the end portions of the oxide semiconductor film 430b are exposed to plasma during etching for forming the end portions, a chlorine radical, a fluorine radical, or the like generated from an etching gas is easily bonded to a metal element contained in the oxide semiconductor. For this reason, in the end portions of the oxide semiconductor film, oxygen bonded to the metal element is easily released, so that an oxygen vacancy is easily formed; thus, the end portions of the oxide semiconductor film easily have n-type conductivity. However, in the transistor 100 in FIG. 19A, the gate electrode 434 overlaps with the end portions of the oxide semiconductor film 430b which overlap with neither the conductive layer 432 nor the conductive layer 433; therefore, electric fields applied to the end portions can be controlled by the voltage of the gate electrode 434. Consequently, current that flows between the conductive layer 432 and the conductive layer 433 through the end portions of the oxide semiconductor film 430b can be controlled by the voltage applied to the gate electrode 434. Such a structure of the transistor 100 is referred to as a surrounded channel (s-channel) structure.

Specifically, when voltage at which the transistor 100 with the s-channel structure is turned off is applied to the gate electrode 434, the amount of off-state current that flows between the conductive layer 432 and the conductive layer 433 through the end portions can be reduced. Therefore, even when the distance between the conductive layer 432 and the conductive layer 433 at the end portions of the oxide semiconductor film 430b is reduced in the transistor 100 as a result of reducing the channel length to obtain high on-state current, the transistor 100 can have low off-state current. Consequently, the transistor 100 with a short channel length can have high on-state current in the on state and low off-state current in the off state.

Specifically, when voltage at which the transistor 100 with the s-channel structure is turned on is applied to the gate electrode 434, the amount of current that flows between the conductive layer 432 and the conductive layer 433 through the end portions can be increased. The current contributes to an increase in the field-effect mobility and an increase in the on-state current of the transistor 100. When the gate electrode 434 overlaps with the end portions of the oxide semiconductor film 430b, carriers flow in a wide region of the oxide semiconductor film 430b without being limited to a region in the vicinity of the interface of the oxide semiconductor film 430b close to the gate insulating film 431, which results in an increase in the number of carriers transferred in the transistor 100. As a result, the on-state current of the transistor 100 is increased, and the field-effect mobility is increased to 10 cm$^2$/V·s or higher or 20 cm$^2$/V·s or higher, for example. Note that here, the field-effect mobility is not an approximate value of the mobility as a physical property of the oxide semiconductor film but an apparent field-effect mobility in a saturation region of the transistor, which is an index of current drive capability.

Note that FIG. 19A illustrates the structure in which the semiconductor film 430 of the transistor 100 includes the oxide semiconductor films 430a to 430c stacked in this order. The semiconductor film 430 may also have a structure illustrated in FIG. 19B. As illustrated in FIG. 19B, the oxide semiconductor film 430c included in the semiconductor film 430 may be provided over the conductive layer 432 and the conductive layer 433 and overlap with the gate insulating film 431.

As described above, the transistor 100 is turned off after writing to the memory element 50 (e.g., in the circuit diagram in FIG. 6) is performed, so that charge accumulated in the capacitor 150 is held. In the transistor 100 in FIG. 19A or FIG. 19B, the conductive layer 432 and the conductive layer 433 each have a region which overlaps with the gate electrode 434 with the gate insulating film 431 positioned therebetween. Since such a region has capacitance, charge is accumulated in the region when writing to the memory element 50 is performed. Therefore, for example, in the case where traps exist in the gate insulating film 431 and at the interface between the gate insulating film 431 and the conductive layer 432 or the conductive layer 433, charge redistribution among the traps might occur in that region in the period in which the transistor 100 is turned off after the writing.

[Capacitor]

The dielectric of the capacitor 150 may be a single layer or a stacked layer formed using, for example, silicon oxide, silicon oxynitride, silicon nitride oxide, aluminum oxide, hafnium oxide, gallium oxide, a Ga—Zn-based metal oxide, or silicon nitride. It is also possible to use a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), or yttrium oxide. Alternatively, the dielectric can be formed using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like, a nitride insulating film of silicon nitride, silicon nitride oxide, aluminum nitride, aluminum nitride oxide, or the like, or a film in which any of the above materials are mixed.

In some cases, silicon oxide which contains nitrogen at a concentration higher than or equal to 1 atomic % (or higher than or equal to 1×10$^{20}$ atoms/cm$^3$) and lower than 20 atomic % is called silicon oxynitride. Silicon oxynitride contains more oxygen than nitrogen and preferably contains, for example, oxygen, nitrogen, silicon, and hydrogen in the ranges of 55 atomic % or higher and 65 atomic % or lower, 1 atomic % or higher and lower than 20 atomic %, 25 atomic % or higher and 35 atomic % or lower, and 0.1 atomic % or higher and 10 atomic % or lower, respectively. Silicon nitride oxide contains more nitrogen than oxygen and preferably contains, for example, oxygen, nitrogen, silicon, and hydrogen in the ranges of 15 atomic % or higher and lower than 30 atomic %, 20 atomic % or higher and 35 atomic % or lower, 25 atomic % or higher and 35 atomic % or lower, and 15 atomic % or higher and 25 atomic % or lower, respectively.

Conductive layers and electrodes included in the semiconductor device 500 can each be formed to have a single-layer or stacked structure including a metal such as aluminum, titanium, chromium, nickel, copper, yttrium, zirconium, molybdenum, silver, tantalum, tungsten, platinum, or ruthenium, or an alloy or a conductor containing the metal as its main component. For example, strontium ruthenium oxide may be used. Other examples are a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that a transparent conductive material containing indium oxide, tin oxide, or zinc oxide may be used.

The dielectric can be formed by a method in which an oxide is formed by thermally oxidizing a metal or a semiconductor, a thin film method, or the like. As the thin film method, for example, a sputtering method, a CVD method (including a thermal CVD method, an MOCVD method, a PECVD method, and the like), an MBE method, an ALD method, or a PLD method can be used.

The thin film method such as a sputtering method, a PECVD method, or an ALD method allows a film to be formed at relatively low temperatures, has high productivity because deposition over a large substrate is possible, and achieves low-cost production because the thin film method does not require high temperatures compared with thermal oxidation, an LPCVD method, and the like. However, the thin film method may easily cause a defect or the like serving as an origin of a trap. In the case where the dielectric of the capacitor 150 includes such a defect or the like, for example, the density of defects may tend to vary between a plurality of memory elements 50 included in the semiconductor device 500.

Embodiment 4

In this embodiment, application examples of the semiconductor device described in the above embodiment to an electronic component and to an electronic device including the electronic component will be described with reference to FIGS. 26A and 26B and FIGS. 27A to 27E.

Figure 26A:
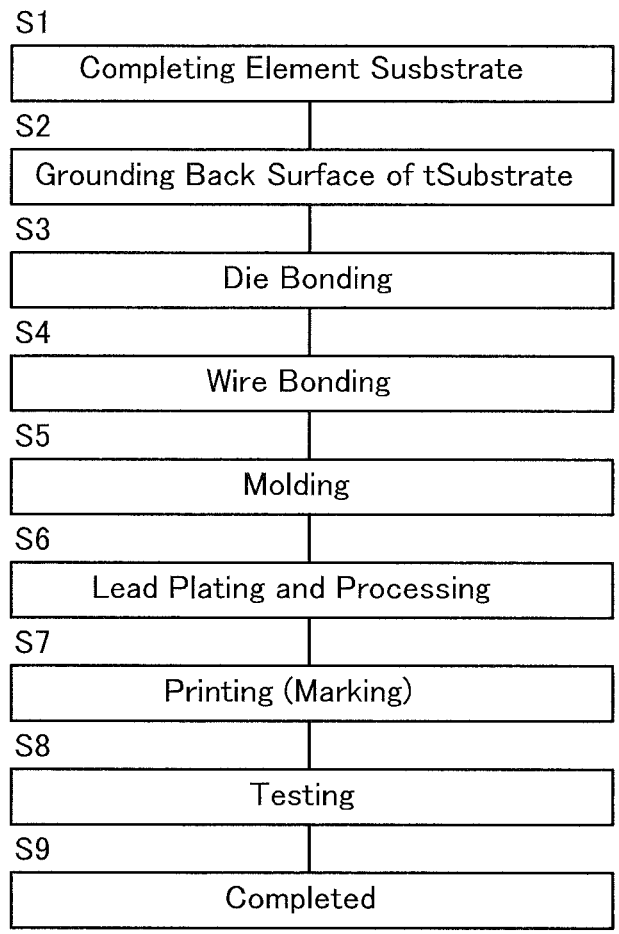
FIGS. 26A and 26B are a flow chart and a perspective view, respectively, which illustrate an embodiment of the present invention.

FIG. 26A shows an example in which the semiconductor device described in the above embodiment is used to manufacture an electronic component. Note that the electronic component is also referred to as a semiconductor package or an IC package. This electronic component has various standards and names depending on the direction and the shape of terminals. Therefore, an example of the electronic component will be described in this embodiment.

A semiconductor device including a transistor similar to any of the transistors illustrated in FIG. 14, FIG. 15, FIG. 16, FIG. 17, FIGS. 18A and 18B, and FIGS. 19A and 19B in Embodiment 3 is completed through an assembly process (post-process) of integrating detachable components on a printed board.

The post-process can be completed through the steps in FIG. 26A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component includes the semiconductor device described in the above embodiment. Thus, an electronic component with small size, large memory capacity, and high reliability can be obtained.

Figure 26B:
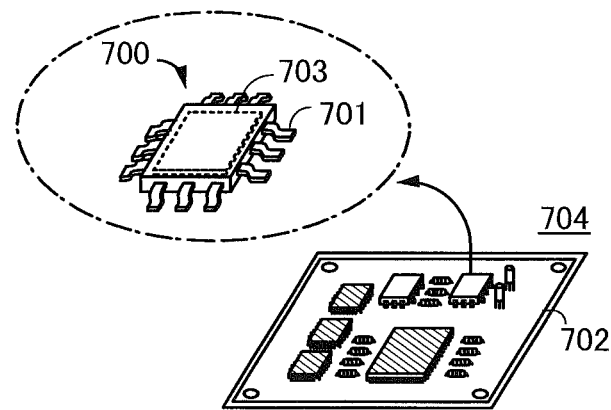

FIG. 26B is a perspective schematic diagram illustrating a quad flat package (QFP) as an example of the completed electronic component. An electronic component 700 in FIG. 26B includes a lead 701 and a circuit portion 703. The electronic component 700 in FIG. 26B is mounted on a printed board 702, for example. A plurality of electronic components 700 which are combined and electrically connected to each other over the printed board 702 can be mounted on an electronic device. A completed circuit board 704 is provided in an electronic device or the like.

Next, the description will be made on applications of the above-described electronic component to electronic devices such as a computer, a portable information terminal (including a mobile phone, a portable game machine, an audio reproducing device, and the like), electronic paper, a television device (also referred to as a television or a television receiver), and a digital video camera.

Figure 27A:
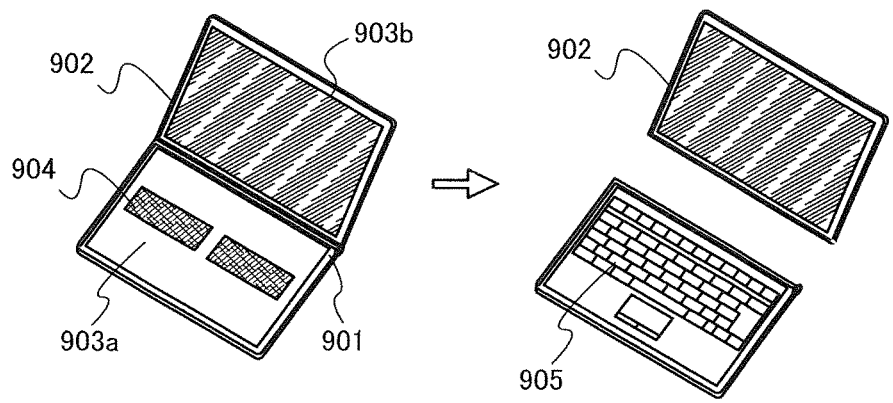
FIGS. 27A to 27E each illustrate an electronic device for which an embodiment of the present invention can be used.

FIG. 27A illustrates a portable information terminal which includes a housing 901, a housing 902, a first display portion 903a, a second display portion 903b, and the like. The semiconductor device described in the above embodiment is provided in at least one of the housings 901 and 902. Thus, a portable information terminal with small size, large memory capacity, and high reliability can be obtained.

Note that the first display portion 903a is a panel having a touch input function, and for example, as illustrated in the left of FIG. 27A, "touch input" or "keyboard input" can be selected by a selection button 904 displayed on the first display portion 903a. The selection button can be displayed in a variety of sizes; thus, the portable information terminal can be easily used by people of any generation. For example, when "keyboard input" is selected, a keyboard 905 is displayed on the first display portion 903a as illustrated in the right of FIG. 27A. With such a structure, for example, letters can be input quickly from the keyboard as in the case of using a conventional information terminal.

Furthermore, one of the first display portion 903a and the second display portion 903b can be detached from the portable information terminal as illustrated in the right of FIG. 27A. Providing the second display portion 903b with a touch input function makes the portable information terminal convenient to carry because the weight can be further reduced and the portable information terminal can be operated with one hand while the other hand supports the housing 902.

The portable information terminal in FIG. 27A can have a function of displaying a variety of information (e.g., a still image, a moving image, and a text image), a function of displaying a calendar, a date, the time, or the like on the display portion, a function of operating or editing information displayed on the display portion, a function of controlling processing by various kinds of software (programs), and the like. Furthermore, an external connection terminal (e.g., an earphone terminal or a USB terminal), a recording medium insertion portion, and the like may be provided on the back surface or the side surface of the housing.

The portable information terminal in FIG. 27A may transmit and receive data wirelessly. Through wireless communication, desired book data or the like can be purchased and downloaded from an e-book server.

Furthermore, the housing 902 in FIG. 27A may have an antenna, a microphone function, and a wireless communication function to be used as a mobile phone.

Figure 27B:
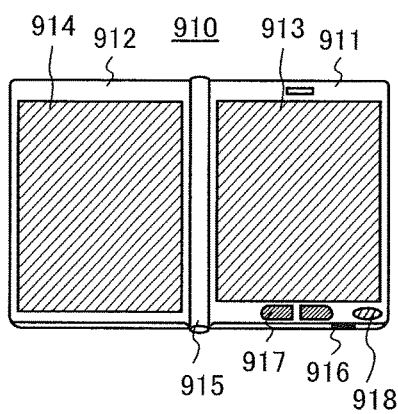

FIG. 27B illustrates an e-book reader 910 including electronic paper. The e-book reader 910 includes two housings 911 and 912. The housing 911 and the housing 912 are provided with a display portion 913 and a display portion 914, respectively. The housing 911 and the housing 912 are connected by a hinge 915 and can be opened or closed with the hinge 915 as an axis. The housing 911 is provided with a power switch 916, an operation key 917, a speaker 918, and the like. The semiconductor device described in the above embodiment is provided in at least one of the housings 911 and 912. Thus, an e-book reader with small size, large memory capacity, and high reliability can be obtained.

Figure 27C:
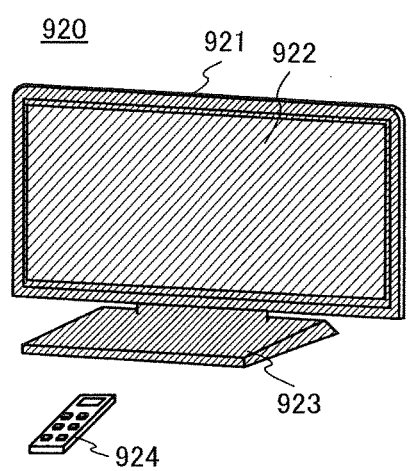

FIG. 27C illustrates a television device 920 which includes a housing 921, a display portion 922, a stand 923, and the like. The television device 920 can be operated with a switch of the housing 921 and a remote controller 924. The semiconductor device described in the above embodiment is provided in the housing 921 and the remote controller 924. Thus, a television device with small size, large memory capacity, and high reliability can be obtained.

Figure 27D:
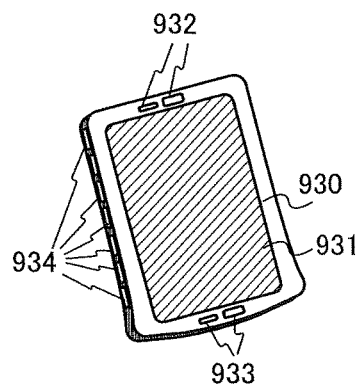

FIG. 27D illustrates a smartphone in which a main body 930 includes a display portion 931, a speaker 932, a microphone 933, an operation button 934, and the like. The semiconductor device described in the above embodiment is provided in the main body 930. Thus, a smartphone with small size, large memory capacity, and high reliability can be obtained.

Figure 27E:
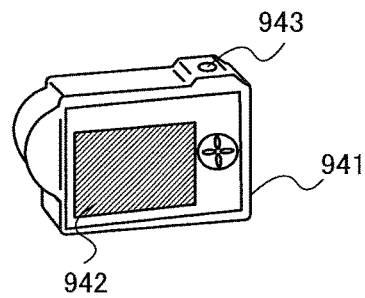

FIG. 27E illustrates a digital camera which includes a main body 941, a display portion 942, an operation switch 943, and the like. The semiconductor device described in the above embodiment is provided in the main body 941. Thus, a digital camera with small size, large memory capacity, and high reliability can be obtained.

As described above, the electronic devices described in this embodiment each include the semiconductor device of the above embodiment. Thus, electronic devices with small size, large memory capacity, and high reliability can be obtained.

(Notes on the Description in this Specification and the Like)

The following are notes on the description of the above embodiments and structures in the embodiments.

One embodiment of the present invention can be constituted by appropriately combining a structure described in an embodiment with a structure described in another embodiment. In addition, a plurality of structure examples described in one embodiment can be combined as appropriate.

Note that a content (or part of the content) described in an embodiment can be applied to, combined with, or replaced by a different content (or part of the different content) described in the embodiment and/or a content (or part of the content) described in another embodiment.

In each embodiment, a content described in the embodiment is a content described with reference to a variety of diagrams or a content described with text in the specification.

By combining a diagram (or part thereof) illustrated in one embodiment with another part of the diagram, a different diagram (or part thereof) illustrated in the embodiment, and/or a diagram (or part thereof) illustrated in another embodiment, much more diagrams can be created.

One embodiment of the present invention is not limited to the embodiments described in Embodiments 1 to 4. For example, in Embodiment 1, a structure in which an OS transistor is used as a transistor with low off-state current is described as one embodiment of the present invention; however, a transistor used in one embodiment of the present invention is not limited to an OS transistor as long as it has low off-state current. Accordingly, for example, a structure without an OS transistor may be one embodiment of the present invention under some circumstances.

<Notes on the Description of Drawings>

In this specification and the like, terms for explaining arrangement, such as "over" and "under," are used for convenience to describe the positional relation between components with reference to drawings. The positional relation between components is changed as appropriate in accordance with the direction in which the components are described. Therefore, terms for explaining arrangement are not limited to those used in the specification and can be appropriately reworded depending on the situation.

The term "over" or "under" does not necessarily mean that a component is placed directly above or directly below and directly in contact with another component. For example, the expression "an electrode B over an insulating layer A" does not necessarily mean that the electrode B is above and in direct contact with the insulating layer A and can mean the case where another component is provided between the insulating layer A and the electrode B.

In a block diagram in this specification and the like, components are classified into independent blocks in accordance with their functions. In an actual circuit or the like, however, it may be difficult to separate components in accordance with their functions; thus, one circuit may be associated with a plurality of functions or several circuits may be associated with one function. Therefore, the segmentation of blocks in a block diagram is not limited by components described in the specification and can be differently determined as appropriate depending on the situation.

In the drawings, the size, the layer thickness, or the region is determined arbitrarily for description convenience. Therefore, one embodiment of the present invention is not limited to such a scale. Note that the drawings are schematically illustrated for clarity, and shapes or values are not limited to those illustrated in the drawings. For example, the following can be included: variation in signal, voltage, or current due to noise or difference in timing.

In drawings such as a top view (also referred to as a plan view or a layout view) and a perspective view, some components are not illustrated for clarity of the drawings in some cases.

<Notes on Expressions that can be Rephrased>

In this specification and the like, the expressions "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit a function of a component.

For example, an "electrode" is used as part of a "wiring" in some cases, and vice versa. Furthermore, the term "electrode" or "wiring" can also mean a combination of a plurality of "electrodes" or "wirings."

In this specification and the like, "voltage" and "potential" can be replaced with each other as appropriate. The term "voltage" refers to a potential difference from a reference potential. When the reference potential corresponds to ground voltage, for example, the term "voltage" can be replaced with the term "potential." The ground voltage does not necessarily mean 0 V. Since a potential is a relative value, the voltage applied to a wiring or the like is changed depending on the reference potential in some cases.

In this specification and the like, the terms "film" and "layer" can be interchanged with each other depending on the situation or circumstances. For example, in some cases, the term "conductive film" can be used instead of the term "conductive layer," and the term "insulating layer" can be used instead of the term "insulating film."

<Notes on Definitions of Terms>

The following are definitions of the terms mentioned in the above embodiments.

<<Switch>>

In this specification and the like, a switch is conducting or not conducting (is turned on or off) to determine whether current flows therethrough or not. Alternatively, a switch has a function of selecting and changing a current path.

For example, an electrical switch, a mechanical switch, or the like can be used. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, the "on state" of the transistor refers to a state in which a source and a drain of the transistor are electrically short-circuited. The "off state" of the transistor refers to a state in which the source and the drain of the transistor are electrically disconnected. In the case where a transistor operates just as a switch, the polarity (conductivity type) of the transistor is not particularly limited to a certain type.

An example of the mechanical switch is a switch formed using a micro electro mechanical system (MEMS) technology, such as a digital micromirror device (DMD). Such a switch includes a mechanically movable electrode whose movement controls conduction and non-conduction of the switch.

<<Channel Length>>

The channel length in this specification and the like refers to, for example, in a top view of a transistor, the distance between a source and a drain in a region in which a semiconductor (or a portion of the semiconductor in which current flows when the transistor is in the on state) and a gate electrode overlap with each other or in a region in which a channel is formed.

The channel length of a transistor is not necessarily constant in all regions. In other words, the channel length of a transistor is not limited to one value in some cases. Therefore, in this specification, the channel length is any one value, the maximum value, the minimum value, or the average value in a region in which a channel is formed.

<<Channel Width>>

The channel width in this specification and the like refers to, for example, the length of a portion where a source and a drain face each other in a region in which a semiconductor (or a portion of the semiconductor in which current flows when a transistor is in the on state) and a gate electrode overlap with each other or in a region in which a channel is formed.

The channel width of a transistor is not necessarily constant in all regions. In other words, the channel width of a transistor is not limited to one value in some cases. Therefore, in this specification, the channel width is any one value, the maximum value, the minimum value, or the average value in a region in which a channel is formed.

Depending on the transistor structure, the channel width in a region in which a channel is actually formed (hereinafter referred to as an effective channel width) is different from the channel width shown in a top view of the transistor (hereinafter referred to as an apparent channel width) in some cases. For example, in a transistor with a three-dimensional structure, the effective channel width is larger than the apparent channel width shown in a top view of the transistor, and an influence of the effective channel width cannot be ignored in some cases. For example, in a miniaturized transistor with a three-dimensional structure, the proportion of a channel region formed on a side surface of a semiconductor is high in some cases. In this case, the effective channel width, that is, the width of an actually formed channel is larger than the apparent channel width shown in a top view.

In some cases, the effective channel width of a transistor with a three-dimensional structure is difficult to estimate on the basis of measurement. For example, estimation of the effective channel width from a design value requires an assumption that the shape of a semiconductor is known. Therefore, in the case where the shape of the semiconductor is uncertain, it is difficult to measure the effective channel width accurately.

Therefore, in this specification, in a top view of a transistor, an apparent channel width that is the length of a portion where a source and a drain face each other in a region in which a semiconductor and a gate electrode overlap with each other may be referred to as a surrounded channel width (SCW). In this specification, the simple term "channel width" may denote the surrounded channel width or the apparent channel width. Alternatively, in this specification, the simple term "channel width" may denote the effective channel width. Note that the values of the channel length, the channel width, the effective channel width, the apparent channel width, the surrounded channel width, and the like can be determined by obtaining and analyzing a cross-sectional TEM image or the like.

Note that the surrounded channel width may be used to calculate the field-effect mobility, the current value per channel width, and the like of a transistor. In this case, the values may be different from those calculated using the effective channel width.

<<Connection>>

In this specification and the like, the expression "A and B are connected" means the case where A and B are electrically connected to each other in addition to the case where A and B are directly connected to each other. Here, the expression "A and B are electrically connected" indicates that electric signals can be transmitted and received between A and B when an object having any electrical function exists between A and B.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expression include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order." When the connection order in a circuit configuration is defined by an expression similar to these examples, a source (or a first terminal or the like) and a drain (or a second terminal or the like) of a transistor can be distinguished from each other to specify the technical scope.

Other examples of the expression include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X through at least Z1 on a first connection path, the first connection path does not include a second connection path, the second connection path includes a connection path on which the transistor is provided, a drain (or a second terminal or the like) of the transistor is electrically connected to Y at least through Z2 on a third connection path, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor." When the connection path in a circuit configuration is defined by an expression similar to these examples, a source (or a first terminal or the like) and a drain (or a second terminal or the like) of a transistor can be distinguished from each other to specify the technical scope.

Note that one embodiment of the present invention is not limited to these expressions which are just examples. Here, X, Y, Z1, and Z2 each denote an object (e.g., a device, an element, a circuit, a wiring, an electrode, a terminal, a conductive layer, or a layer).

Example 1

In this example, results of evaluating the write characteristics of a memory element included in a semiconductor device of one embodiment of the present invention will be shown.

[Structure of Semiconductor Device]

The semiconductor device 500 in FIG. 20 can be referred to for the evaluated semiconductor device. In the evaluated semiconductor device 500, as in an example shown in FIG. 39, a capacitor was stacked over a tier including the transistor 130 and the transistor 160, and the transistor 100 was provided over a tier including the capacitor. As the transistor 130 and the transistor 160, transistors formed using an SOI substrate were used.

<Transistor 100>

Next, the structure and fabrication conditions of the transistor 100 included in the semiconductor device 500 will be described. The channel length L and the channel width of the transistor 100 were each 0.35 µm.

The oxide semiconductor films 430*a*, 430*b*, and 430*c* were deposited by a sputtering method. In—Ga—Zn-based oxide films were formed as the oxide semiconductor films 430*a* and 430*b*. A target with an atomic ratio of In:Ga:Zn=1:3:4 was used for the oxide semiconductor film 430*a*, and a target with an atomic ratio of In:Ga:Zn=1:1:1 was used for the oxide semiconductor film 430*b*. As the oxide semiconductor film 430*c*, an In—Ga—Zn-based oxide film was formed using a target with an atomic ratio of In:Ga:Zn=1:3:2. The thickness of the oxide semiconductor film 430*a* was 40 nm, that of the oxide semiconductor film 430*b* was 20 nm, and that of the oxide semiconductor film 430*c* was 5 nm.

A 10-nm-thick silicon oxynitride film was deposited as the gate insulating film 431. The silicon oxynitride film was deposited by a PECVD method under conditions where the substrate temperature was 350° C. and the gas flow rate of $SiH_4$ and that of $N_2O$ were 1 sccm and 800 sccm, respectively. The gate electrode 434 was formed in such a manner that tungsten was deposited over 30-nm-thick titanium nitride by a sputtering method. As the conductive layer 432 and the conductive layer 433, tungsten was deposited by a sputtering method.

<Capacitor 150>

Next, the capacitor 150 included in the semiconductor device 500 will be described. A dielectric 55 of the capacitor 150 was formed in the following manner: an aluminum oxide film was deposited to a thickness of approximately 20 nm by a sputtering method, and a silicon oxynitride film was deposited thereover to a thickness of 10 nm. The silicon oxynitride film was deposited under the same conditions as the gate insulating film 431. Tungsten was used for the electrode 51 and the electrode 52. The electrode area of the capacitor 150 was 10.77 µm$^2$, and the target capacitance of the capacitor 150 was 20 fF.

<Transistor 130 and Transistor 160>

Next, the transistor 130 and the transistor 160 which are included in the semiconductor device 500 will be described.

As the insulating film 405 serving as a gate insulating film, a 10-nm-thick silicon oxide film was formed by thermal oxidation. The channel length L and the channel width of each of the transistors 130 and 160 were 0.35 μm and 1.1 μm, respectively.

[Conditions for Writing and Reading]

Figure 21:
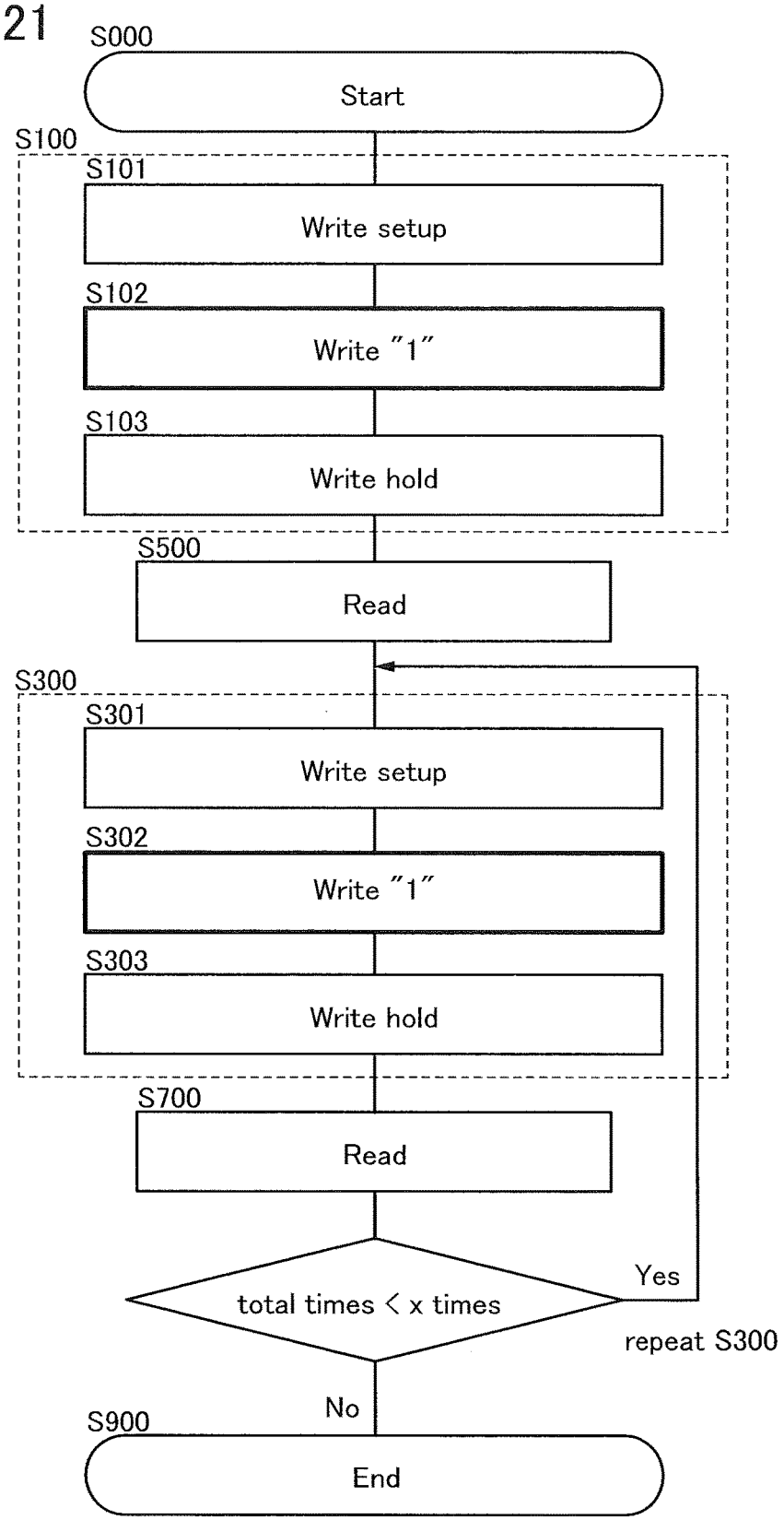
FIG. 21 is a flow chart illustrating an embodiment of the present invention.
Figure 25:
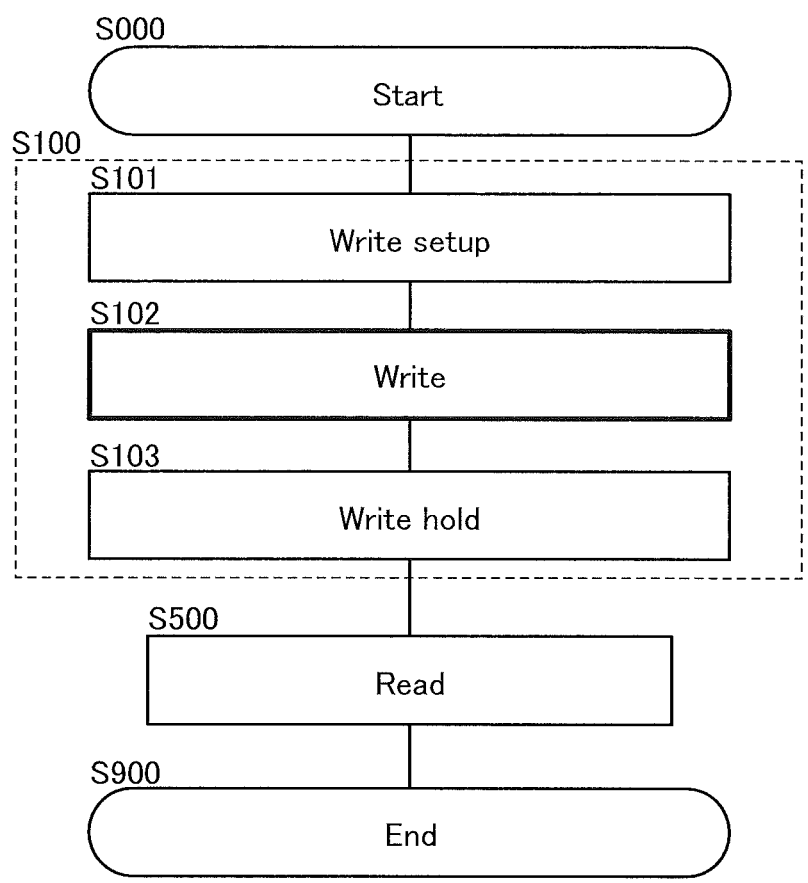
FIG. 25 is a flow chart illustrating an example.

Writing was performed according to the flow chart in FIG. 21. Writing of a comparative example was performed according to the flow chart in FIG. 25. Note that Step S500 in FIG. 21 includes Step S501 to Step S503 in FIG. 23A; and Step S700, Step S701 to Step S703.

Figure 22:
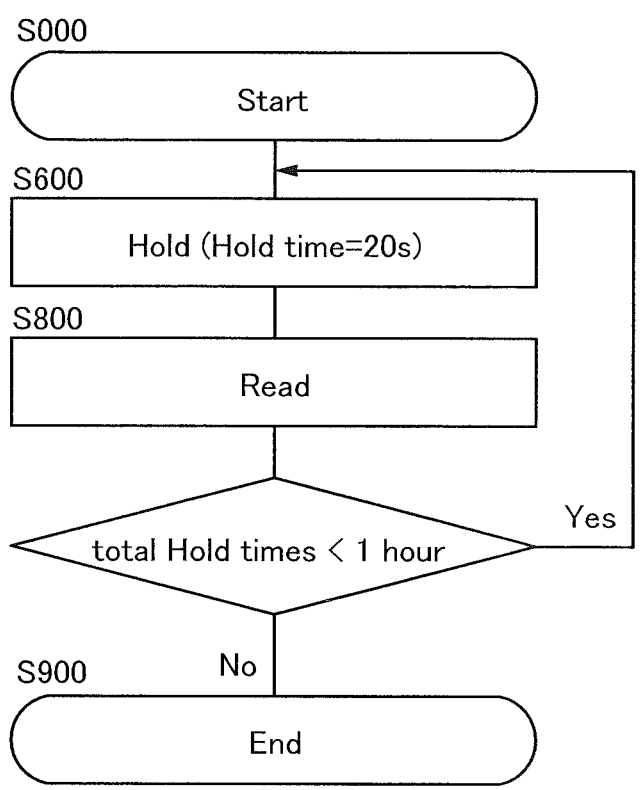
FIG. 22 is a flow chart illustrating an embodiment of the present invention.

A change in data written to the memory element 50 with time was measured according to the flow chart in FIG. 22. Note that Step S800 in FIG. 22 includes Steps S801 to S804 in FIG. 23B. As described below, the potential of the floating node FN can be read out through Steps S801 to S804 in which the potential input to the terminal SL is gradually changed.

First, in Step S801, a predetermined potential (here, [2.6−{(0.02×(n−1)}][V]; n=the number of times) is input to the terminal SL. Then, reading is performed in Step S802. Next, Step S803 corresponding to a read hold period is performed. Note that the on/off state of the transistor 130 is determined by the potential of the floating node FN. In the on state, the signal L is output from the terminal OUT; and in the off state, the signal H.

Next, Steps S801 to S803 are repeated until the potential of the terminal SL becomes 0 V or lower. At this time, the voltage of the terminal SL at which the transistor 130 is turned on ($V_{SL1}$) is obtained from the relation between the input value of the terminal SL and the output value of the terminal OUT.

Figure 24A:
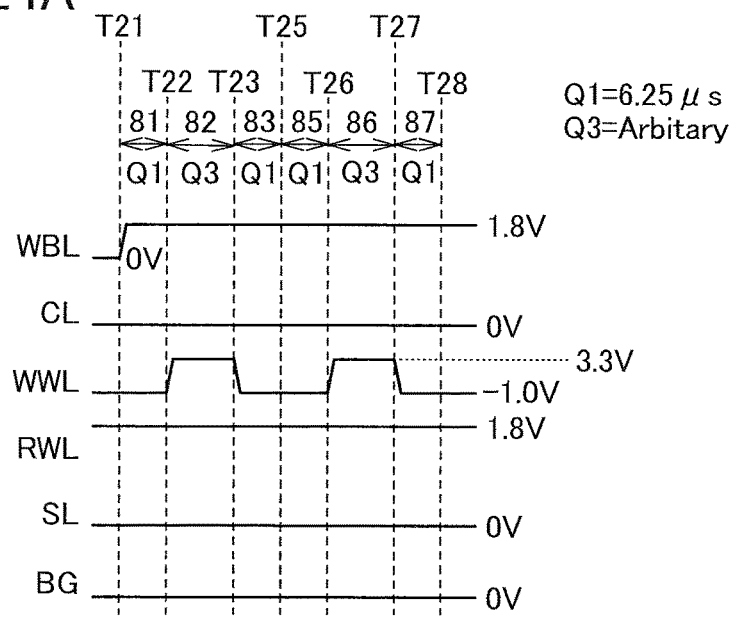
FIGS. 24A and 24B are each a timing chart illustrating an embodiment of the present invention.
Figure 24B:
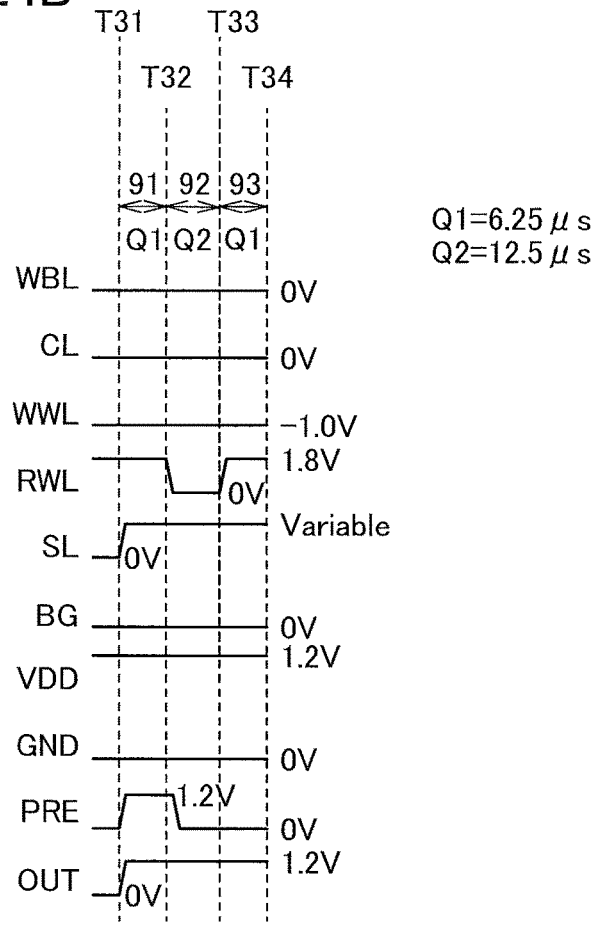

A timing chart for writing is shown in FIG. 24A, which illustrates the case where data "1" is written as one of binary data. Periods 81, 82, 83, 85, 86, and 87 correspond to Steps S101, S102, S103, S301, S302, and S303, respectively. A timing chart for reading is shown in FIG. 24B. Periods 91, 92, and 93 correspond to Steps S501 (or S701), S502 (or S702), and S503 (or S703), respectively. The numerical values in the timing charts represent the potentials input to the terminals. In FIG. 24B, "Variable" in the timing chart of the terminal SL means that a potential obtained on the basis of the above formula is input at the time of the reading. The operation in the timing chart in FIG. 8A and that in FIG. 9A may be referred to for FIG. 24A and FIG. 24B, respectively. The time (Q1) of each of Periods 81, 83, 85, 87, 91, and 93 is 6.25 μs, and the time (Q2) of Period 92 is 12.5 μs. The time (Q3) of each of Periods 82 and 86 may be a given value. In this example, Q3 is 237.5 μm.

[Measurement]

First of all, writing to the memory element 50 included in the semiconductor device 500 was performed. The test temperature was 150° C. First, Comparative Condition A will be described. According to the flow chart in FIG. 25, the data "1" was written in Step S100, and then, reading was performed in Step S500 (Comparative Processing A1). Subsequently, reading was performed in Step S800 (Comparative Processing A2) to determine $V_{SL1}$ under Comparative Condition A. After that, data "0" was written according to the flow chart in FIG. 25.

Next, Condition B will be described. Processing in the flow chart in FIG. 21 was performed on the same memory element 50. This processing is referred to as Processing B1. First, writing was performed in Step S100, and then, reading was performed in Step S500. Subsequently, writing of the data "1" in Step S300 and reading in Step S700 were performed in this order under the condition where x was 1.

After that, reading was performed in Step S800 to determine $V_{SL1}$ under Condition B. Next, a change in the data written to the memory element 50 with time was measured by the processing in the flow chart in FIG. 22. This processing is referred to as Processing B2. The flow chart in FIG. 22 will be described. First, the processing starts. Then, holding is performed for 20 seconds in Step S600. Next, reading is performed in Step S800. Subsequently, Steps S600 and S800 are repeated, and the processing is finished if the total hold time ($t_s$) in Step S600 exceeds 1 hour. After the processing in FIG. 22 was finished, the data "0" was written according to the flow chart in FIG. 25.

Figure 23B:
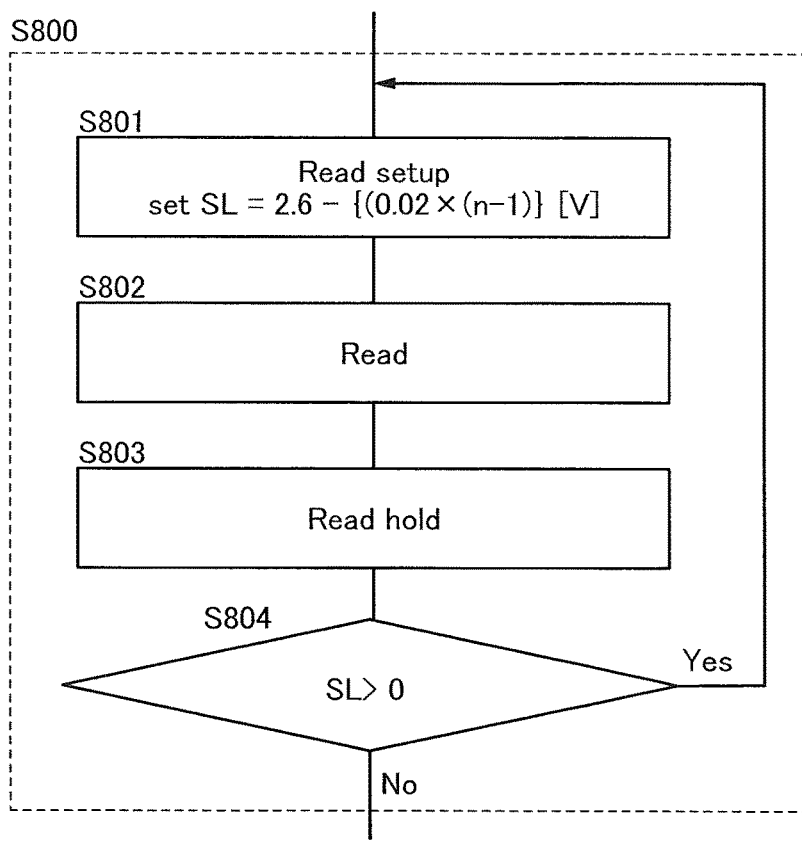

Condition C is the same as Condition B except that x is 2: the data "1" was written and read out according to FIG. 21 (Processing C1), and reading was performed according to FIG. 22 and FIG. 23B (Processing C2). Then, the data "0" was written according to FIG. 25. Condition D is the same as Condition B except that x is 3: the data "1" was written and read out according to FIG. 21 (Processing D1), and reading was performed according to FIG. 22 and FIG. 23B (Processing D2). Then, the data "0" was written according to FIG. 25.

Under Conditions B, C, and D, the time from the end of Step S102 to the beginning of Step S302 in FIG. 21 was 6.25+25+6.25=37.5 [μs].

Figure 28A:
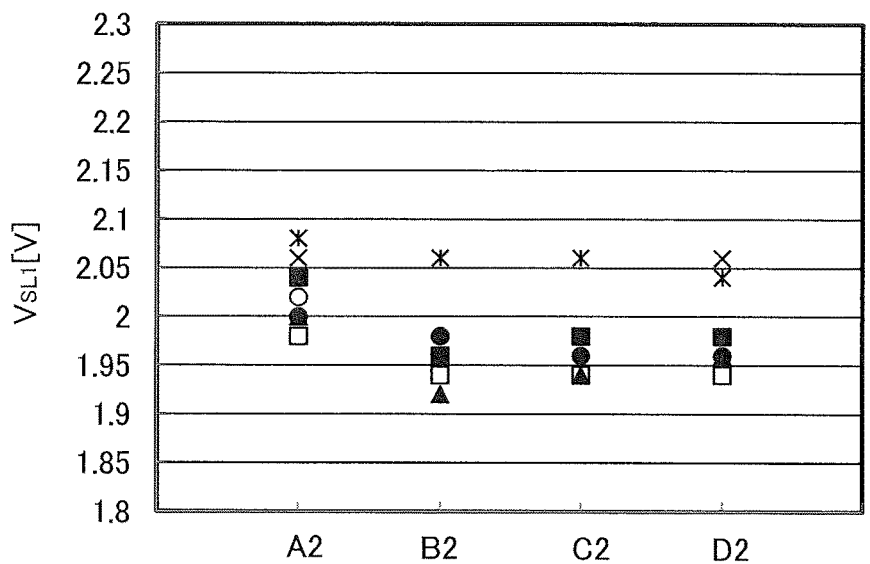
FIGS. 28A and 28B show measurement results for memory elements.
Figure 28B:
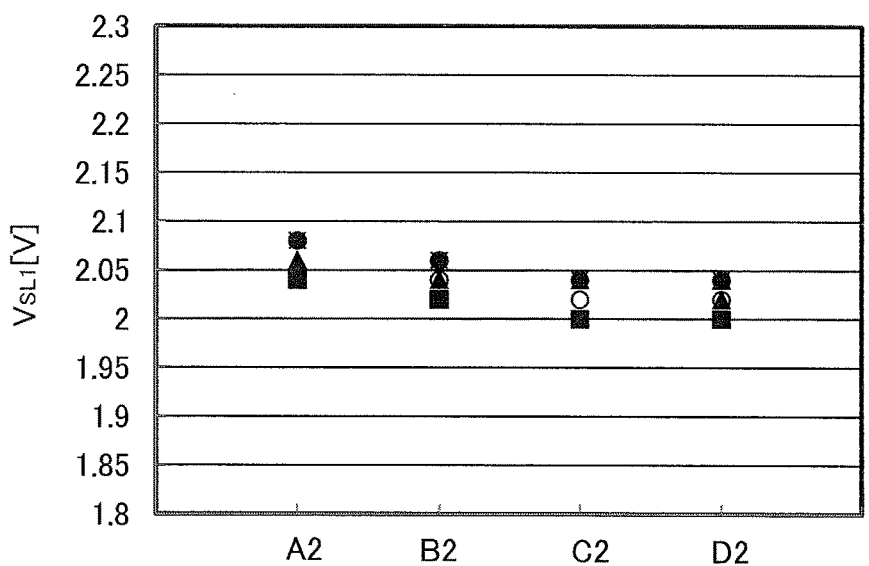
Figure 29A:
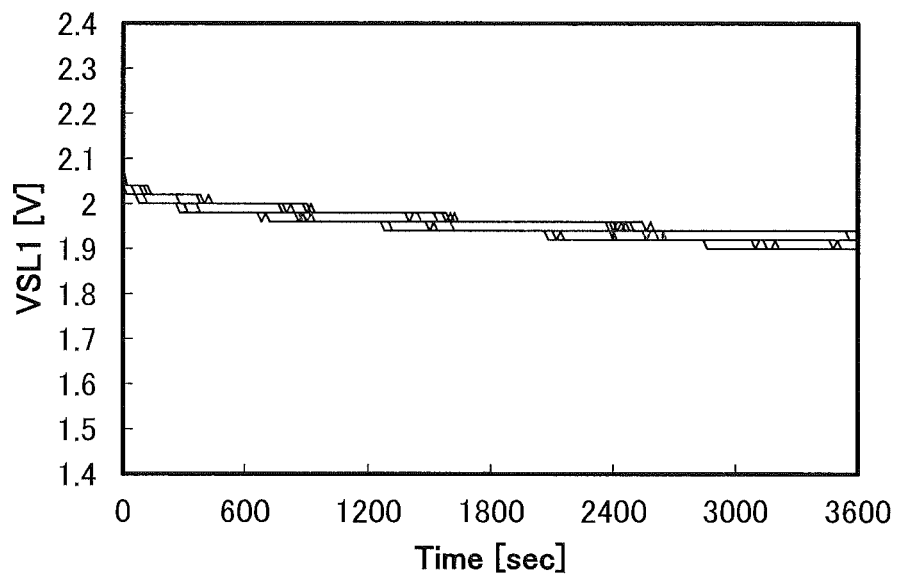
FIGS. 29A and 29B show data holding characteristics of memory elements.
Figure 29B:
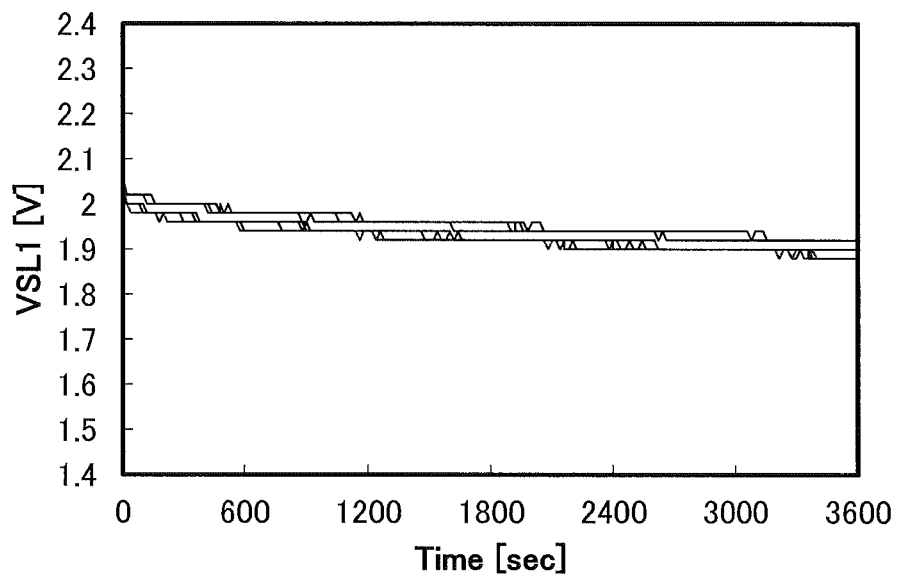
Figure 30A:
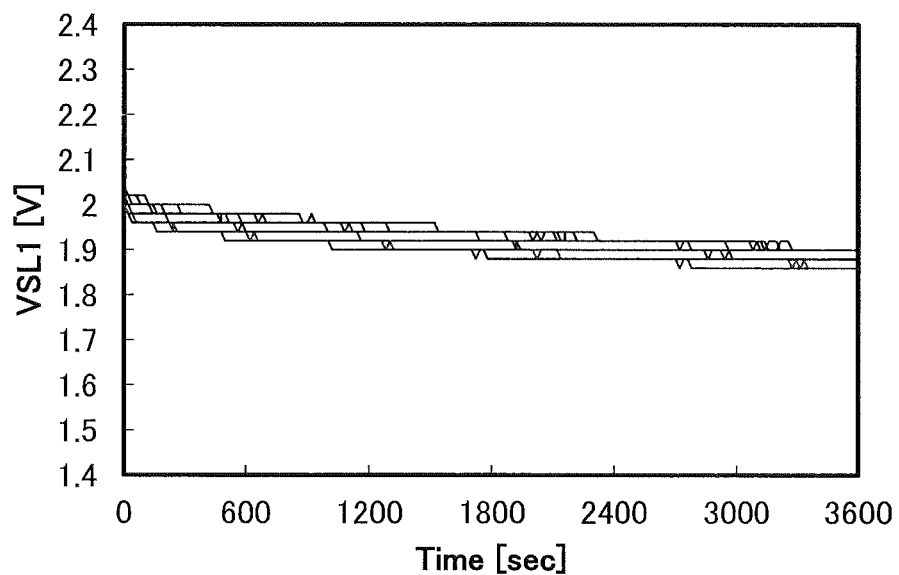
FIGS. 30A and 30B show data holding characteristics of memory elements.
Figure 30B:
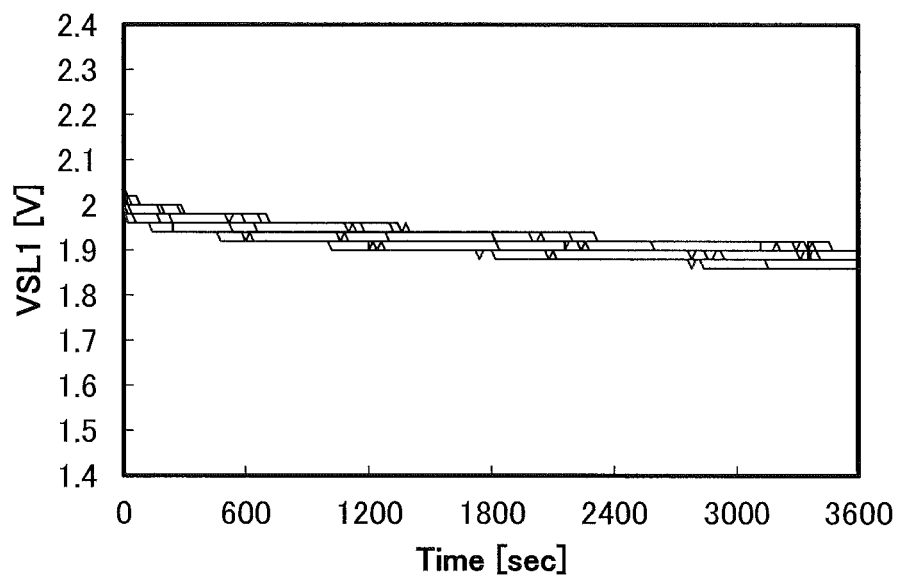
Figure 31:
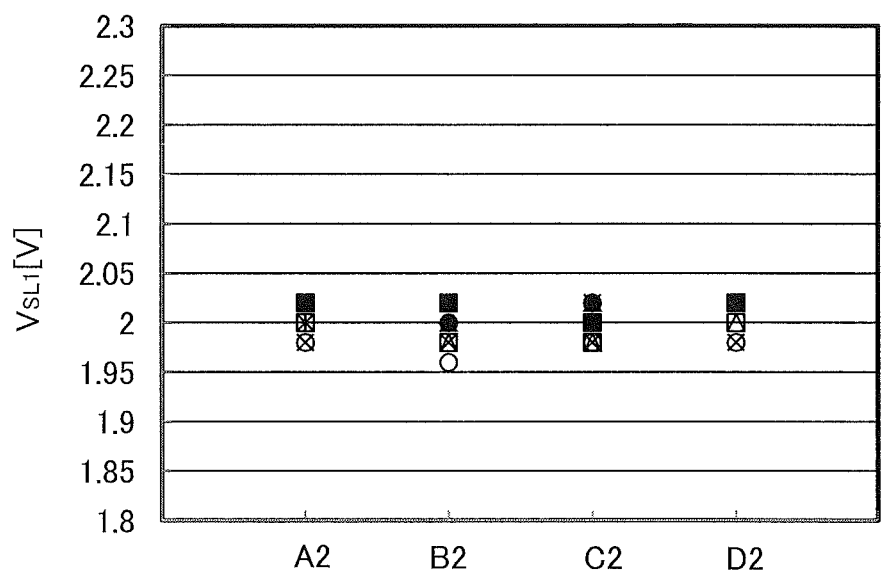
FIG. 31 shows measurement results for memory elements.
Figure 32:
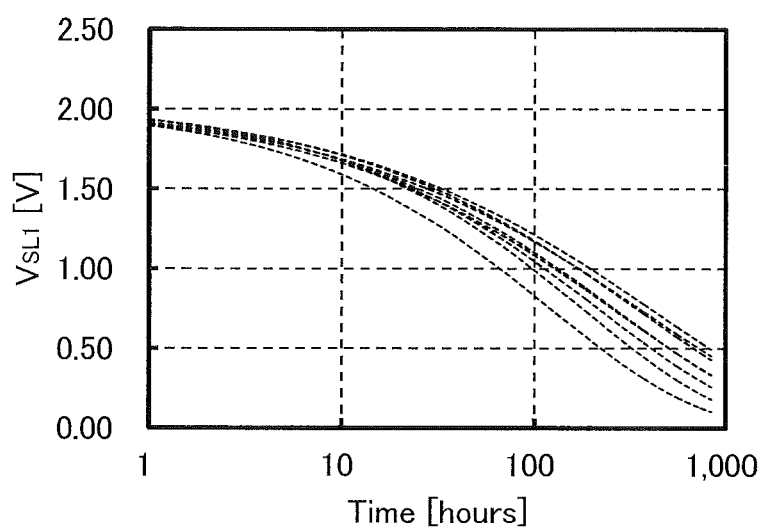
FIG. 32 shows curves extrapolated from data holding characteristics of memory elements.

A 5-inch-square sample plane includes n 20-mm-square areas (Area 1, Area 2, . . . , and Area n; here, n=25). A plurality of semiconductor devices 500 is provided in each area. The above measurements were performed on eight semiconductor devices 500 in each of Areas 7, 12, and 14. FIG. 28A and FIG. 28B, where the results for Comparative Processing A2, Processing B2, Processing C2, and Processing D2 are plotted on the horizontal axis, show $V_{SL1}$ at $t_s$=0 [s] in Area 7 and that in Area 12, respectively. FIG. 31 shows data of Area 14. FIG. 29A, FIG. 29B, FIG. 30A, and FIG. 30B, where the horizontal axis represents $t_s$ and the vertical axis represents $V_{SL1}$, show $V_{SL1}$ changes in Area 12 in Comparative Processing A2, Processing B2, Processing C2, and Processing D2, respectively.

Next, the measurement data in FIGS. 29A and 29B and FIGS. 30A and 30B was subjected to fitting using the stretched exponential function in Formula 1. The results are shown in FIG. 32, FIG. 33, FIG. 34, and FIG. 35.

Figure 33:
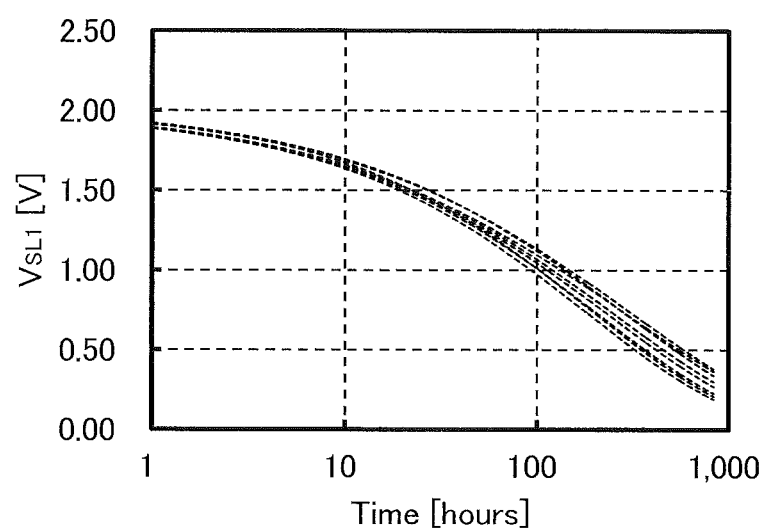
FIG. 33 shows curves extrapolated from data holding characteristics of memory elements.
Figure 34:
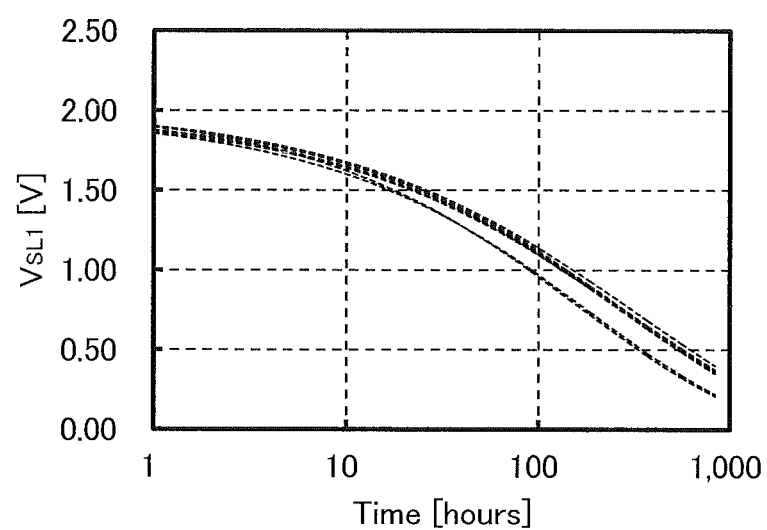
FIG. 34 shows curves extrapolated from data holding characteristics of memory elements.
Figure 35:
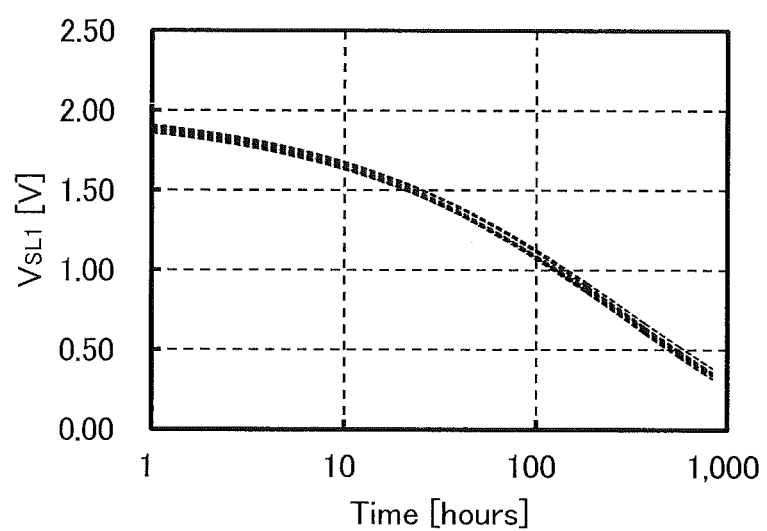
FIG. 35 shows curves extrapolated from data holding characteristics of memory elements.

From the fitting results, the time until the value of $V_{SL1}$ reached 1.0 V was calculated to determine which element of the measured eight elements took the shortest time (the worst case). According to FIG. 32 (Comparative Processing A2), the time until the value of $V_{SL1}$ of the worst case reached 1.0 V was 66 hours; FIG. 33 (Processing B2), 93 hours; FIG. 34 (Processing C2), 89 hours; and FIG. 35 (Processing D2), 122 hours. Characteristics of memory elements may be determined by such a worst case. Therefore, by reducing a variation in fluctuation of held data, the characteristics of the memory elements can be improved. The above results indicate that writing to the memory element 50 under the conditions of one embodiment of the present invention enables the written data to be held with less fluctuation.

This application is based on Japanese Patent Application serial no. 2015-011714 filed with Japan Patent Office on Jan. 23, 2015, the entire contents of which are hereby incorporated by reference.

What is claimed is:

1. A method for operating a semiconductor device comprising a capacitor and a switching element, wherein the capacitor comprises a first electrode, a second electrode, and a dielectric between the first electrode and the second electrode, and wherein the switching element comprises a first terminal and a second terminal, the first terminal being electrically connected to the first electrode, the method comprising steps of:

turning on the switching element in a first period;

turning off the switching element in a second period longer than or equal to 1 ns and shorter than or equal to 500 μs; and turning on the switching element in a third period, wherein the first period, the second period, and the third period are continuous in this order.

2. The method for operating the semiconductor device, according to claim 1, wherein the first period and the third period are each longer than or equal to 50 ps and shorter than or equal to 1 ms.

3. The method for operating the semiconductor device, according to claim 1, wherein the switching element is included in a memory element, and wherein no reading operation of the memory element is performed in the second period.

4. The method for operating the semiconductor device, according to claim 1, wherein the dielectric comprises oxygen and at least one element selected from silicon, aluminum, and hafnium.

5. The method for operating the semiconductor device, according to claim 1, wherein the switching element comprises an oxide semiconductor.

6. The method for operating the semiconductor device, according to claim 1, wherein the switching element is a transistor comprising an oxide semiconductor.

7. A method for operating a semiconductor device comprising a first memory element and a second memory element, wherein each of the first memory element and the second memory element comprises a capacitor and a switching element, wherein the capacitor comprises a first electrode, a second electrode, and a dielectric between the first electrode and the second electrode, and wherein the switching element comprises a first terminal and a second terminal, the first terminal being electrically connected to the first electrode, the method comprising steps of:

turning on the switching element of the first memory element in a first period;

turning off the switching element of the first memory element in a second period;

turning on the switching element of the first memory element in a third period;

turning on the switching element of the second memory element in a fourth period;

turning off the switching element of the second memory element in a fifth period; and turning on the switching element of the second memory element in a sixth period, wherein the first period, the second period, and the third period are continuous in this order, and wherein the fourth period, the fifth period, and the sixth period are continuous in this order.

8. The method for operating the semiconductor device, according to claim 7, wherein the first period, the third period, the fourth period, and the sixth period are each longer than or equal to 50 ps and shorter than or equal to 1 ms, and wherein the second period and the fifth period are each longer than or equal to 50 ps and shorter than or equal to 100 ms.

9. The method for operating the semiconductor device, according to claim 7, wherein the switching element is included in a memory element, and wherein no reading operation of the memory element is performed in the second period and the fifth period.

10. The method for operating the semiconductor device, according to claim 7, wherein the dielectric comprises oxygen and at least one element selected from silicon, aluminum, and hafnium.

11. The method for operating the semiconductor device, according to claim 7, wherein the switching element comprises an oxide semiconductor.

12. The method for operating the semiconductor device, according to claim 7, wherein the switching element is a transistor comprising an oxide semiconductor.

* * * * *